US007777596B2

(12) United States Patent
Lutz et al.

(10) Patent No.: US 7,777,596 B2
(45) Date of Patent: Aug. 17, 2010

(54) MEMS RESONATOR STRUCTURE AND METHOD

(75) Inventors: Markus Lutz, Mountain View, CA (US);
Zhiyu Pan, San Jose, CA (US); Aaron Partridge, Cupertino, CA (US)

(73) Assignee: Robert Bosch GmbH, Stuttgart (DE)

( * ) Notice: Subject to any disclaimer, the term of this patent is extended or adjusted under 35 U.S.C. 154(b) by 156 days.

(21) Appl. No.: 12/002,936

(22) Filed: Dec. 18, 2007

(65) Prior Publication Data

US 2009/0153267 A1 Jun. 18, 2009

(51) Int. Cl.
*H03H 9/02* (2006.01)
*H03H 9/24* (2006.01)

(52) U.S. Cl. .................. 333/186; 333/200; 310/309

(58) Field of Classification Search .......... 333/186, 333/187, 197, 199, 200; 310/309
See application file for complete search history.

(56) References Cited

U.S. PATENT DOCUMENTS

| | | | |
|---|---|---|---|
| 6,445,106 B1 * | 9/2002 | Ma et al. | 310/309 |
| 6,630,871 B2 * | 10/2003 | Ma et al. | 331/116 M |
| 6,657,363 B1 * | 12/2003 | Aigner | 310/324 |
| 6,744,174 B2 * | 6/2004 | Paden et al. | 310/309 |
| 6,940,370 B2 * | 9/2005 | Bircumshaw et al. | 333/197 |
| 6,978,673 B2 * | 12/2005 | Johnson et al. | 73/504.12 |
| 7,307,496 B2 * | 12/2007 | Huang et al. | 333/186 |
| 7,616,077 B1 * | 11/2009 | Wittwer et al. | 333/186 |
| 2005/0073078 A1 | 4/2005 | Lutz et al. | |
| 2005/0195049 A1 | 9/2005 | Huang et al. | |
| 2007/0001783 A1 | 1/2007 | Lutz et al. | |
| 2007/0220971 A1 | 9/2007 | Ayazi et al. | |

FOREIGN PATENT DOCUMENTS

| | | |
|---|---|---|
| FR | 2 876 180 | 4/2006 |
| JP | 2004 279384 | 10/2004 |
| WO | WO 03/021634 | 3/2003 |

OTHER PUBLICATIONS

International Search Report for PCT/US08/84946, date Apr. 6, 2009.
Badila-Ciressan, N.D., et al., "Fragmented Membrane MEM Bulk Lateral Resonators with Nano-Gaps On 1.5 μm SOI" 37th European Solid State Device Research Conference 2007. ESSDERC, IEEE, PI Sep. 1, 2007, pp. 430-433.

* cited by examiner

*Primary Examiner*—Barbara Summons
(74) *Attorney, Agent, or Firm*—Kenyon & Kenyon LLP

(57) ABSTRACT

A microelectromechanical resonator may include one or more resonator masses that oscillates in a bulk mode and that includes a first plurality of regions each having a density, and a second plurality of regions each having a density, the density of each of the second plurality of regions differing from the density of each of the first plurality of regions. The second plurality of regions may be disposed in a non-uniform arrangement. The oscillation may include a first state in which the resonator mass is contracted, at least in part, in a first and/or a second direction, and expanded, at least in part, in a third and/or a fourth direction, the second direction being opposite the first direction, the fourth direction being opposite the third direction.

41 Claims, 29 Drawing Sheets

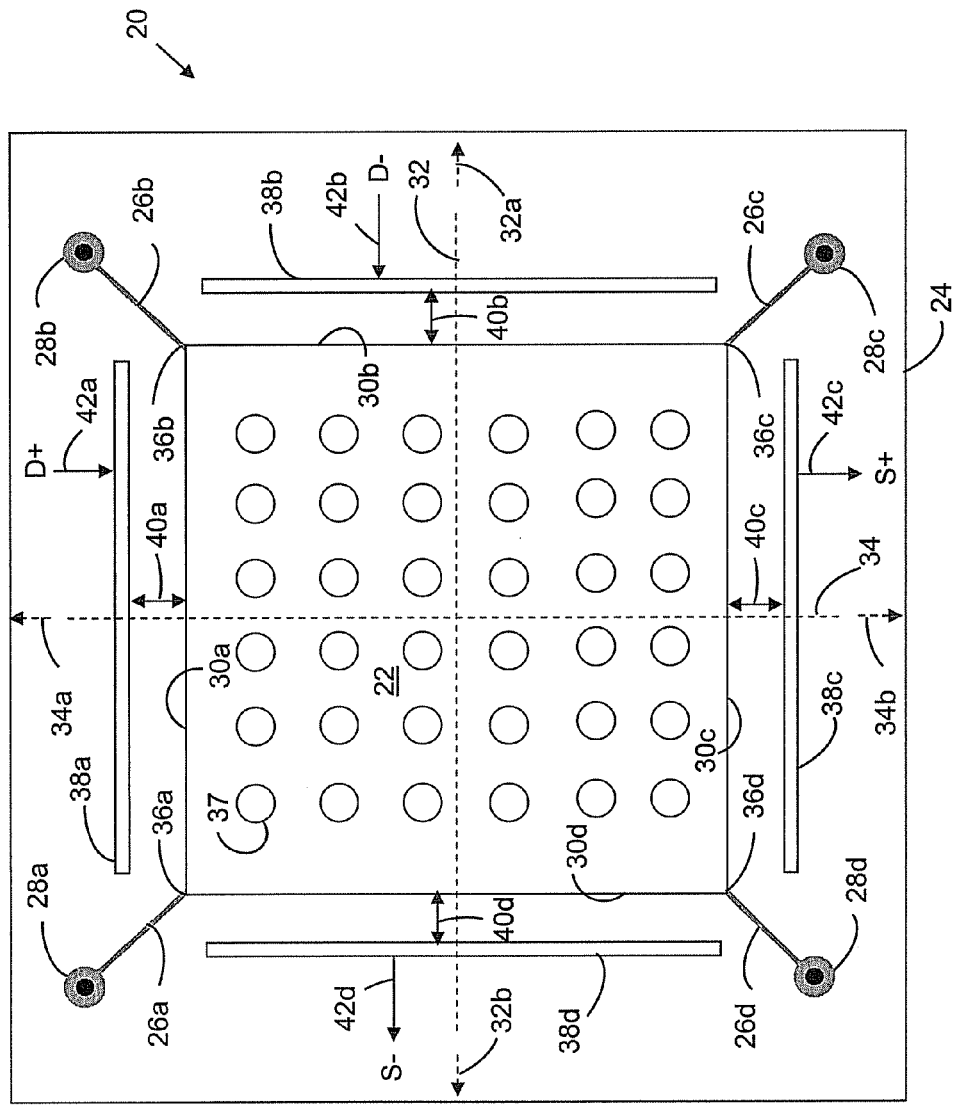

MEMS RESONATOR STRUCTURE AND METHOD

BACKGROUND

This invention relates to microelectromechanical or nanoelectromechanical resonator structures and methods for use in association with resonator structures.

Generally, high quality ("Q") factor microelectromechanical resonators are regarded as a promising choice for frequency references and filters. However, to achieve higher frequencies, the dimensions of such resonators are being scaled smaller. The smaller dimensions have led to reduced driving and/or sensing capacitances, which can in turn adversely impact signal strength, stability and/or the "Q" factor of the resonator.

There is a need for a resonator structure that helps overcome one, some or all of the shortcomings described above. There is a need for, among other things, a microelectromechanical and/or nanoelectromechanical resonator having increased driving and/or signal capacitances, so as to increase the signal strength, the stability and/or the "Q" factor of the resonator.

SUMMARY OF THE INVENTION

There are many inventions described and illustrated herein. The present invention is neither limited to any single aspect nor embodiment, nor to any combinations and/or permutations of such aspects and/or embodiments. Moreover, each of the aspects and/or embodiments of the present invention may be employed alone or in combination with one or more of the other aspects of the present invention and/or embodiments. For the sake of brevity, many of those permutations and combinations will not be discussed separately herein.

There are many inventions described and illustrated herein. The present invention is neither limited to any single aspect nor embodiment, nor to any combinations and/or permutations of such aspects and/or embodiments. Moreover, each of the aspects and/or embodiments of the present invention may be employed alone or in combination with one or more of the other aspects of the present invention and/or embodiments. For the sake of brevity, many of those permutations and combinations will not be discussed separately herein.

In one aspect of the present invention, a microelectromechanical resonator includes a resonator mass that oscillates in a bulk mode, the oscillation including a first state in which the resonator mass is contracted, at least in part, in at least one of a first direction and a second direction, and wherein in the first state, the resonator mass is expanded, at least in part, in at least one of a third direction and a fourth direction, the second direction being opposite the first direction, the fourth direction being opposite the third direction, wherein the resonator mass includes: a first plurality of regions each having a density; and a second plurality of regions each having a density, wherein the density of each of the second plurality of regions is different than the density of each of the first plurality of regions; and wherein the second plurality of regions are disposed in a non uniform arrangement.

Again, there are many inventions described and illustrated herein. This Summary of the Invention is not exhaustive of the scope of the present inventions. Moreover, this Summary of the Invention is not intended to be limiting of the invention and should not be interpreted in that manner. Thus, while certain aspects and embodiments have been described and/or outlined in this Summary of the Invention, it should be understood that the present invention is not limited to such aspects, embodiments, description and/or outline. Indeed, many others aspects and embodiments, which may be different from and/or similar to, the aspects and embodiments presented in this Summary, will be apparent from the description, illustrations and/or claims, which follow.

In addition, although various features, attributes and advantages have been described in this Summary of the Invention and/or are apparent in light thereof, it should be understood that such features, attributes and advantages are not required, and except where stated otherwise, need not be present in the aspects and/or the embodiments of the present invention.

Moreover, various objects, features and/or advantages of one or more aspects and/or embodiments of the present invention will become more apparent from the following detailed description and the accompanying drawings. It should be understood however, that any such objects, features, and/or advantages are not required, and except where stated otherwise, need not be present in the aspects and/or embodiments of the present invention.

It should be understood that the various aspects and embodiments of the present invention that are described in this Summary of the Invention and do not appear in the claims that follow are preserved for presentation in one or more divisional/continuation patent applications. It should also be understood that all aspects and/or embodiments of the present invention that are not described in this Summary of the Invention and do not appear in the claims that follow are also preserved for presentation in one or more divisional/continuation patent applications.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIG. 1A is a schematic top view representation of one type of microelectromechanical resonator device in a stationary state;

DETAILED DESCRIPTION

Figure 1B:
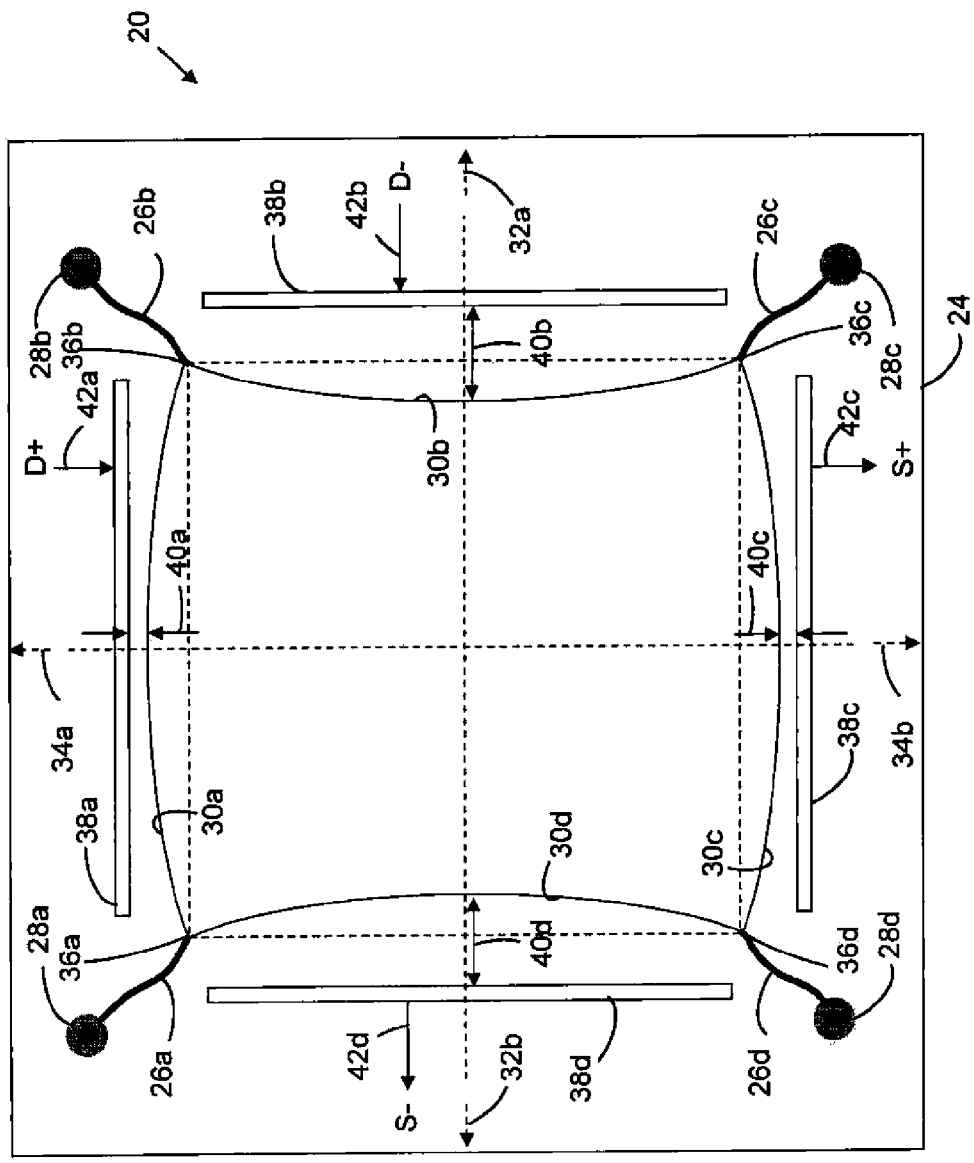
FIG. 1B is a schematic top view representation of the resonator of FIG. 1A in a first state of oscillation, wherein in relation to the stationary state, the resonator is contracted along a first axis and expanded along a second axis.

There are many inventions described and illustrated herein. In one aspect of the present invention, a resonator includes a resonator mass having a non-homogeneous structure that provides the resonator mass with a stiffness that varies from position to position and direction to direction, such that, during oscillation, the resonator mass exhibits a shape that helps increase the sense capacitance, the signal strength, the stability and/or the "Q" factor of the resonator.

Notably, the present inventions are described in the context of microelectromechanical systems. The present inventions, however, are not limited in this regard. Rather, the inventions described herein are applicable to other electromechanical systems including, for example, nanoelectromechanical systems. Thus, the present inventions are pertinent to microelectromechanical and nanoelectromechanical systems (hereinafter collectively "MEMS" unless specifically noted to the contrary), for example, gyroscopes, resonators, and/or accelerometers, implementing one or more of the resonator architectures of the present inventions.

There are several types of well-known microelectromechanical resonator devices. FIG. 1A illustrates a top view of one such type of resonator device 20. This resonator device 20 includes a resonator mass 22 anchored to a substrate 24 via couplings 26a-26d and anchors 28a-28d. The resonator mass 22 includes four outer surfaces 30a-30d.

In the non-operating (at rest) state, resonator mass 22 has a generally square shape, as shown. In such state, surfaces 30a, 30c are parallel to a first reference axis 32 that extends in first and second directions 32a, 32b. Surfaces 30b, 30d are parallel to a second reference axis 34 that extends in third and fourth directions 34a, 34b.

The four outer surfaces 30a-30d define four corners 36a-36d. For example, a first end of fourth outer surface 30d and a first end of first outer surface 30a define a first corner 36a. A second end of first outer surface 30a and a first end of second outer surface 30b define a second corner 36b. A second end of second outer surface 30b and a first end of third outer surface 30c define a third corner 36c. A second end of third outer surface 30c and a second end of fourth outer surface 30d define a fourth corner 36d.

Resonator mass 22 further includes a plurality of openings 37. During fabrication of resonator 20, openings 37 facilitate etching and/or removal of sacrificial material from beneath the resonator mass 22 so that the resonator mass 22 is free to oscillator as set forth below.

The resonator further includes four electrodes 38a-38d disposed juxtaposed and parallel to outer surfaces 30a-30d, respectively. Each of the electrodes 38a-38d is spaced from the respective outer surface 30a-30d by a gap. For example, first electrode 38a is spaced from outer surface 30a by a gap 30a. Second electrode 38b is spaced from outer surface 30b by a gap 40b. Third electrode 38c is spaced from outer surface 30c by a gap 40c. Fourth electrode 38d is spaced from outer surface 30d by a gap 40d. In the non-operating, at rest state, resonator mass 22 is approximately centered between the four electrodes 38a-38d and the gaps 40a-40d are approximately equal in size.

The electrodes 38a-38d and the resonator mass 22 collectively define four capacitances. For example, the first electrode 38a and resonator mass 22 define a first capacitance. The second electrode 38b and resonator mass 22 define a second capacitance. The third electrode 38c and resonator mass 22 define a third capacitance. The fourth electrode 38d and resonator mass 22 define a fourth capacitance.

In the illustrated embodiment, two of the electrodes, e.g., first and second electrodes 38a, 38b, are employed as drive electrodes. The other two electrodes, e.g., third and fourth electrodes 38c, 38d, are employed as sense electrodes. In operation, the two drive electrodes, e.g., first and second electrodes 38a, 38b, receive a differential excitation signal D+, D− via signal lines 42a, 42b, respectively. The excitation signal induces a time varying electrostatic force that causes the resonator mass 22 to oscillate.

As further described below, the resonator 22 oscillates in plane, in a bulk acoustic mode (often referred to as "bulk mode"). The oscillation may be linear or substantially linear, e.g., described by linear, stationary differential equations of motion. If resonator 22 has a high "Q" (quality factor) factor, the shape of resonator 22 during oscillation depends primarily on the characteristics of the resonator 22.

Unless stated otherwise, the phrase "oscillate in a bulk mode" may mean to oscillate, at least primarily, by expansion and/or contraction rather than by bending. For example, the solid may contract in at least one direction/dimension (for example, the "x"direction) and expand in at least one direction/dimension (for example, the "y" and/or "z" directions). The solid may expand in at least one direction/dimension (for example, the "x" direction) and contract in at least one direction/dimension (for example, the "y" and/or "z" directions). Indeed, the sold may contraction in all directions/dimensions (providing very high frequency).

Notably, although the discussion below describes contraction/expansion in one direction, the resonator may expand and/or contract in more than one direction/dimension (for example, simultaneously in the "x" and "y" directions). In this embodiment, the resonator is driven in a frequency mode which might be advantageous for lower noise at high frequencies. This mode may be "selected" by driving the appropriate electrodes.

In some embodiments, at least ninety percent of the oscillation is a result of expansion and/or contraction rather than bending, and more preferably all or substantially all of the oscillation is a result of expansion and/or contraction rather than bending. Similarly, unless stated otherwise, the phrase "bulk mode resonator" means a resonator that oscillates in a bulk mode.

Referring to FIG. 1B, in a first phase of oscillation, resonator mass 22 (i) contracts in first and second directions 32a, 32b and (ii) expands in third and fourth directions 34a, 34b, resulting in a first state for resonator mass 22. The contraction in first and second directions 32a, 32b causes an increase in the size of the second and fourth gaps 40b, 40d. The expansion in the third and fourth directions 34a, 34b causes a decrease in the size of the first and third gaps 40a, 40c. For comparison, dotted lines 30a'-30d' show the shape and position, of surfaces 30a-30d, respectively, in the at rest state.

Figure 1C:
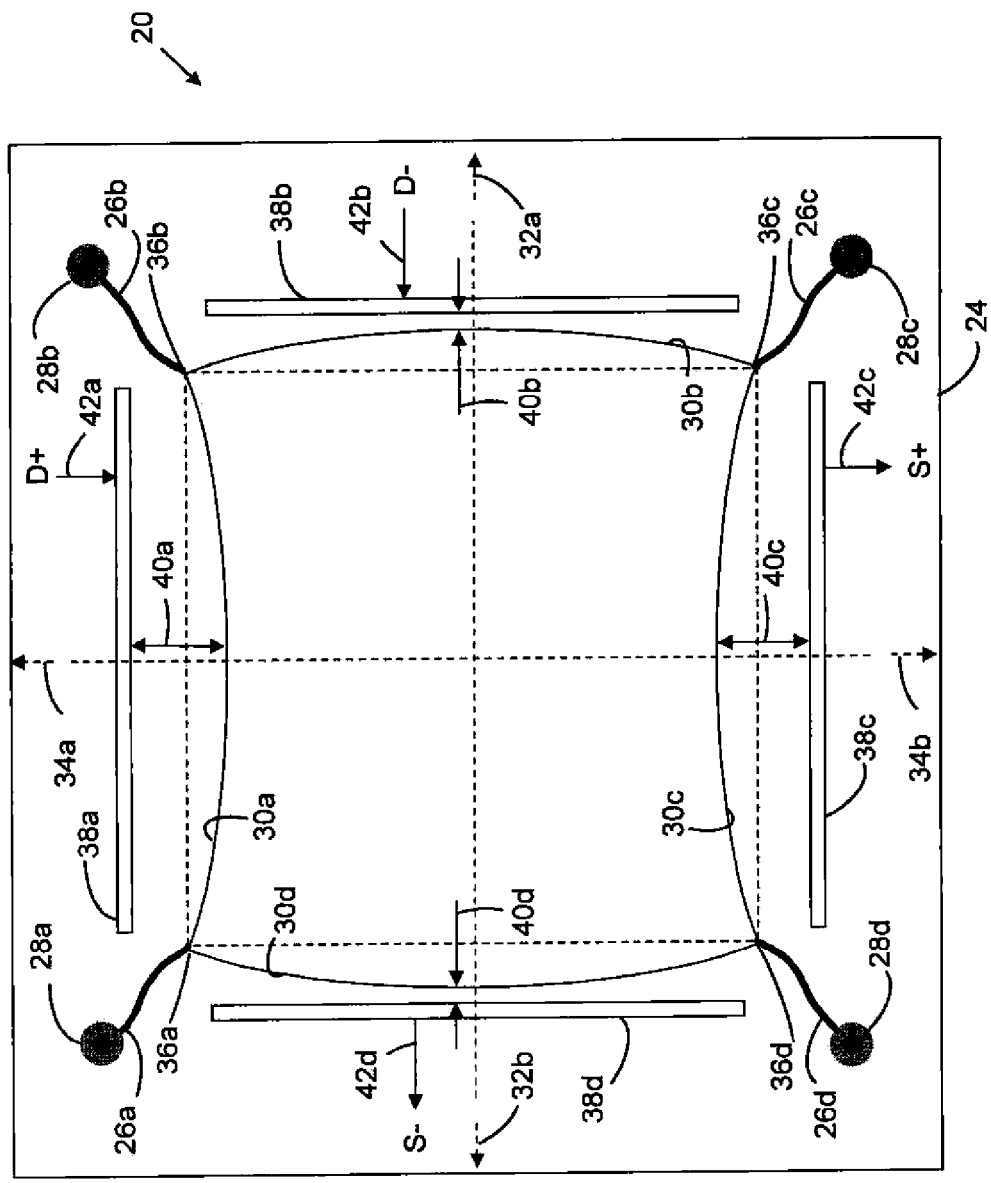
FIG. 1C is a schematic top view representation of the resonator of FIG. 1A in a second state of oscillation, wherein in relation to the stationary state, the resonator is expanded along the first axis and contracted along the second axis.

With reference to FIG. 1C, in a second phase of oscillation, the resonator mass 22 (i) expands in the first and second directions 32a, 32b and (ii) contracts in third and fourth directions 34a, 34b, resulting in a second state for resonator mass 22. The expansion in first and second directions 32a, 32b causes a decrease in the size of second and fourth gaps 40b, 40d. The contraction in third and fourth directions 34a, 34b causes an increase in the size of the first and third gaps 40a, 40c.

The oscillation results in a differential signal S+, S− indicative thereof, at sense electrodes, e.g., third and fourth electrodes 38c, 38d, and at signal lines 42c, 42d coupled thereto. The differential signal S+, S− may be, for example, in the form of a differential voltage and/or a differential current. For example, in the first phase of oscillation, the increase in the size of the fourth gap 40d causes a decrease in the magnitude of the fourth capacitance (i.e., defined by the fourth electrode 38d and resonator 22), which in turn causes an electrical current into or out of the fourth electrode 38d and a change in the voltage of the fourth electrode 38d in accordance therewith. The decrease in the size of the third gap 40c causes an increase in the magnitude of the third capacitance (i.e., defined by the third electrode 38c and resonator 22), which in turn causes an electrical current into or out of the third electrode 38c and a change in the voltage of the third electrode 38c in accordance therewith.

Similarly, in the second phase of oscillation, the decrease in the size of the fourth gap 40d causes an increase in the magnitude of the fourth capacitance (i.e., defined by the fourth electrode 38d and resonator 22), which in turn causes an electrical current into or out of the fourth electrode 38d and a change in the voltage of the fourth electrode in accordance therewith. The increase in the size of the third gap 40c causes a decrease in the magnitude of the third capacitance (i.e., defined by the third electrode 38c and resonator 22), which in turn causes an electrical current into or out of the third electrode 38c and a change in the voltage of the third electrode in accordance therewith.

The magnitude of the differential signal S+, S− depends at least in part, on the magnitude of the change in the third capacitance and the magnitude of the change in the fourth capacitance, i.e., the magnitude of capacitive transduction between the resonator 22 and the sense electrodes, e.g., third and fourth electrodes 38c, 38d, in each phase of oscillation. Notably, the ends of outer surfaces 30a-30d and/or corners 36a-36d of resonator mass 52 exhibit little or no movement toward or away from electrodes 38a-38d, respectively. Consequently, the magnitude of the change in the third capacitance and the magnitude of the change in the fourth capacitance are significantly less than the magnitude of the change in the third capacitance and the magnitude of the change in the fourth capacitance that would be exhibited if ends of outer surfaces 30a-30d exhibited the same amount of movement toward or away from electrodes 38a-38d, respectively, as that exhibited by midpoints of outer surfaces 30a-30d, respectively. As a result, the magnitude of differential sense signal S+, S− is significantly less than the magnitude of the differential sense signal S+, S− that would be exhibited if ends of outer surfaces 30a-30d exhibited the same amount of movement toward and away from electrodes 38a-38d, respectively, as that exhibited by midpoints of outer surfaces 30a-30d, respectively.

As mentioned above, in one aspect of the present invention, a resonator includes a resonator mass with a non-homogeneous structure that provides the resonator mass with a stiffness that varies from position to position, such that, during oscillation, the resonator mass exhibits a shape that helps increase the sense capacitance, the signal strength, the stability and/or the "Q" factor of the resonator.

Figure 2A:
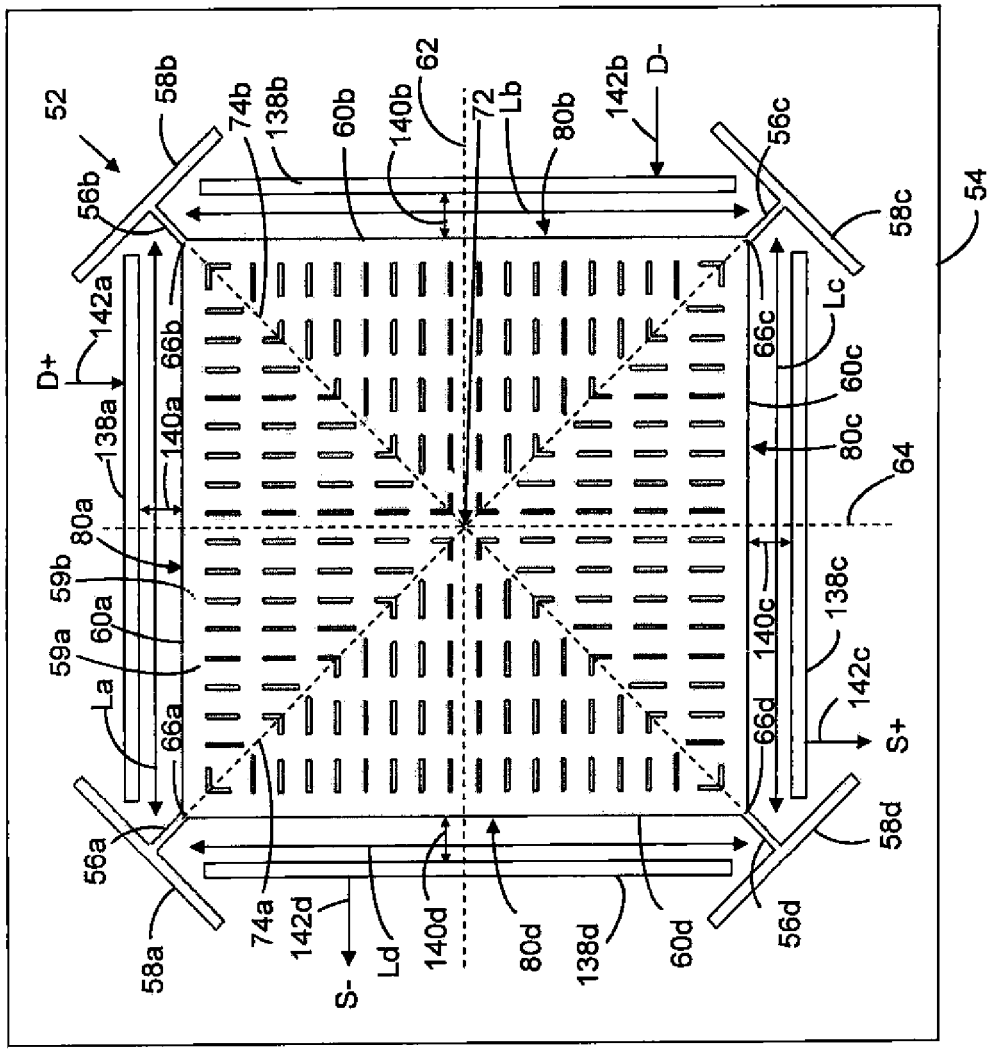
FIG. 2A is a schematic top view representation of a resonator in a stationary state, in accordance with certain aspects of the present invention.
Figure 2B:
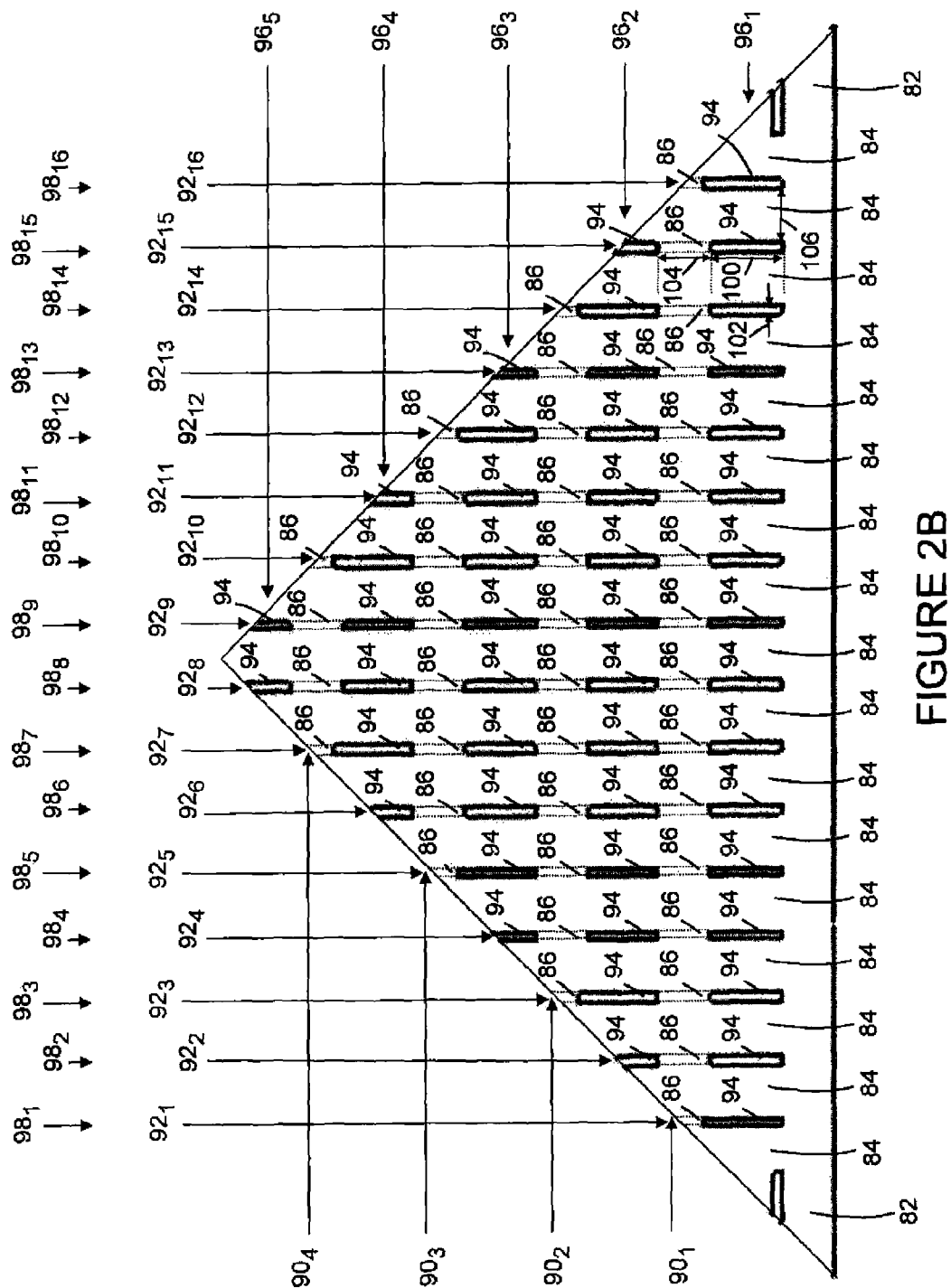
FIG. 2B is an enlarged schematic top view representation of a section of a resonator mass of the resonator of FIG. 2A, in a stationary state.
Figure 2C:
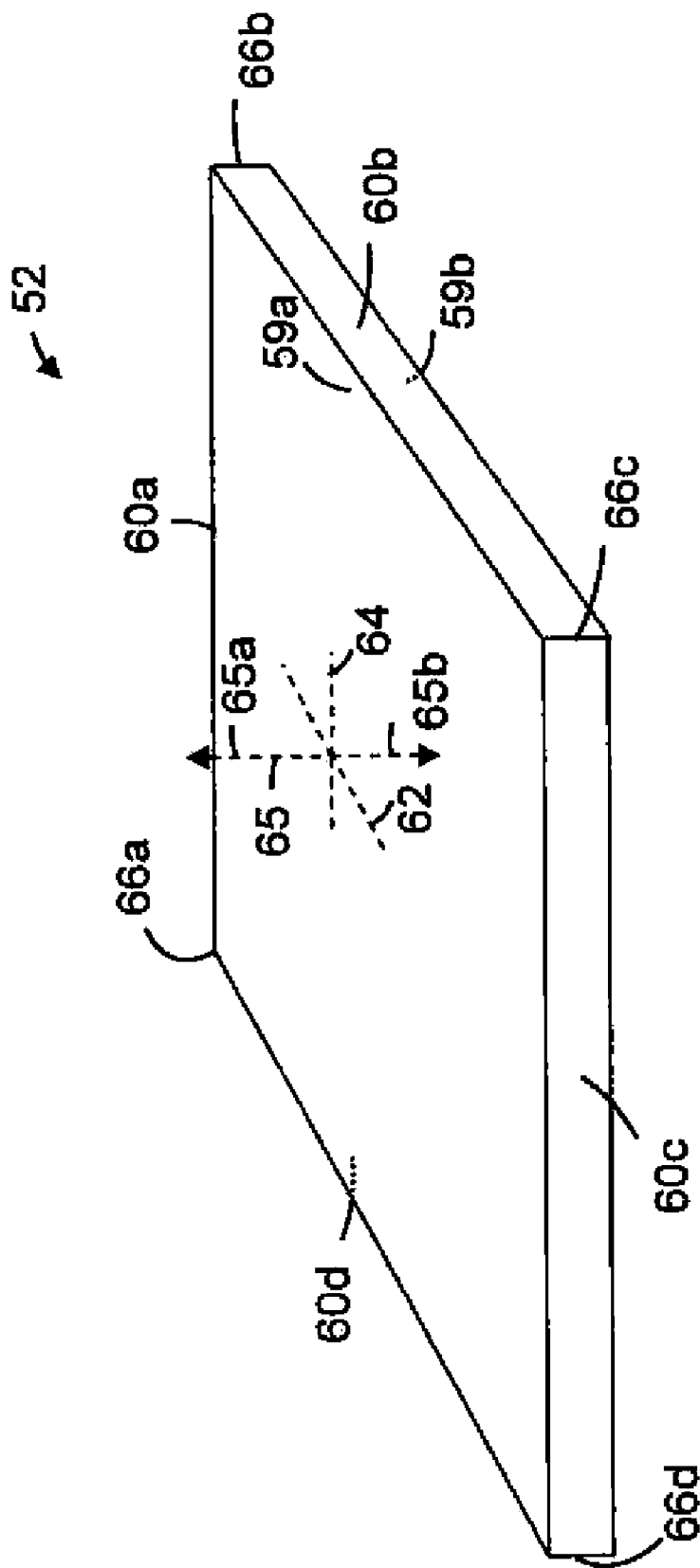
FIG. 2C is a schematic perspective view representation of a portion of a resonator of FIG. 2A, in a stationary state.
Figure 2D:
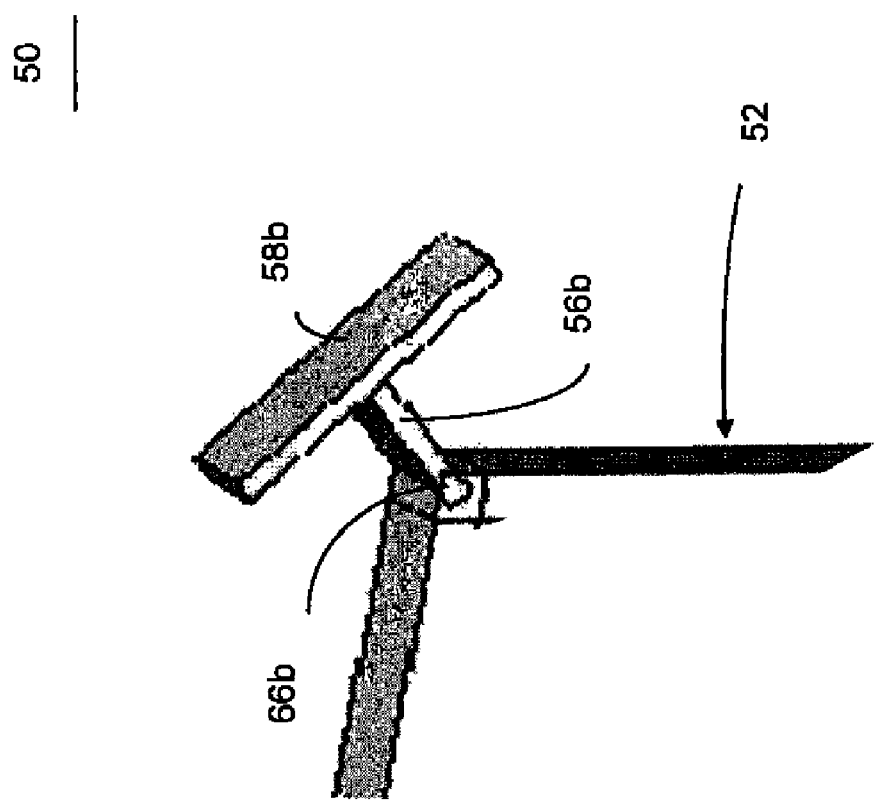
FIG. 2D is an enlarged schematic perspective view representation of a portion of the resonator of FIG. 2A, in a stationary state.

FIG. 2A is a schematic top view representation of a MEMS resonator 50 in accordance with certain aspects of the present invention. MEMS resonator 50 includes a resonator mass 52 anchored to a substrate 54 via couplings 56a-56d and anchors 58a-58d. The resonator mass 52 has first and second major outer surfaces 59a, 59b (e.g., disposed on a top and a bottom, respectively, of the resonator mass 52) and four outer surfaces 60a-60d (disposed on sides of the resonator 52). The four outer surfaces 60a-60d have lengths La-Ld, respectively. In the non-operating (at rest) state, resonator mass has a generally square shape and lengths La-Ld are equal or at least substantially equal to one another. In such state, surfaces 60a, 60c are parallel to a first reference axis 62, which extends in first and second directions 62a, 62b. Surfaces 60b, 60d are parallel to a second reference axis 64, which extends in third and fourth directions 64a, 64b. A midpoint of the first outer surface 60a and a midpoint of the third outer surface 60c are disposed on the second reference axis 64. A midpoint of the second outer surface 60b and a midpoint of the fourth outer surface 60d are disposed on the first reference axis 62. Each of the surfaces 60a-60d is also parallel to a third reference axis 65 (FIG. 2C), which extends in fifth and sixth directions 65a, 65b (FIG. 2C), perpendicular to the first and second directions 62a, 62b and the third and fourth directions 64a, 64b.

Notably, although first second and third reference axes are described and illustrated, resonator 50 and/or resonator mass 52 may or may not have any axes. Thus, in some embodiments, a resonator 50 and/or resonator mass 52 may have one axis, two axes, three may and/or no axes at all.

In some embodiments, the four outer surfaces 60a-60d define four corners 66a-66d. For example, a first end of fourth outer surface 60d and a first end of first outer surface 60a define a first corner 66a. A second end of first outer surface 60a and a first end of second outer surface 60b may define a second corner 66b. A second end of second outer surface 60b and a first end of third outer surface 60c may define a third corner 66c. A second end of third outer surface 60c and a second end of fourth outer surface 60d may define a fourth corner 66d.

The resonator mass 52 further includes a center 72 and diagonals 74a, 74b. Diagonals 74a, 74b intersect one another at the center 72. One of the diagonals, i.e., diagonal 74a, extends from corner 66a to corner 66c. The other diagonal, i.e., diagonal 74b, extends from corner 66b to corner 66d.

First and second diagonals 74a, 74b divide the resonator mass 52 into four triangular shaped sections 80a-80d. The first and third sections 80a, 80c are centered about the second axis 64. The second and fourth sections 80b, 80d are centered about the first axis 62.

In the illustrated embodiment, the four sections 80a-80d have similar configurations. Each section 80a-80d includes a first plurality of regions including an elongated outer region 82, elongated inner regions 84 and connector regions 86. The elongated outer region 82 of the first section 80a defines the first outer surface 60a. The elongated outer region 82 of the second section 80b defines the second outer surface 60b. The elongated outer region 82 of the third section 80c defines the third outer surface 60c. The elongated outer region 82 of the fourth section 80d defines the fourth outer surface 60d.

The elongated inner regions 84 are arranged in a linear array and connected to the elongated outer region 82. The illustrated embodiment includes seventeen elongated inner regions 84 that extend perpendicularly from the elongated outer region 82, however, other embodiments may employ other quantities, configurations and/or arrangements of elongated inner regions 84.

The connector regions 86 are arranged in an array having a plurality of rows and columns. In the illustrated embodiment, for example, the array includes four rows, i.e., rows $90_1$-$90_4$, and sixteen columns, i.e., columns $92_1$-$92_{16}$. The rows $90_1$-$90_4$ are disposed parallel to the elongated outer region 82. The columns $92_1$-$92_{16}$ are perpendicular to the elongated outer region and interspersed with the elongated inner regions 84. More particularly, each of the columns $92_1$-$92_{16}$ of connector regions 86 is disposed, and connected, between a respective pair of elongated inner regions 84 to connect the such pair of elongated inner regions 84 to one another. For example, a first column $92_1$ of connector regions 86 is disposed between first and second elongated inner regions 84 and connects the first and second elongated inner regions 84 to one another.

Each section 80a-80d further defines a second plurality of regions, each of which has a density less than the density of each of the first plurality of regions. The second plurality of regions may be configured and/or arranged so as to result in a desired mode of oscillation for resonator mass 52 and/or a desired shape(s) during oscillation.

In the illustrated embodiment, the second plurality of regions are in the form of openings 94 that extend through the resonator mass 52 (e.g., from the first major outer surface 59a to the second major outer surface 59b). During fabrication of resonator 50, openings 94 may also facilitate etching and/or removal of sacrificial material from beneath the resonator mass 52 so that the resonator mass 52 is free to oscillate as set forth below.

The second plurality of regions, e.g., openings 94, are disposed in a non-uniform arrangement such that the stiffness of resonator mass varies from position to position so as to help provide resonator mass with a desired mode of oscillation and/or desired shape(s) during oscillation. The non uniform arrangement is non-uniform to a degree that is greater than would result due to normal manufacturing tolerances associated with fabrication of resonator mass 52.

In the illustrated embodiment, some of the openings are elongated in a direction perpendicular to the elongated outer region 82 and disposed in a plurality of rows and columns, for example, five rows $96_1$-$96_5$ and sixteen columns $98_1$-$98_{16}$. The rows $96_1$-$96_5$ are disposed parallel to the elongated outer region 82. The columns $98_1$-$98_{16}$ are aligned with the columns $92_1$-$92_{16}$, respectively, of connector regions 86. More particularly, the openings 94 in a column $98_1$-$98_{16}$ of openings 94 are interspersed with the connector regions 86 in the associated column $92_1$-$92_{16}$ of connector regions 86. For example, the openings 94 in the first column $98_1$ of openings 94 are interspersed with the connector regions 86 in the first column $92_1$ of connector regions 86. One opening 94 in each column $98_1$-$98_{16}$ of openings 94 is disposed between the elongated outer region 82 and a connector region 86 in the associated column $92_1$-$92_{16}$ of connector regions 86. For example, a first opening 94 in the first column $98_1$ of openings 94 is disposed between the elongated outer region 82 and the first connector region 86 in the first column $92_1$ of connector regions 86. Other openings 94 in each column $98_1$-$98_{16}$ of openings 94 are disposed between adjacent connector regions 86 in the associated column $92_1$-$92_{16}$ of connector regions 86 and spaces apart such connector regions 86. For example, the second opening 94 in the third column $98_3$ of openings 94 is disposed between first and second connector regions 86 in the third column $92_3$ of connector regions 86 and spaces apart such connector regions 82.

Openings 94 at ends of one or more rows $96_1$-$96_5$ of openings 94 may communicate with corresponding openings 94 in adjacent sections of the resonator mass 52 to define "L" shaped openings (i.e., openings having "L" shaped cross sections). The "L" shaped openings may each have a corner disposed on one of the diagonals 74a, 74b and directed toward the center 72 of the resonator mass 52. In the illustrated embodiment, for example, the openings 94 at one end of the second, third, fourth and fifth rows $96_2$-$96_5$ of openings 94 in section 80a communicate with corresponding openings 94 in section 80b to define "L" shaped openings each having a corner disposed on diagonal 74b and directed toward the center 72. The openings 94 at another end of the second, third, fourth and fifth rows $96_2$-$96_5$ of openings 94 in section 80a communicate with corresponding openings 94 in section 80d to define "L" shaped openings each having a corner disposed on diagonal 74a and directed toward the center 72. The openings 94 at one end of the second, third, fourth and fifth rows $96_2$-$96_5$ of openings 94 in section 80c communicate with corresponding openings 94 in section 80b to define "L" shaped openings each having a corner disposed on diagonal 74a and directed toward the center 72. The openings 94 at another end of the second, third, fourth and fifth rows $96_2$-$96_5$ of openings 94 in section 80c communicate with corresponding openings 94 in section 80d to define "L" shaped openings each having a corner disposed on diagonal 74b and directed toward the center 72.

Other openings 94 are elongated in a direction parallel to the elongated outer region 82. Such openings 94 may communicate with corresponding openings in adjacent sections of the resonator mass 52 to define "L" shaped openings (i.e., openings having "L" shaped cross sections). The "L" shaped openings may each have a corner disposed on one of the diagonals 74a, 74b and directed away from the center 72 of the resonator mass 52. In the illustrated embodiment, for example, an opening in section 80a communicates with a corresponding opening in section 80b to define an "L" shaped opening having a corner disposed on diagonal 74b and directed away from the center 72. Another opening in section 80a communicates with a corresponding opening in section 80d to define an "L" shaped opening having a corner disposed on diagonal 74a and directed away from the center 72. An opening in section 80c communicates with a corresponding opening in section 80b to define an "L" shaped opening having a corner disposed on diagonal 74a and directed away from the center 72. Another opening in section 80c communicates with a corresponding opening in section 80d to define an "L" shaped opening having a corner disposed on diagonal 74b and directed away from the center 72.

In some embodiments, the openings in the first section 80a have a first dimension in the first and second directions 62a, 62b and a second dimension in the third and fourth directions 64a, 64b. The openings in the second section 80b may have a first dimension in the first and second directions 62a, 62b and a second dimension in the third and fourth directions 64a, 64b. The first dimension of the openings in the first section 80a may be different than the first dimension of the openings in the second section 80b. The second dimension of the openings in the first section 80a may be different than the second dimension of the openings in the second section 80b.

In the illustrated embodiment, each of the openings 94 has a first dimension e.g., a length 100, and a second dimension, e.g., a width 102. Adjacent rows of openings 94 are spaced apart by a distance 104. Adjacent columns of openings 94 are spaced apart by a distance 106. In some embodiments, the distance 104 between adjacent columns of openings 94 is equal to or about equal to the distance 106 between adjacent columns of openings.

In some embodiments, the length 100 of one, some or all of the openings 94 is at least ½ the distance 104 between adjacent rows of openings 94 and/or at least ½ the distance 106 between adjacent columns of openings 94, more preferably greater than or equal to the distance 104 between adjacent rows of openings 94 and/or greater than or equal to the distance 106 between adjacent columns of openings 94. In some embodiments, the length 100 of one or more openings 94 is 1.25 times, and/or about 1.25 times, the distance 104 between adjacent rows of openings 94 and/or 1.25 times, and/or about 1.25 times, the distance 106 between adjacent columns of openings 94.

In some embodiments, the width 102 of each opening 94 is less than the distance 106 between adjacent columns of openings 94 and/or less than the distance 104 between adjacent rows of openings 94, more preferably less than ½ the distance 106 between adjacent columns of openings 94 and/or less than ½ the distance 104 between adjacent rows of openings 94. In some embodiments, the width 102 of one or more openings 94 may be one sixth (⅙), and/or about one sixth (⅙), the distance 106 between adjacent columns of openings 94 and/or one sixth (⅙), and/or about one sixth (⅙), the distance 104 between adjacent columns of openings 94.

The first plurality of regions may or may not have the same density as one another. In some embodiments, for example, each of the first plurality of regions has the same density as one another. In some other embodiments, one or more of the first plurality of regions has a density different than the density of one or more other regions of the first plurality of regions. Likewise, the second plurality of regions may or may not have the same density as one another. In some embodiments, for example, each of the second plurality of regions has the same density as one another. In some other embodiments, one or more of the second plurality of regions has a density different that the density of one or more other regions of the second plurality of regions.

The stiffness of the resonator mass 52 varies from direction to direction and position to position. For example, each portion of the resonator mass 52 has a stiffness in the first and second directions 62a, 62b (i.e., a stiffness with respect to forces in the first and second directions 62a, 62b) a stiffness in the third and fourth directions 64a, 64b (i.e., a stiffness with respect to forces in the third and fourth directions 64a, 64b) and a stiffness in the fifth and sixth directions 65a, 65b (FIG. 2C) (i.e., a stiffness with respect to forces in the fifth and sixth directions 65a, 65b (FIG. 2C)). The stiffness in the first and second directions 62a, 62b, the stiffness in the third and fourth directions 64a, 64b and the stiffness in the fifth and sixth directions 65a, 65b (FIG. 2C) may or may not be equal to one another.

The stiffness in the first and second directions 62a, 62b and the stiffness in the third and fourth directions 64a, 64b may each be a function of position. For example, one region of the resonator mass 52 may have a stiffness in the first and second directions 62a, 62b that is different than the stiffness of another region in the first and second directions 62a, 62b. Likewise, one region may have a stiffness in third and fourth directions 64a, 64b that is different than the stiffness of another region in third and fourth directions 64a, 64b.

The presence of the second plurality of regions, e.g., openings 94, decreases the stiffness, in one or more directions, at one or more positions of resonator mass 52. In the illustrated embodiment, for example, the openings 94 in the first and third sections 80a, 80c of resonator mass 52 decrease the stiffness of such sections in the first and second directions 62a, 62b. The openings 94 in the second and fourth regions 80b, 80d decrease the stiffness of such sections 80b, 80d in the third and fourth directions 84a, 84b.

The magnitude of the decrease in stiffness is a function of position. In the illustrated embodiment, the greatest decrease is along a line extending through the first row $96_1$ (i.e., the row of openings 94 closest to the elongated outer region 82 and furthest from the center 72), which is the row having the greatest number and/or volume of regions from the second plurality of regions 94. The second greatest decrease is along a line extending through the second row $96_2$ of openings 94 (i.e., the row of openings 94 second closest to the elongated outer region 82 and fourth closest to the center 72), which is the row having the second greatest number and/or the volume of regions from the second plurality of regions 94. The third greatest decrease is along a line extending through the third row $96_3$ of openings 94 (i.e., the row of openings 94 third closest to the elongated outer region 82 and third closest to the center 72), which is the row having the third greatest number and/or the volume of regions from the second plurality of regions 94. The fourth greatest decrease is along a line extending through the fourth row $96_3$ of openings 94 (i.e., the row of openings 94 fourth closest to the elongated outer region 82 and second closest to the center 72), which is the row having the fourth greatest number and/or the volume of regions from the second plurality of regions 94. The least decrease in stiffness is along a line extending through the fifth row $96_5$ of openings 94 (i.e., the row of openings 94 furthest from the elongated outer region 82 and closest to the center 72), which is the row having the least number and/or volume of regions from the second plurality of regions 94.

Thus, the stiffness in the first and second directions 62a, 62b is generally greater at regions disposed near (and/or on) the first axis 62 and/or center 72 than at regions disposed near (and/or on) the outer surfaces 60a, 60c and/or corners 66a-66d. The stiffness in the third and fourth directions 64a, 64b is generally greater at regions disposed near (and/or on) the second axis 64 and/or center 72 than at regions disposed near (and/or on) the outer surfaces 60b, 60d and/or corners 66a-66d.

The resonator 50 further includes four electrodes 138a-138d disposed juxtaposed and parallel to outer surfaces 60a-60d, respectively. For example, a first electrode 138a is disposed juxtaposed and parallel to outer surface 60a. A second electrode 138b is disposed juxtaposed and parallel to outer surface 60b. A third electrode 138c is disposed juxtaposed and parallel to outer surface 60c. A fourth electrode 138d is disposed juxtaposed and parallel to outer surface 60d.

The electrodes 138a-138d are spaced apart from the outer surfaces 60a-60d by gaps 140a-140d, respectively. For example, first electrode 138a is spaced apart from outer surface 60a by a gap 140a. Second electrode 138b is spaced apart from outer surface 60b by a gap 140b. Third electrode 138c is spaced apart from outer surface 60c by a gap 140c. Fourth electrode 138d is spaced apart from outer surface 60d by a gap 140d. In the non-operating, at rest state, resonator mass 52 is approximately centered between the four electrodes 138a-138d and the gaps 140a-140d are approximately equal in size.

The electrodes 138a-138d and the resonator mass 52 collectively define four capacitances. The first electrode 138a and resonator mass 52 define a first capacitance. The second electrode 138b and resonator mass 52 define a second capacitance. The third electrode 138c and resonator mass 52 define a third capacitance. The fourth electrode 138d and resonator mass 52 define a fourth capacitance.

As further described below, in the illustrated embodiment, two of the electrodes, e.g., electrodes 138a-138b, are employed as drive electrodes. The other two electrodes, e.g., electrodes 138c-138d, are employed as sense electrodes.

In operation, the two drive electrodes, e.g., first and second electrodes 138a, 138b, receive a differential excitation signal D+, D− via signal lines 142a, 142b, respectively. The excitation signal induces a time varying electrostatic force that causes the resonator mass 52 to oscillate. As further described below, resonator mass 52 oscillates in plane, in a bulk acoustic mode or substantially bulk acoustic mode, rather than in a bending mode. In some embodiments, the oscillation is linear or substantially linear, i.e., described by linear, stationary differential equations of motion. In some embodiments, resonator 50 has a high "Q" (quality factor), and as a result, the shape of resonator mass 52 during oscillation depends primarily on the characteristics of the resonator mass 52.

Figure 2E:
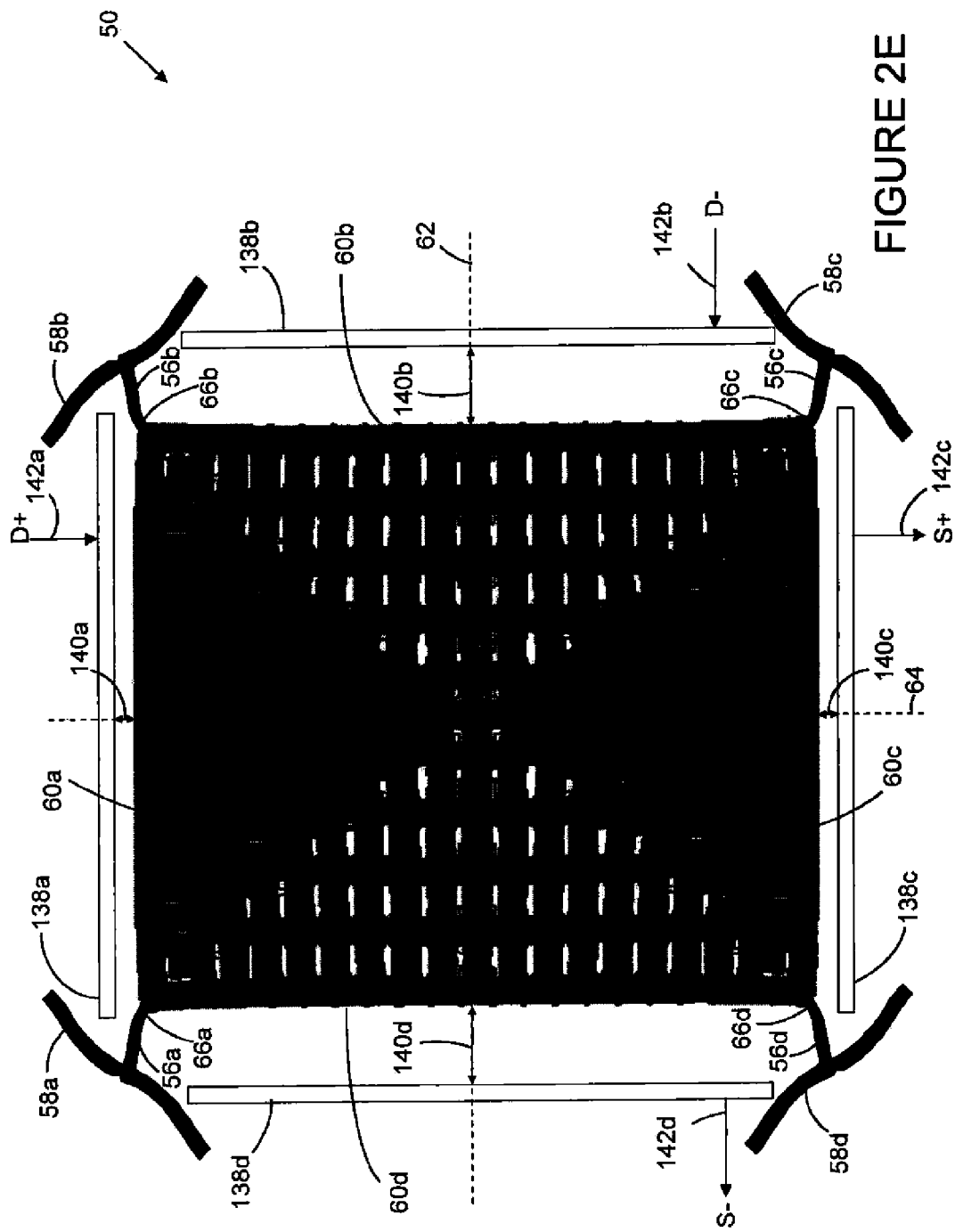
FIG. 2E is a schematic top view representation of the resonator of FIG. 2A in a first state of oscillation.

With reference to FIG. 2E, in a first phase of oscillation, the resonator mass 52 (i) contracts in the first and second directions 62a, 62b and (ii) expands in the third and fourth directions 64a, 64b, resulting in a first state for resonator mass 52. For comparison, dotted lines 60a'-60d' show the shape and position, of surfaces 60a-60d, respectively, in the at rest state. The contraction in first and second directions 62a, 62b causes an increase in the size of the second and fourth gaps 140b, 140d. The expansion in the third and fourth directions 64a, 64b causes a decrease in the size of the first and third gaps 140a, 140c.

Notably, the contraction in first and second directions 62a, 62b and the expansion in third and fourth directions 64a, 64b are each more uniform than if all regions of the resonator mass 52 had the same stiffness. For example, ends of outer surfaces 60a-60d exhibit more movement in third, second, fourth and first directions, respectively, than the amount of movement that would be exhibited if all regions of the resonator mass 52 had the same stiffness. Thus, the movement exhibited at ends of outer surfaces 60a-60d matches the movement at midpoints of outer surfaces 60a-60 more closely than if all regions of the resonator mass 52 had the same stiffness. In some embodiments, the amount of movement exhibited at ends of outer surfaces 60a-60d is at least one half (½) the amount of movement exhibited at the midpoint of the outer surfaces 60a-60d, respectively.

In some embodiments, one or more of the outer surfaces 60a-60d (or at least a major portion thereof) are straight (or at least substantially straight) and/or parallel (or at least substantially parallel) to one or more of the outer surfaces 60a-60d in the at rest state. In the illustrated embodiment, for example, each of the outer surfaces 60a-60d includes a major portion 144a-144d, respectively, that is straight or at least substantially straight and parallel or at least substantially parallel to at least a portion of the respective outer surface in the at rest state. In addition, each outer surface 60a-60d is at least substantially straight overall and overall at least substantially parallel to the configuration of the respective outer surface in the at rest state.

Figure 2F:
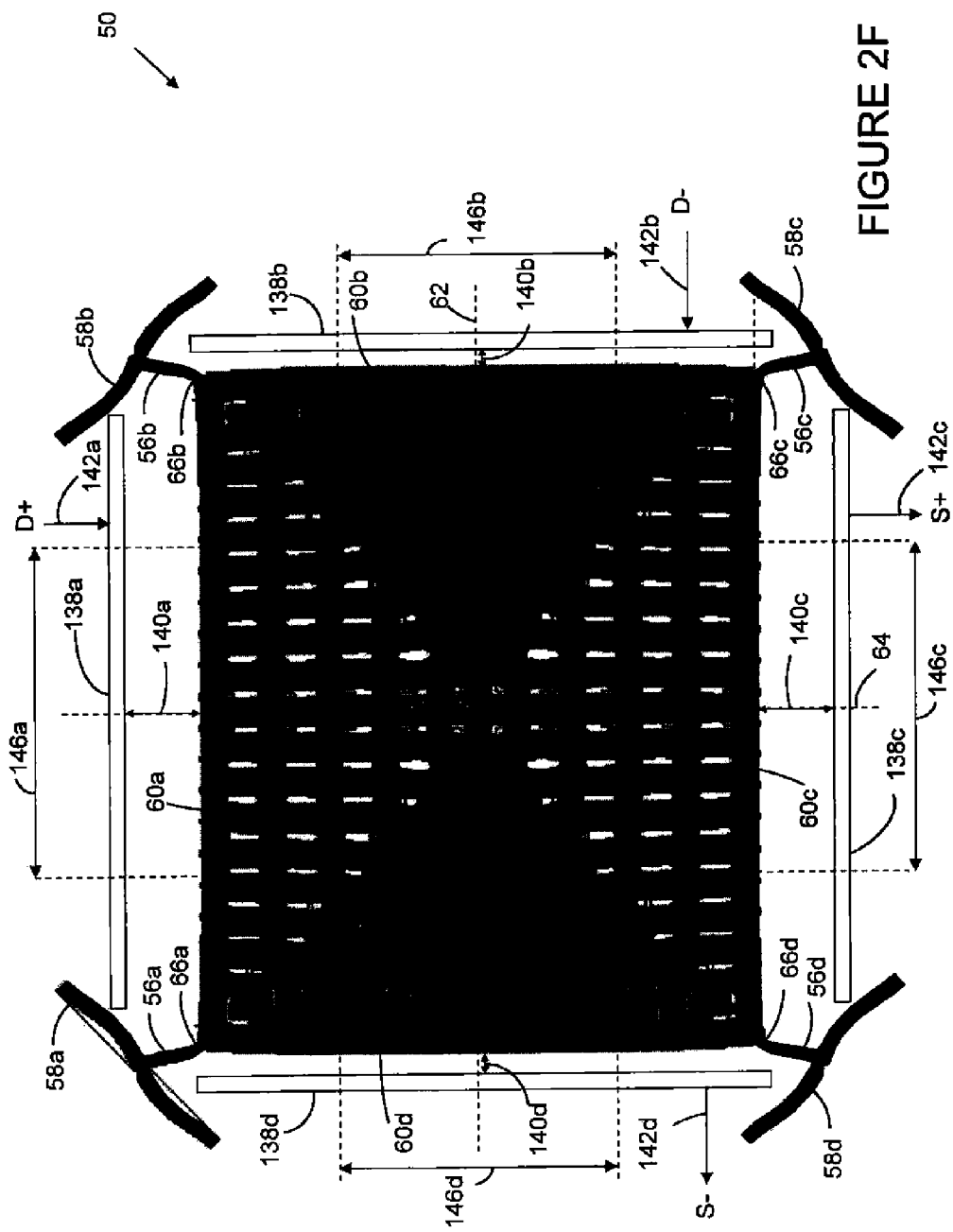
FIG. 2F is a schematic top view representation of the resonator of FIG. 2A in a second state of oscillation.

With reference to FIG. 2F, in a second phase of oscillation, the resonator mass 52 (i) expands in the first and second directions 62a, 62b and (ii) contracts in third and fourth directions 64a, 64b, resulting in a second state for resonator mass 52. For comparison, dotted lines 60a'-60d' show the shape and position, of surfaces 60a-60d, respectively, in the at rest state. The expansion in first and second directions 62a, 62b causes a decrease in the size of second and fourth gaps 140b, 140d. The contraction in third and fourth directions 64a, 64b causes an increase in the size of the first and third gaps 140a, 140c.

The expansion in first and second directions 62a, 62b and the contraction in third and fourth directions 64a, 64b each more uniform than if all regions of the resonator mass 52 had the same stiffness. Thus, for example, ends of outer surfaces 60a-60d exhibit more movement in fourth, first, third and second directions, respectively, than the amount of movement that would be exhibited if all regions of the resonator mass 52 had the same stiffness. Thus, the movement exhibited at ends of outer surfaces 60a-60d matches the movement at midpoints of outer surfaces 60a-60 more closely than if all regions of the resonator mass 52 had the same stiffness. In some embodiments, the amount of movement exhibited at ends of outer surfaces 60a-60d is at least one half (½) the amount of movement exhibited at the midpoint of the outer surfaces 60a-60d, respectively.

In some embodiments, one or more of the outer surfaces 60a-60d (or at least a major portion thereof) are straight (or at least substantially straight) and/or parallel (or at least substantially parallel) to one or more of the outer surfaces 60a-60d in the at rest state. In the illustrated embodiment, for example, each of the outer surfaces 60a-60d includes a major portion 146a-146d, respectively, that is straight or at least substantially straight and parallel or at least substantially parallel to at least a portion of the respective outer surface in the at rest state. In addition, each outer surface 60a-60d is at least substantially straight overall and overall at least substantially parallel to the configuration of the respective outer surface in the at rest state.

The oscillation results in a differential signal S+, S− indicative thereof, at sense electrodes, e.g., third and fourth electrodes 138c, 138d, and at signal lines 142c, 142d coupled thereto. The differential signal S+, S− may be, for example, in the form of a differential voltage and/or a differential current. For example, in the first phase of oscillation, the increase in the size of the fourth gap 140d causes a decrease in the magnitude of the fourth capacitance (i.e., defined by the fourth electrode 138d and resonator 52), which in turn causes an electrical current into or out of the fourth electrode 138d and a change in the voltage of the fourth electrode 138d in accordance therewith. The decrease in the size of the third gap 140c causes an increase in the magnitude of the third capacitance (i.e., defined by the third electrode 138c and resonator 52), which in turn causes an electrical current into or out of the third electrode 138c and a change in the voltage of the third electrode 138c in accordance therewith.

Similarly, in the second phase of oscillation, the decrease in the size of the fourth gap 140d causes an increase in the magnitude of the fourth capacitance (i.e., defined by the fourth electrode 138d and resonator 52), which in turn causes an electrical current into or out of the fourth electrode 138d and a change in the voltage of the fourth electrode in accordance therewith. The increase in the size of the third gap 140c causes a decrease in the magnitude of the third capacitance (i.e., defined by the third electrode 138c and resonator 52), which in turn causes an electrical current into or out of the third electrode 138c and a change in the voltage of the third electrode in accordance therewith.

The magnitude of the differential signal S+, S− depends at least in part, on the magnitude of the change in the third capacitance and the magnitude of the change in the fourth capacitance, i.e., the magnitude of capacitive transduction between the resonator 52 and the sense electrodes, e.g., third and fourth electrodes 138c, 138d, in each phase of oscillation.

As stated above, the movement exhibited at ends of outer surfaces 60a-60d matches the movement at midpoints of outer surfaces 60a-60 more closely than if all regions of the resonator mass 52 had the same stiffness. As a result, the magnitude of the change in the third capacitance and the magnitude of the change in the fourth capacitance are greater than would be exhibited if all regions of the resonator mass 52 had the same stiffness. The increase in capacitive transduction causes an increase in the signal strength, the stability and/or the "Q" factor of the resonator 50.

Figure 2G:
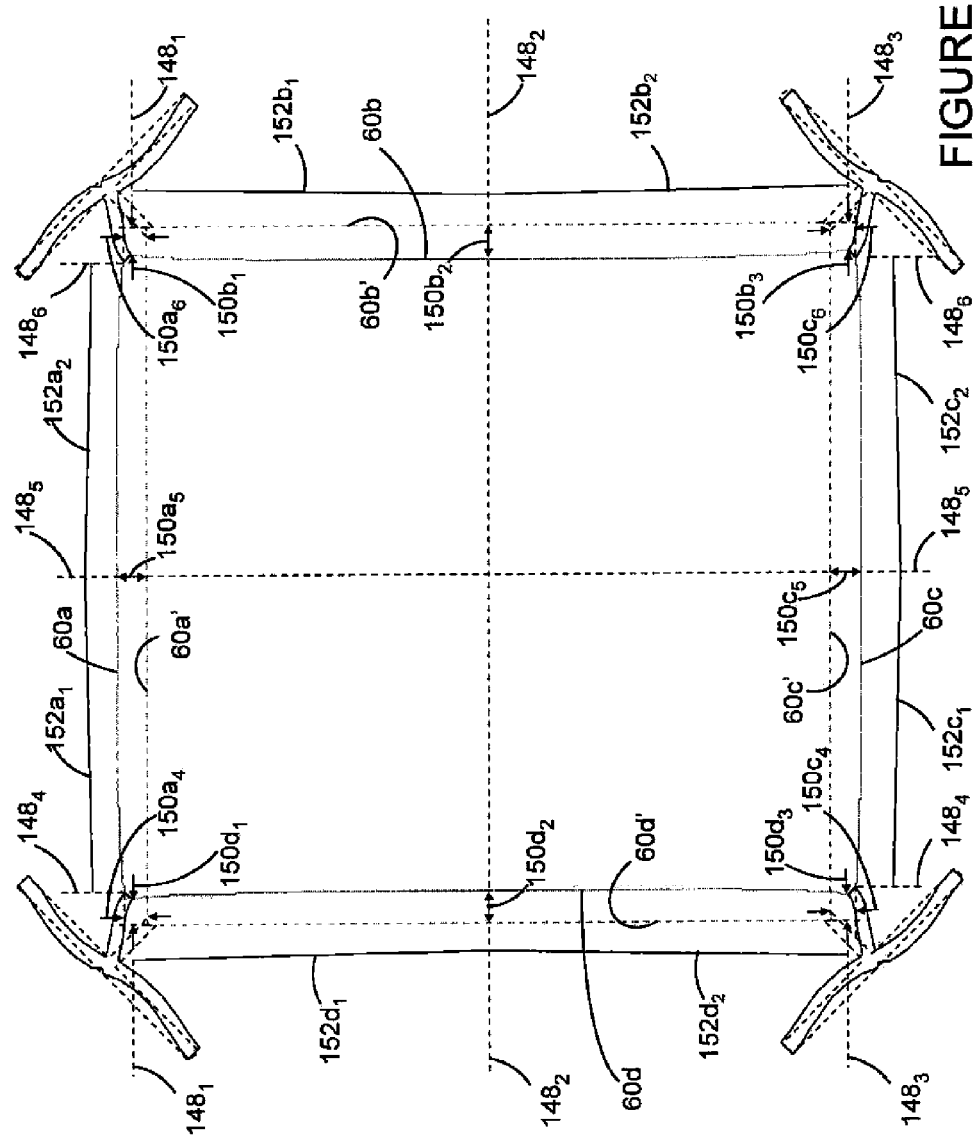
FIG. 2G is a schematic top view representation illustrating the outline of the resonator mass and anchors of the resonator of FIG. 2A, with the resonator in the first state of oscillation, and a schematic top view representation illustrating the outline of the resonator mass in the stationary state.

FIG. 2G is a schematic representation of the resonator showing the amount of expansion and the amount of contraction exhibited by the resonator mass 52 in the first state (compared to the at rest state) along various reference lines.

With reference to FIG. 2G, a first reference line $148_1$, extends through one end of the second outer surface 60b (and/or corner 66b) and one end of the fourth outer surface 60d (and/or corner 66a). A second reference line $148_2$ extends through the midpoint of the second outer surface 60b and the midpoint of the fourth outer surface 60d. A third reference line $148_3$ extends through another end of the second outer surface 60b (and/or corner 66c) and another end of the fourth outer surface 60d (and/or corner 66d). A fourth reference line $148_4$ extends through one end of the first outer surface 60a (and/or corner 66a) and one end of the third outer surface 60c (and/or corner 66d). A fifth reference line $148_5$ extends through the midpoint of the first outer surface 60a and the midpoint of the third outer surface 60c. A sixth reference line $148_6$ extends through another end of the first outer surface 60a (and/or corner 66b) and another end of the third outer surface 60c (and/or corner 66c).

Along the first reference line $148_1$, resonator mass 52 is contracted by a first amount $150b_1+150d_1$. Along the second reference line $148_2$, the resonator mass 52 is contracted by a second amount $150b_2+150d_2$. Along the third reference line $148_3$, the resonator mass 52 is contracted by a third amount $150b_3+150d_3$. Along the fourth reference line $148_3$, resonator mass 52 is expanded by a fourth amount $150a_4+150c_4$. Along the fifth reference line $148_5$, the resonator mass 52 is expanded by a fifth amount $150a_5+150c_5$. Along the sixth reference line $148_6$, the resonator mass 52 is expanded by a sixth amount $150a_6+150c_6$.

The first amount $150b_1+150d_1$ and the third amount $150b_3+150d_3$ are each preferably at least ½ the second amount $150b_2+150d_2$, more preferably, at least ⅔ the second amount $150b_2+150d_2$, more preferably at least ¾ the second amount $150b_2+150d_2$. The fourth amount $150a_4+150c_4$ and the sixth amount $150a_6+150c_6$ are each preferably at least ½ the fifth amount $150a_5+150c_5$, more preferably, at least ⅔ the fifth amount $150a_5+150c_5$, more preferably at least 7/10 the fifth amount $150a_5+150c_5$.

The contraction of resonator mass 52 in first and second directions 62a, 62b causes second and fourth outer surfaces 60b, 60d to move (i.e., compared to the at rest state) in the second and first directions 62b, 62a, respectively. In some embodiments, a portion of the second outer surface 60b disposed on the first reference line $148_1$ moves by the amount $150b_1$, a portion of the second outer surface 60b disposed on the second reference line $148_2$ moves by the amount $150b_2$ and a portion of the second outer surface 60b disposed on the third reference line $148_3$ moves by the amount $150b_3$. A portion of the fourth outer surface 60d disposed on the first reference line $148_1$ moves by the amount $150d_1$, a portion of the fourth outer surface 60d disposed on the second reference line $148_2$ moves by the amount $150d_2$ and a portion of the fourth outer surface 60d disposed on the third reference line $148_3$ moves by the amount $150d_3$. The amount $150b_1$ and the amount $150b_3$ are each preferably at least ½ the amount $150b_2$, more preferably, at least ⅔ the amount $150b_2$, more preferably at least ¾ the amount $150b_2$. The amount $150d_1$ and the amount $150d_3$ are each preferably at least ½ the amount $150d_2$, more preferably, at least ⅔ the amount $150d_2$, more preferably at least ¾ the amount $150d_2$.

The expansion of resonator mass 52 in third and fourth directions 64a, 64b causes the first and third outer surfaces 60a, 60c to move (i.e., compared to the at rest state) in the third and fourth directions 64a, 64b, respectively. In some embodiments, a portion of the first outer surface 60a disposed on the fourth reference line $148_4$ moves by the amount $150a_4$, a portion of the first outer surface 60a disposed on the fifth reference line $148_5$ moves by the amount $150a_5$, and the portion of the first outer surface $60a$ disposed on the sixth reference line $148_6$ moves the amount $150a_6$. A portion of the third outer surface $60c$ disposed on the fourth reference line $148_4$ moves by the amount $150c_4$, a portion of the third outer surface $60c$ disposed on the fifth reference line $148_5$ moves by the amount $150c_5$, and the portion of the third outer surface $60c$ disposed on the sixth reference line $148_6$ moves by the amount $150c_6$.

The amount $150a_4$ and the amount $150a_6$ are each preferably at least ½ the amount $150a_2$, more preferably, at least ⅔ the amount $150a_2$, more preferably at least 7/10 the amount $150a_2$. The amount $150c_4$ and the amount $150c_6$ are each preferably at least ½ the amount $150c_5$, more preferably, at least ⅔ the amount $150c_5$, more preferably at least 7/10 the amount $150c_5$.

A first portion of the second outer surface $60b$ and a first portion of the fourth outer surface $60d$ extend from the first reference line $148_1$ to the second reference line $148_2$. A second portion of the second outer surface $60b$ and a second portion of the fourth outer surface $60d$ extend from the second reference line $148_2$ to the third reference line $148_3$. The first portion of the second outer surface $60b$ has an average slope $152b_1$. The second portion of the second outer surface $60b$ has an average slope $152b_2$. The first portion of the fourth outer surface $60d$ has an average slope $152d_1$. The second portion of the fourth outer surface $60d$ has an average slope $152d_2$.

A first portion of the first outer surface $60a$ and a first portion of the third outer surface $60c$ extend from the fourth reference line $148_4$ to the fifth reference line $148_5$. A second portion of the first outer surface $60a$ and a second portion of the third outer surface $60c$ extend from the fifth reference line $148_5$ to the sixth reference line $148_6$. The first portion of the first outer surface $60a$ has an average slope $152a_1$. The second portion of the first outer surface $60a$ has an average slope $152a_2$. The first portion of the third outer surface $60c$ has an average slope $152c_1$. The second portion of the third outer surface $60c$ has an average slope $152c_2$.

In some embodiments, the average slope of the first portion of an outer surface and the average slope of the second portion of such outer surface are preferably within ten degrees of one another, more preferably within five degrees of one another. For example, the average slope $152a_1$ of the first portion of the first outer surface $60a$ and the average slope $152a_2$ of the second portion of the first outer surface $60a$ are preferably within ten degrees of one another, more preferably within five degrees of one another, more preferably within three degrees of one another. The average slope $152b_1$ of the first portion of the second outer surface $60b$ and the average slope $152b_2$ of the second portion of the second outer surface $60d$ are preferably within ten degrees of one another, more preferably within five degrees of one another, more preferably within three degrees of one another. The average slope $152c_1$ of the first portion of the third outer surface $60c$ and the average slope $152c_2$ of the second portion of the third outer surface $60c$ are preferably within ten degrees of one another, more preferably within five degrees of one another, more preferably within three degrees of one another. The average slope $152d_1$ of the first portion of the fourth outer surface $60d$ and the average slope $152d_2$ of the second portion of the fourth outer surface $60d$ are preferably within ten degrees of one another, more preferably within five degrees of one another, more preferably within three degrees of one another.

The average slope $152a_1$ of the first portion of the first outer surface $60a$ is preferably within five degrees, more preferably within 2.5 degrees, more preferably within 1.5 degrees, of the average slope of the corresponding portion of the first outer surface $60a$ in the at rest state. The average slope $152a_2$ of the second portion of the first outer surface $60a$ is preferably within five degrees, more preferably within 2.5 degrees, more preferably within 1.5 degrees, of the average slope of the corresponding portion of the first outer surface $60a$ in the at rest state. The average slope $152b_1$ of the first portion of the second outer surface $60b$ is preferably within five degrees, more preferably within 2.5 degrees, more preferably within 1.5 degrees, of the average slope of the corresponding portion of the second outer surface $60b$ in the at rest state. The average slope $152b_2$ of the second portion of the second outer surface $60b$ is preferably within five degrees, more preferably within 2.5 degrees, more preferably within 1.5 degrees, of the average slope of the corresponding portion of the second outer surface $60b$ in the at rest state. The average slope $152c_1$ of the first portion of the third outer surface $60c$ is preferably within five degrees, more preferably within 2.5 degrees, more preferably within 1.5 degrees, of the average slope of the corresponding portion of the third outer surface $60c$ in the at rest state. The average slope $152c_2$ of the second portion of the third outer surface $60c$ is preferably within five degrees, more preferably within 2.5 degrees, more preferably within 1.5 degrees, of the average slope of the corresponding portion of the third outer surface $60c$ in the at rest state. The average slope $152d_1$ of the first portion of the fourth outer surface $60d$ is preferably within five degrees, more preferably within 2.5 degrees, more preferably within 1.5 degrees, of the average slope of the corresponding portion of the fourth outer surface $60d$ in the at rest state. The average slope $152d_2$ of the second portion of the fourth outer surface $60d$ is preferably within five degrees, more preferably within 2.5 degrees, more preferably within 1.5 degrees, of the average slope of the corresponding portion of the fourth outer surface $60d$ in the at rest state.

Figure 2H:
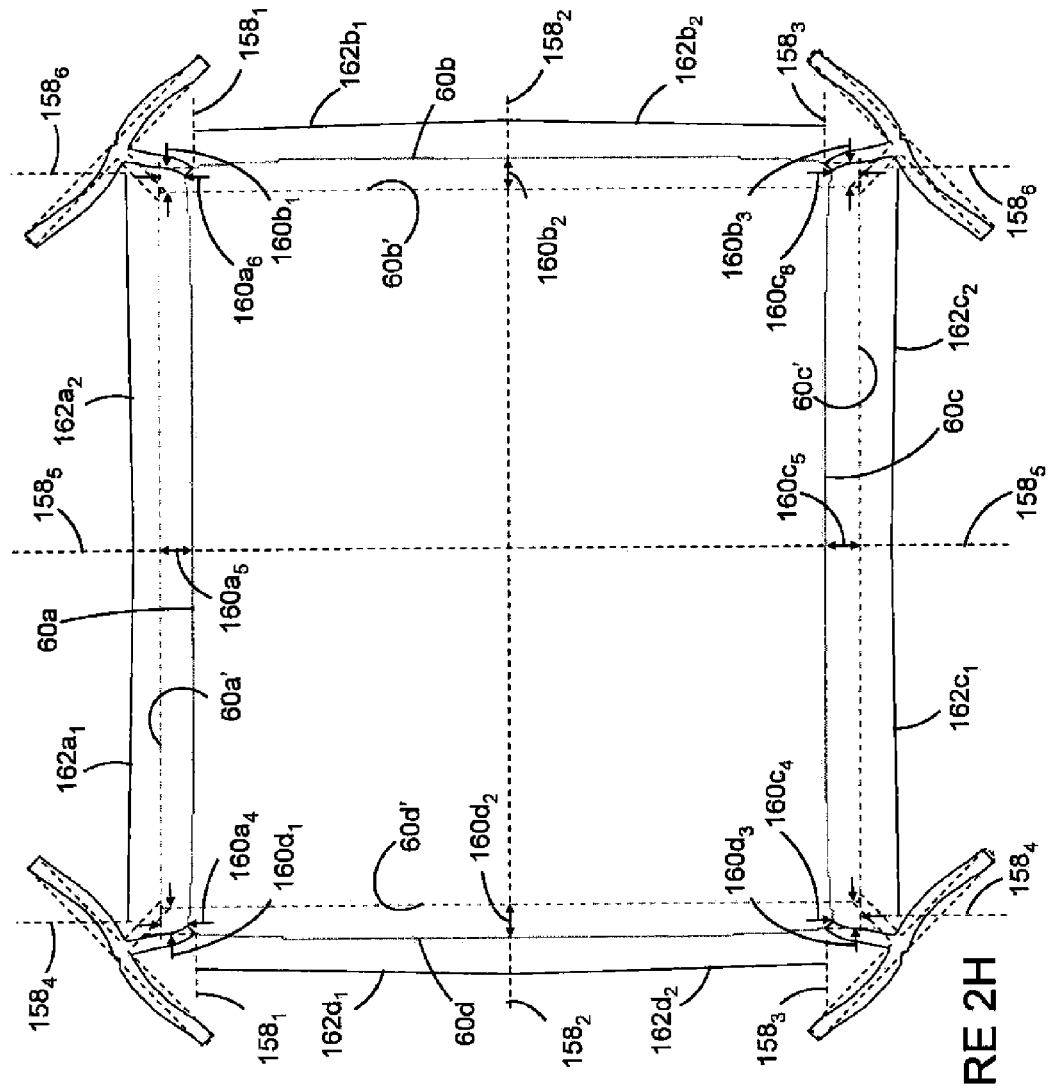
FIG. 2H is a schematic top view representation illustrating the outline of the resonator mass and anchors of the resonator of FIG. 2A, with the resonator in the second state of oscillation, and a schematic top view representation illustrating the outline of the resonator mass in the stationary state.

FIG. 2H is a schematic representation of the resonator showing the amount of expansion and the amount of contraction exhibited by the resonator mass $52$ in the second state (compared to the at rest state) along various reference lines.

With reference to FIG. 2H, a first reference line $158_1$ extends through one end of the second outer surface $60b$ (and/or corner $66b$) and one end of the fourth outer surface $60d$ (and/or corner $66a$). A second reference line $158_2$ extends through the midpoint of the second outer surface $60b$ and the midpoint of the fourth outer surface $60d$. A third reference line $158_3$ extends through another end of the second outer surface $60b$ (and/or corner $66c$) and another end of the fourth outer surface $60d$ (and/or corner $66d$). A fourth reference line $158_4$ extends through one end of the first outer surface $60a$ (and/or corner $66a$) and one end of the third outer surface $60c$ (and/or corner $66d$). A fifth reference line $158_5$ extends through the midpoint of the first outer surface $60a$ and the midpoint of the third outer surface $60c$. A sixth reference line $158_6$ extends through another end of the first outer surface $60a$ (and/or corner $66b$) and another end of the third outer surface $60c$ (and/or corner $66c$).

Along the first reference line $148_1$, resonator mass $52$ is expanded by a first amount $160b_1+160d_1$. Along the second reference line $148_2$, the resonator mass $52$ is expanded by a second amount $160b_2+160d_2$. Along the third reference line $158_3$, the resonator mass $52$ is expanded by a third amount $160b_3+160d_3$. Along the fourth reference line $158_3$, resonator mass $52$ is contracted by a fourth amount $160a_4+160c_4$. Along the fifth reference line $158_5$, the resonator mass $52$ is contracted by a fifth amount $160a_5+160c_5$. Along the sixth reference line $158_6$, the resonator mass $52$ is contracted by a sixth amount $160a_6+160c_6$.

The first amount $160b_1+160d_1$ and the third amount $160b_3+160d_3$ are each preferably at least ½ the second amount $160b_2+160d_2$, more preferably, at least ⅔ the second amount $160b_2+160d_2$, more preferably at least ¾ the second amount $160b_2+160d_2$. The fourth amount $160a_4+160c_4$ and the sixth amount $160a_6+160c_6$ are each preferably at least ½ the fifth amount $160a_5+160c_5$, more preferably, at least ⅔ the fifth amount $160a_5+160c_5$, more preferably at least 7/10 the fifth amount $160a_5+160c_5$.

The expansion of resonator mass 52 in first and second directions 62a, 62b causes second and fourth outer surfaces 60b, 60d to move in the first and second directions 62a, 62b, respectively (i.e., compared to the at rest state). In some embodiments, a portion of the second outer surface 60b disposed on the first reference line $158_1$ moves by the amount $160b_1$, a portion of the second outer surface 60b disposed on the second reference line $158_2$ moves by the amount $160b_2$ and a portion of the second outer surface 60b disposed on the third reference line $158_3$ moves by the amount $150b_3$. A portion of the fourth outer surface 60d disposed on the first reference line $158_1$ moves by the amount $160d_1$, a portion of the fourth outer surface 60d disposed on the second reference line $158_2$ moves by the amount $160d_2$ and a portion of the fourth outer surface 60d disposed on the third reference line $158_3$ moves by the amount $150d_3$. The amount $160b_1$ and the amount $160b_3$ are each preferably at least ½ the amount $160b_2$, more preferably, at least ⅔ the amount $160b_2$, more preferably at least ¾ the amount $160b_2$. The amount $160d_1$ and the amount $160d_3$ are each preferably at least ½ the amount $160d_2$, more preferably, at least ⅔ the amount $160d_2$, more preferably at least ¾ the amount $160d_2$.

The contraction of resonator mass 52 in third and fourth directions 64a, 64b causes the first and third outer surfaces 60a, 60c to move (i.e., compared to the at rest state) in the fourth and third directions 64b, 64a, respectively. In some embodiments, a portion of the first outer surface 60a disposed on the fourth reference line $158_4$ moves by the amount $160a_4$, a portion of the first outer surface 60a disposed on the fifth reference line $158_5$ moves by the amount $160a_5$, and the portion of the first outer surface 60a disposed on the sixth reference line $158_6$ moves the amount $160a_6$. A portion of the third outer surface 60c disposed on the fourth reference line $158_4$ moves by the amount $160c_4$, a portion of the third outer surface 60c disposed on the fifth reference line $158_5$ moves by the amount $160c_5$, and the portion of the third outer surface 60c disposed on the sixth reference line $158_6$ moves by the amount $160c_6$. The amount $150a_4$ and the amount $150a_6$ are each preferably at least ½ the amount $150a_2$, more preferably, at least ⅔ the amount $150a_2$, more preferably at least 7/10 the amount $150a_2$. The amount $150c_4$ and the amount $150c_6$ are each preferably at least ½ the amount $150c_5$, more preferably, at least ⅔ the amount $150c_5$, more preferably at least 7/10 the amount $150c_5$.

A first portion of the second outer surface 60b and a first portion of the fourth outer surface 60d extend from the first reference line $158_1$ to the second reference line $158_2$. A second portion of the second outer surface 60b and a second portion of the fourth outer surface 60d extend from the second reference line $158_2$ to the third reference line $158_3$. The first portion of the second outer surface 60b has an average slope $162b_1$. The second portion of the second outer surface 60b has an average slope $162b_2$. The first portion of the fourth outer surface 60d has an average slope $162d_1$. The second portion of the fourth outer surface 60d has an average slope $162d_2$.

A first portion of the first outer surface 60a and a first portion of the third outer surface 60c extend from the fourth reference line $158_4$ to the fifth reference line $158_5$. A second portion of the first outer surface 60a and a second portion of the third outer surface 60c extend from the fifth reference line $158_5$ to the sixth reference line $158_6$. The first portion of the first outer surface 60a has an average slope $162a_1$. The second portion of the first outer surface 60a has an average slope $162a_2$. The first portion of the third outer surface 60c has an average slope $162c_1$. The second portion of the third outer surface 60c has an average slope $162c_2$.

In some embodiments, the average slope of the first portion of an outer surface and the average slope of the second portion of such outer surface are preferably within ten degrees of one another, more preferably within five degrees of one another. For example, the average slope $162a_1$ of the first portion of the first outer surface 60a and the average slope $162a_2$ of the second portion of the first outer surface 60a are preferably within ten degrees of one another, more preferably within five degrees of one another, more preferably within three degrees of one another. The average slope $162b_1$ of the first portion of the second outer surface 60b and the average slope $162b_2$ of the second portion of the second outer surface 60d are preferably within ten degrees of one another, more preferably within five degrees of one another, more preferably within three degrees of one another. The average slope $162c_1$ of the first portion of the third outer surface 60c and the average slope $162c_2$ of the second portion of the third outer surface 60c are preferably within ten degrees of one another, more preferably within five degrees of one another, more preferably within three degrees of one another. The average slope $162d_1$ of the first portion of the fourth outer surface 60d and the average slope $162d_2$ of the second portion of the fourth outer surface 60d are preferably within ten degrees of one another, more preferably within five degrees of one another, more preferably within three degrees of one another.

The average slope $162a_1$ of the first portion of the first outer surface 60a is preferably within five degrees, more preferably within 2.5 degrees, more preferably within 1.5 degrees, of the average slope of the corresponding portion of the first outer surface 60a in the at rest state. The average slope $162a_2$ of the second portion of the first outer surface 60a is preferably within five degrees, more preferably within 2.5 degrees, more preferably within 1.5 degrees, of the average slope of the corresponding portion of the first outer surface 60a in the at rest state. The average slope $162b_1$ of the first portion of the second outer surface 60b is preferably within five degrees, more preferably within 2.5 degrees, more preferably within 1.5 degrees, of the average slope of the corresponding portion of the second outer surface 60b in the at rest state. The average slope $162b_2$ of the second portion of the second outer surface 60b is preferably within five degrees, more preferably within 2.5 degrees, more preferably within 1.5 degrees, of the average slope of the corresponding portion of the second outer surface 60b in the at rest state. The average slope $162c_1$ of the first portion of the third outer surface 60c is preferably within five degrees, more preferably within 2.5 degrees, more preferably within 1.5 degrees, of the average slope of the corresponding portion of the third outer surface 60c in the at rest state. The average slope $162c_2$ of the second portion of the third outer surface 60c is preferably within five degrees, more preferably within 2.5 degrees, more preferably within 1.5 degrees, of the average slope of the corresponding portion of the third outer surface 60c in the at rest state. The average slope $162d_1$ of the first portion of the fourth outer surface 60d is preferably within five degrees, more preferably within 2.5 degrees, more preferably within 1.5 degrees, of the average slope of the corresponding portion of the fourth outer surface 60d in the at rest state. The average slope $162d_2$ of the second portion of the fourth outer surface 60d is preferably within five degrees, more preferably within 2.5 degrees, more preferably within 1.5 degrees, of the average slope of the corresponding portion of the fourth outer surface $60d$ in the at rest state.

Notably, the amount of expansion exhibited by the resonator mass in one state may or may not be equal to the amount of contraction exhibited by the resonator mass in such state and/or the amount of expansion or contraction exhibited by the resonator mass in another state.

A region may have any configuration (e.g., size, shape) and may or may not have the same configuration (e.g., size, shape) as any other region. Thus, the size and/or shape of one region may or may not be the same as the size and/or shape of any other regions. In some embodiments, for example, one, some or all regions have the same shape or at least substantially the same shape as one another. In some other embodiments, the shape of one, some or all regions is different from the shape of one or more other regions.

The configuration of a region may be symmetrical, non symmetrical, or any combination thereof. Each region may or may not have a uniform density and/or stiffness throughout the entire region. Moreover, regions may be disposed in any type of arrangement including for example, a symmetrical arrangement, a non-symmetrical arrangement or any combination thereof.

The first plurality of regions may or may not have the same density as one another. In some embodiments, for example, each of the first plurality of regions has the same density as one another. In some other embodiments, one or more of the first plurality of regions has a density different than the density of one or more other regions of the first plurality of regions. Likewise, the second plurality of regions may or may not have the same density as one another. In some embodiments, for example, each of the second plurality of regions has the same density as one another. In some other embodiments, one or more of the second plurality of regions has a density different that the density of one or more other regions of the second plurality of regions.

The second plurality of regions are disposed in a non-uniform arrangement such that the stiffness varies from position to position help provide the resonator mass with a desired mode of oscillation. The non uniform arrangement is non-uniform to a degree greater than would result due to normal manufacturing tolerances associated with fabrication of resonator mass.

Each of the second plurality of regions has a density that is less than the density of each region of the first plurality of regions by an amount greater than would result due to manufacturing tolerances associated with fabrication of such region of the first plurality of regions. In some embodiments, each of the second plurality of regions has a density that is less than the density of each region of the first plurality of regions by an amount greater than ¼ of the density of such region of the first plurality of regions, more preferably less than the density of each region of the first plurality of regions by an amount greater than ½ of the density of such region of the first plurality of regions.

If resonator mass 52 includes one or more elongated outer regions 82, elongated inner regions 84 and/or connector regions 86, such one or more elongated outer regions 82, elongated inner regions 84 and/or connector regions 86 may each have any configuration and may be disposed in any type of arrangement, including for example, a symmetrical arrangement, a non-symmetrical arrangement or any combination thereof.

In the illustrated embodiment, each of the elongated outer regions 82 comprises a substantially straight beam having a relatively uniform width. In addition, each of the elongated outer regions 82 has the same or substantially the same length and the same or substantially the same shape. Each of the elongated inner regions 82 also comprises a substantially straight beam having a relatively uniform width. However, other configurations, which may or may not includes other configurations of elongated outer regions 82, elongated inner regions 84 and/or connector regions 86, may also be employed.

If one or more opening are employed, such opening(s) may have any configuration (e.g., shape, size). The shape of an opening may be symmetrical, non symmetrical, or any combination thereof. Moreover, the shape of one opening may or may not be the same as the shape of any other openings. In some embodiments, for example, all of openings have the same shape or at least substantially the same shape as one another. In some other embodiments, the shape of one opening is different from the shape of one or more other openings. Thus, in some embodiments, openings 94 may be rectangular, for example, as shown, and/or cylindrical, and/or may be similar to one another, for example, as shown, but are not limited to such. An opening 94 may extend partially or entirely through the height/thickness of resonator mass 52. Moreover, one or more openings may extend partially through resonator mass 52 and one or more other openings may extend entirely through resonator mass 52.

Openings may be disposed in any type of arrangement including for example, a symmetrical arrangement, a non-symmetrical arrangement or any combination thereof. Thus, the openings may or may not be arranged in a pattern.

A section, e.g., sections $80a$-$80d$, of resonator mass 52 may also have any configuration (e.g., size, shape) and may or may not have the same configuration (e.g., size, shape) as any other section. As stated above, in the illustrated embodiment, each section $80a$-$80d$ of resonator mass 52 has the same configuration. In some other embodiments, however, resonator mass 52 may include one or more sections having a different configuration than or more other sections. The configuration of a section may be symmetrical, non symmetrical, or any combination thereof. Each section may or may not have a uniform density and/or stiffness throughout the entire section.

Sections may be disposed in any type of arrangement including for example, a symmetrical arrangement, a non-symmetrical arrangement or any combination thereof.

Resonator mass 52 may or may not have a symmetrical configuration. Indeed, the resonator mass 52 may have any configuration (e.g., size, shape, structure) to provide the resonator mass 52 with desired oscillation mode or modes.

Although the contour of outer surfaces $60a$-$60d$ of resonator mass 52 are shown straight, any contour or contours may be employed. For example, outer surface(s) of resonator mass 52 may be straight, curved, piecewise linear, piecewise curved, irregular and/or any combination thereof. In some embodiments, one or more outer surfaces of resonator mass 52 have a contour that corresponds with the contour of one or more electrodes associated therewith. In some embodiments, resonator mass 52 does not include corners $66a$-$66d$. In some such embodiments, outer surfaces $60a$-$60d$ may be connected to one another via one or more curved sections.

Moreover, although the resonator mass 52 is illustrated as having a substantially rectangular shape, other shapes may be employed. Notably, the resonator mass 52 may include fewer than four outer surfaces or sides or more than four outer surfaces or sides. Indeed, the resonator mass 52 may take any geometric shape, whether now know or later developed, for example, but not limited to, rectangular, circular and/or elliptical.

The configuration (e.g., size, shape, structure) of the resonator mass 52 may determine one or more resonant frequencies of MEMS resonator 50.

In some embodiments, MEMS resonator mass 52 has a relatively stable or fixed center of gravity during oscillation. For example, the center of resonator mass 52 may undergo little or no movement as the resonator mass 52 oscillates between the first and second states. In this way, the resonator mass 52 may help reduce and/or minimize energy loss within resonator 50 and thereby help provide the resonator 50 with a higher Q-factor.

Other designs and/or configurations of resonator mass 52 may be employed to, for example, affect the durability and/or stability of MEMS resonator 50 as well as minimize, reduce or limit any adverse impact on "Q" factor of MEMS resonator array 50.

The shape and/or width of resonator mass 52 in the vicinity of corners 66a-66d may impact the durability and/or stability of MEMS resonator 50 (and in particular, the stress in corners 66a-66d, which in some embodiments may be employed as anchoring locations) as well as impact the location of nodal points (if any) and the resonant frequency of MEMS resonator 50. In this regard, by widening elongated outer regions 82 in the vicinity of corners 66a-66d and/or filleting elongated outer regions 82 in the vicinity of corners 66a-66d, the stress on the resonator mass 52 may be reduced and/or minimized.

Figure 3A:
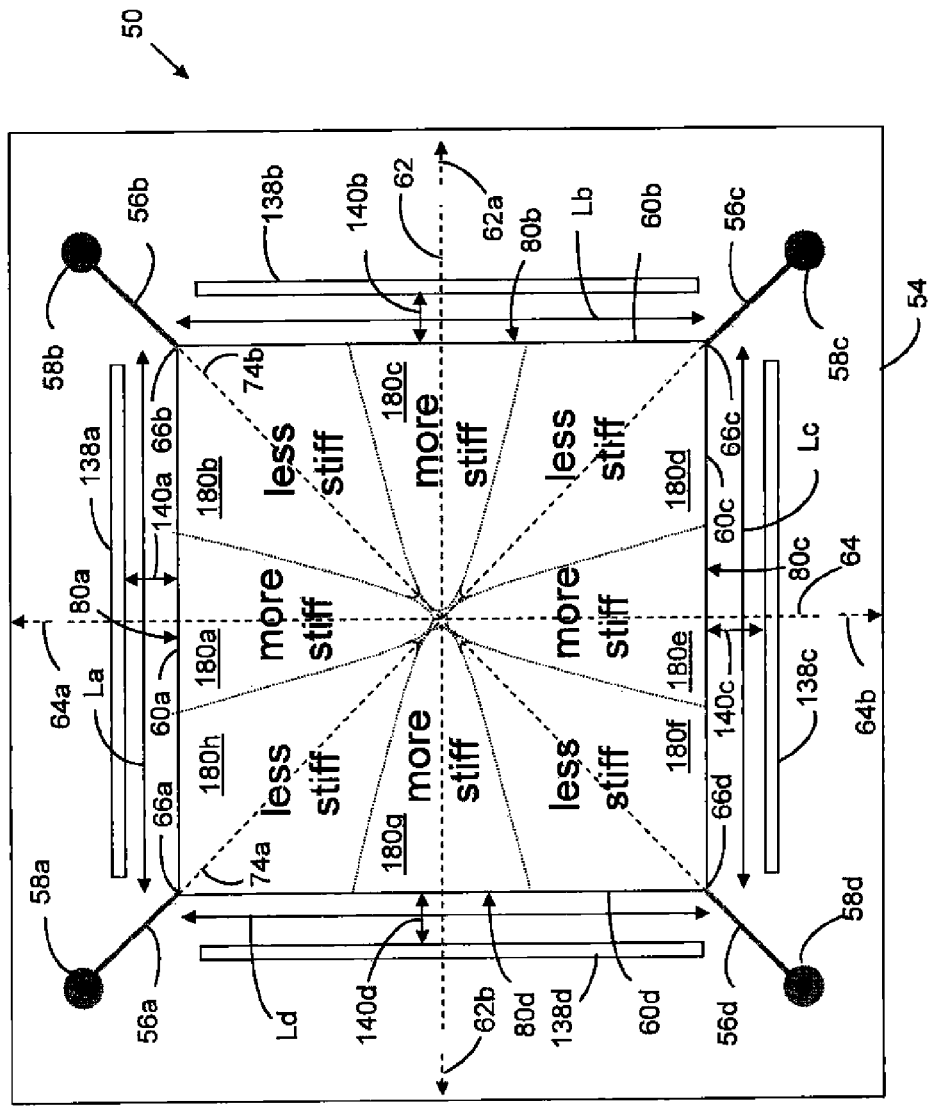
FIG. 3A is a schematic top view representation of a MEMS resonator in accordance with another embodiment of the present invention.

FIG. 3A is a schematic top view representation of a MEMS resonator 50 in accordance with another embodiment of the present invention. With reference to FIG. 3A, in this embodiment, resonator mass 52 includes eight sections 180a-180h. Four of the sections, i.e., sections 180a, 180c, 180e, 180g, are sometimes referred to herein as "more stiff" sections. The other four sections i.e., sections 180b, 180d, 180f, 180h, are sometimes referred to herein as "less stiff" sections. The first four (or "more stiff") sections 180a, 180c, 180e, 180g are stiff and/or more stiff than the second four (or "less stiff") sections 180b, 180d, 180f, 180h. The second four (or "less stiff") sections 180b, 180d, 180f, 180h are compliant and/or less stiff than the first four (or "more stiff") sections 180a, 180c, 180e, 180g.

Each of the first "more stiff" sections 180a, 180c, 180e, 180g is disposed and/or centered on an axis of the resonator mass 52 and extends from or near center 72 of resonator mass 52 to or near an outer surface of resonator mass 52. For example, section 180a is disposed and/or centered on the second reference axis 64 and extends from or near center 72 of resonator mass 52 to outer surface 60a of resonator mass 52. Section 180c is disposed and/or centered on the first reference axis 62 and extends from or near center 72 of resonator mass 52 to outer surface 60b of resonator mass 52. Section 180e is disposed and/or centered on the second reference axis 64 and extends from or near center 72 of resonator mass to outer surface 60c of resonator mass 52. Section 180g is disposed and/or centered on the first reference axis 62 and extends from or near center 72 of resonator mass 52 to outer surface 60d of resonator mass 52.

Each of the "less stiff" sections 180b, 180d, 180f, 180h is disposed and/or centered on a diagonal of resonator mass 52 and extends from an inner region of resonator mass 52 to or near one or more outer surfaces and/or a corner of resonator mass 52. For example, section 180b is disposed and/or centered on the first diagonal 74a and extends from an inner region of resonator mass 52 to or near outer surfaces 60d, 60a and/or corner 66a. Section 180d is disposed and/or centered on the second diagonal 74b and extends from an inner region of resonator mass 52 to or near outer surfaces 60b, 60c and/or corner 66b. Section 180f is disposed and/or centered on the first diagonal 74a and extends from an inner region of resonator mass 52 to or near outer surfaces 60b, 60c and/or corner 66c. Section 180h is disposed and/or centered on the second diagonal 74b and extends from an inner region of resonator mass 52 to or near outer surfaces 60c, 60d and/or corner 66d.

First and second diagonals 74a, 74b divide the resonator mass 52 into four triangular shaped sections 80a-80d. Each of the four triangular shaped sections 80a-80d includes a respective one of the first four (or "more stiff") sections 180a, 180c, 180e, 180g and a respective half of each of two of the second four (or "less stiff") sections 180b, 180d, 180f, 180h. For example, the first triangular shaped section 80a includes "more stiff" section 180a and one half of "less stiff" sections 180h, 180b. The second triangular shaped section 80b includes "more stiff" section 180c and one half of "less stiff" sections 180b, 180d. The third triangular shaped section 80c includes "more stiff" section 180e and one half of "less stiff" sections 180d, 180f. The fourth triangular shaped section 80d includes "more stiff" section 180g and one half of "less stiff" sections 180f, 180h.

Figure 3B:
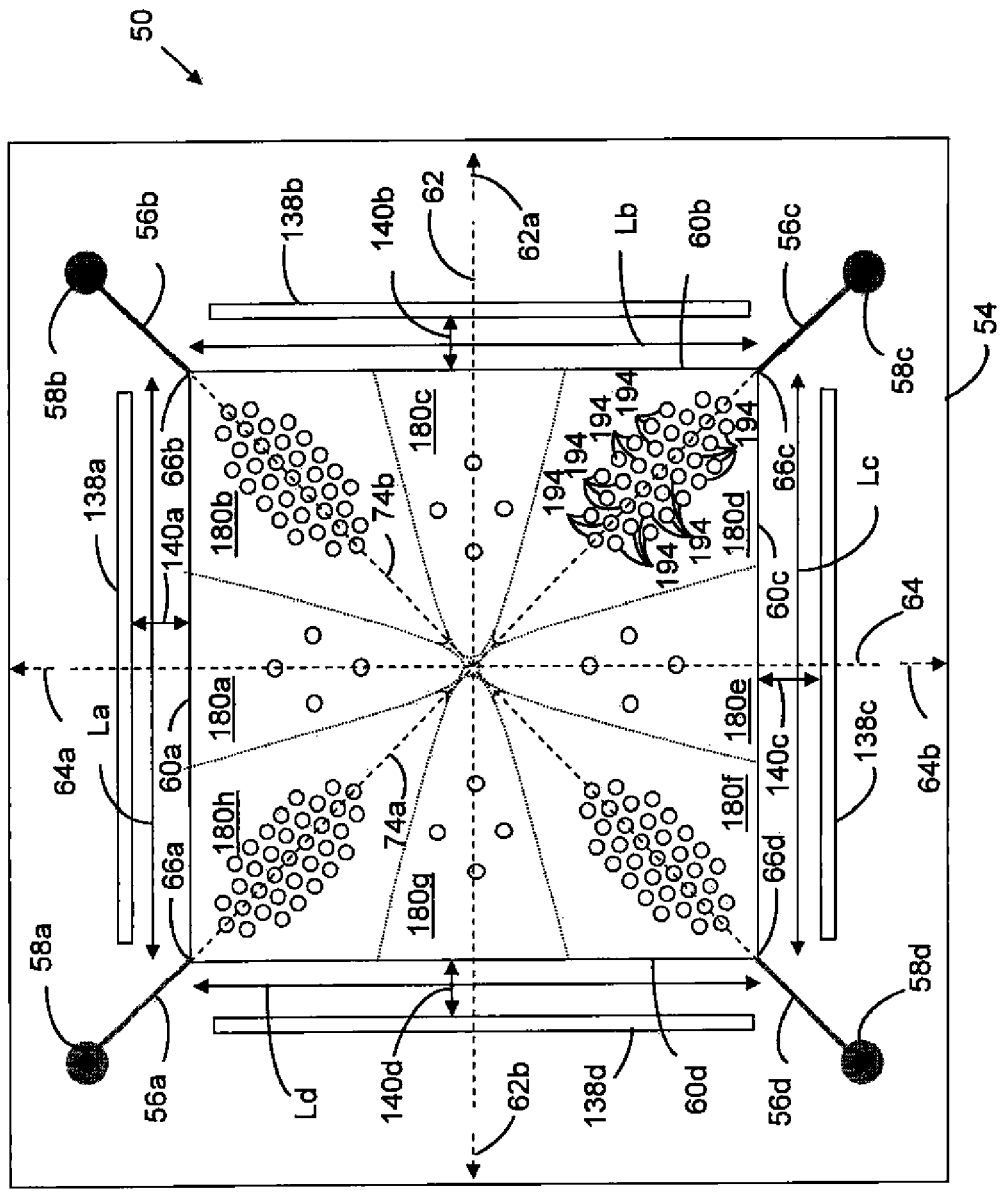
FIG. 3B is a schematic top view representation of one embodiment of the MEMS resonator of FIG. 3A; in a stationary state.
Figure 3C:
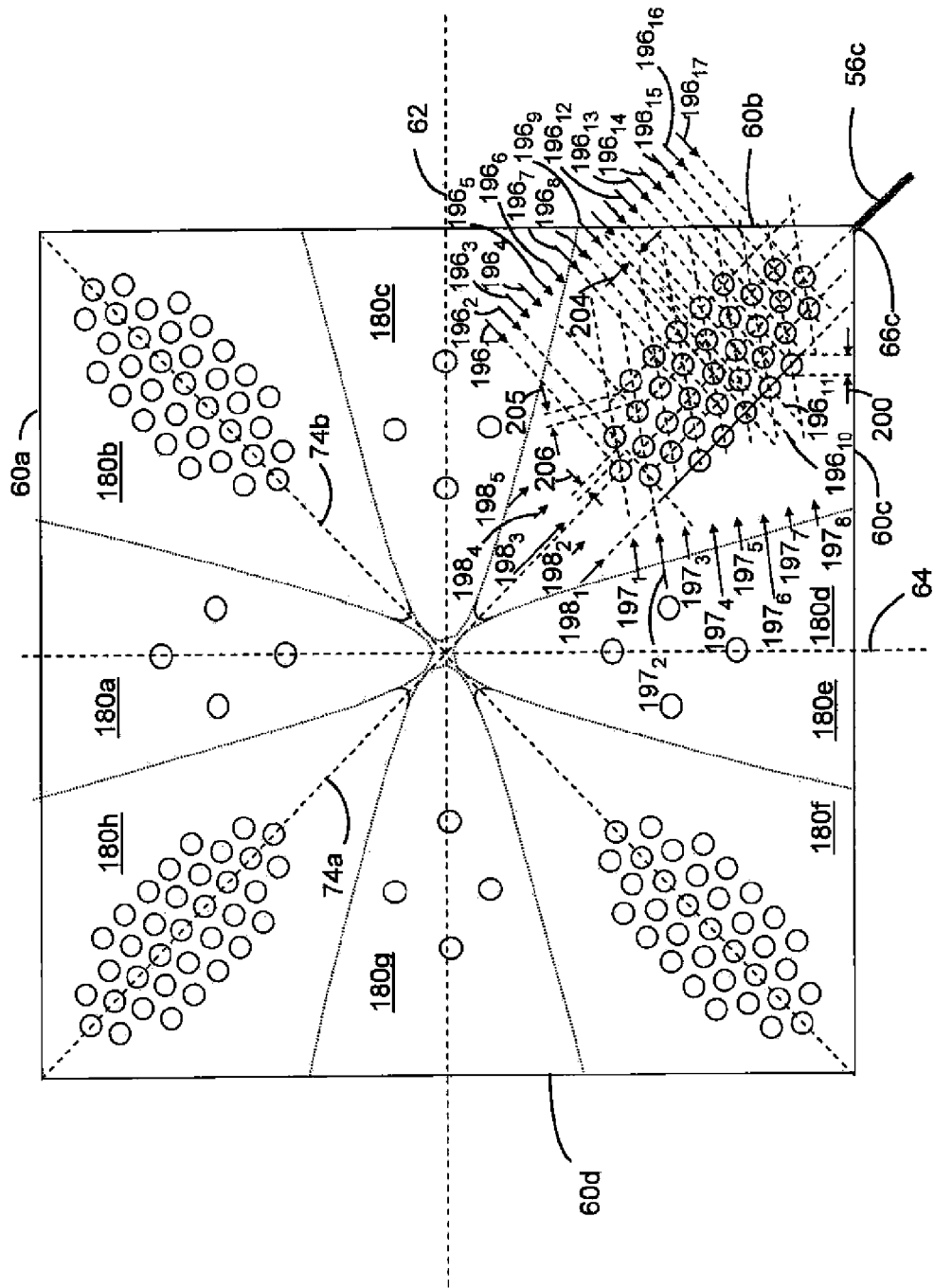
FIG. 3C is an enlarged schematic top view representation of one embodiment of a resonator mass of the MEMS resonator of FIG. 3B; in a stationary state.

FIG. 3B is a schematic top view representation of one embodiment of the MEMS resonator of FIG. 3A. With reference to FIG. 3B, in this embodiment, resonator mass 52 includes a first plurality of regions, e.g., regions 182, 184, 186, and a second plurality of regions 94, each of which has a density that is less than the density of the first plurality of regions. In the illustrated embodiment, each of the second plurality of regions 94 comprises an opening that extends through the resonator mass 52.

FIG. 3B is an enlarged schematic top view representation of one embodiment of the MEMS resonator mass 52 of FIG. 3A. With reference to FIG. 3B, one or more of the second plurality of regions 94 are disposed in each of the "less stiff" sections. One, some or all of the second plurality of regions disposed in a "less stiff" section may be arranged in a plurality of rows and columns. For example, the second plurality of regions, e.g., openings, disposed in "less stiff" section 180d, are disposed in rows $196_1$-$196_{17}$ (and/or rows $197_1$-$197_8$) and columns $198_1$-$198_5$. One of such columns, for example, column $198_3$, is disposed on a respective diagonal, i.e., diagonal 74a, of the resonator mass 52. Other columns, e.g., columns $198_1$, $198_2$, $198_4$, $198_5$, may be disposed parallel to the respective diagonal. The rows, for example, rows $196_1$-$196_{17}$, may be disposed perpendicular to the respective diagonal of resonator mass 52.

In the illustrated embodiment, each of the second plurality of regions 94 has a circular or at least generally circular cross section having a width or diameter 200. Adjacent rows of openings 94 may be spaced apart by a distance 204 (and/or a distance 205). Adjacent columns of openings 94 may be spaced apart by a distance 206.

In some embodiments, the width or diameter of one some or all openings 94 is less than the distance 204 (and/or distance 205) between adjacent rows of openings and/or less than the distance 206 between adjacent columns of openings 94. In some embodiments, the width or diameter 200 of one some or all openings is at least ½ the distance 204 (and/or distance 205) between adjacent rows of openings and/or at least ½ the distance 206 between adjacent columns of openings 94. In some embodiments, the width or diameter 200 of one, some or all openings is greater than or equal to the distance 204 (and/or distance 205) between adjacent rows of openings and/or greater than or equal to the distance 206 between adjacent columns of openings 94.

As stated above, the second plurality of regions, e.g., openings 94, decrease the stiffness in one or more directions, at one or more positions of resonator mass 52. In the illustrated embodiment, for example, the second plurality of regions, e.g., openings 94, in "less stiff" section 180b decrease the stiffness of "less stiff" section 180b in the first and second directions 62a, 62b, in the third and fourth directions 64a, 64b, and/or along diagonal 74b. The second plurality of regions, e.g., openings 94, in "less stiff" section 180d decrease the stiffness of "less stiff" section 180d in the first and second directions 62a, 62b, in the third and fourth directions 64a, 64b, and/or along diagonal 74a. The second plurality of regions, e.g., openings 94, in "less stiff" section 180f decrease the stiffness of "less stiff" section 180f in the first and second directions 62a, 62b, in the third and fourth directions 64a, 64b, and/or along diagonal 74b. The second plurality of regions, e.g., openings 94, in "less stiff" section 180h decrease the stiffness of "less stiff" section 180h in the first and second directions 62a, 62b, in the third and fourth directions 64a, 64b, and/or along diagonal 74a.

The magnitude of the decrease in stiffness is a function of position. In the illustrated embodiment, the greatest decrease is in the area of the column of openings 94 having the greatest number of openings 94 and/or the greatest amount of open space, i.e., third column $198_3$ (the column disposed on the respective diagonal, i.e., diagonal 74a, of the resonator mass 52). The second greatest decrease is in the area of the column of openings 94 having the second greatest number of openings 94 and/or the second greatest amount of open space, i.e., the second column $198_2$ and the fourth column $198_4$. The third greatest decrease is in the area of the column of openings 94 having the third greatest number of openings 94 and/or the third greatest amount of open space, i.e., the first column $198_1$ and the fifth column $198_5$. The third (or least) greatest decrease is in the area of the row of openings 94 having the third (or least) greatest number of openings 94 and/or the third (or least) greatest amount of open space, i.e., the third row $96_3$ (the row third closest to the elongated outer region 82 and third closest to the center 72).

As stated above, in operation, the two drive electrodes, e.g., first and second electrodes 138a, 138b, receive a differential excitation signal D+, D− via signal lines 142a, 142b, respectively. The excitation signal induces a time varying electrostatic force that causes the resonator mass 52 to oscillate. As further described below, resonator mass 52 oscillates in plane, in a bulk acoustic mode or substantially bulk acoustic mode, rather than in a bending mode. In some embodiments, the oscillation is linear or substantially linear, i.e., described by linear, stationary differential equations of motion. In some embodiments, resonator 50 has a high "Q" (quality factor), and as a result, the shape of resonator mass 52 during oscillation depends primarily on the characteristics of the resonator mass 52.

Figure 3D:
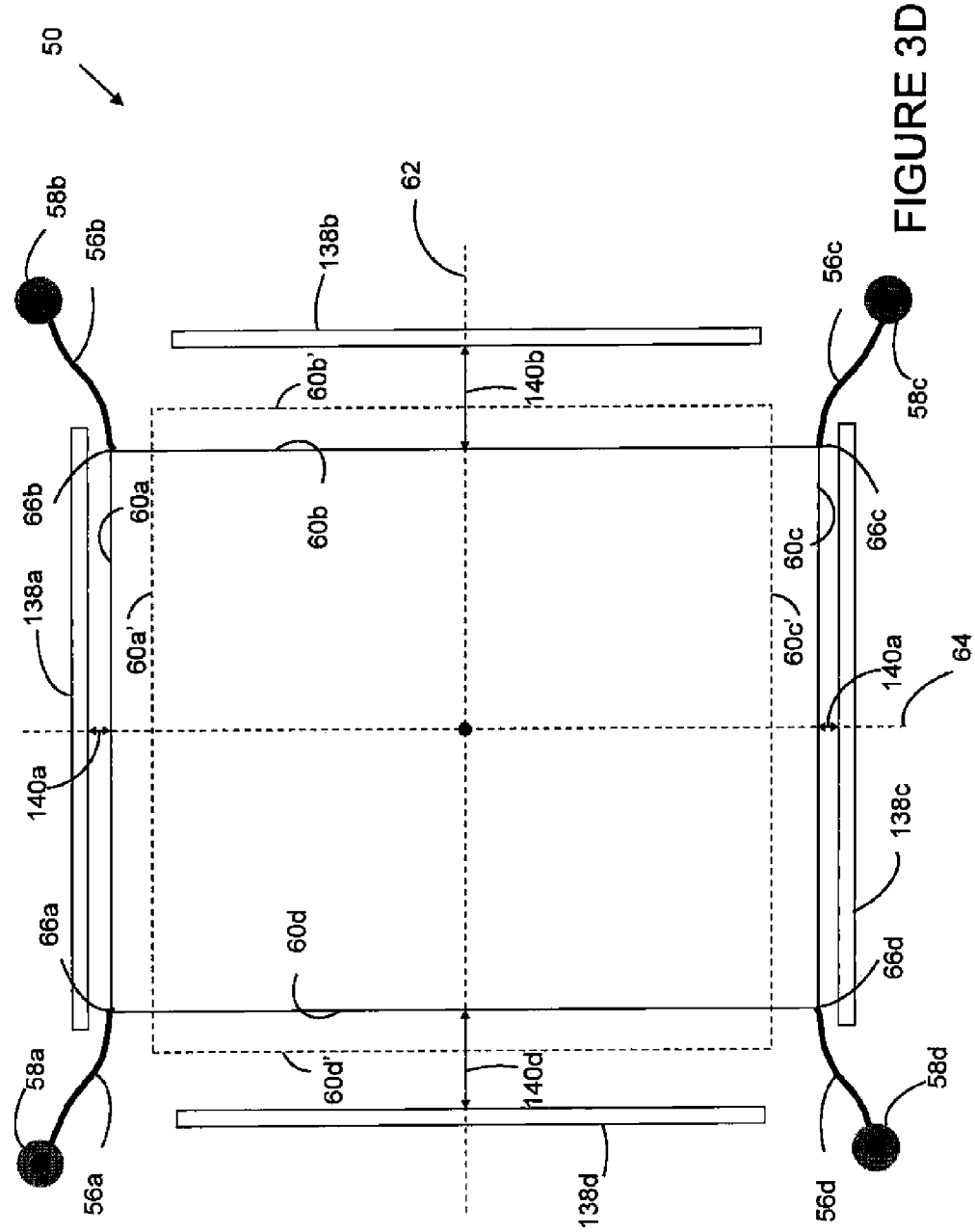
FIG. 3D is a schematic top view representation illustrating the outline of the resonator mass and anchors of the resonator of FIG. 3A, with the resonator in the first state of oscillation, and a schematic top view representation illustrating the outline of the resonator mass in the stationary state.

With reference to FIG. 3D, in a first phase of oscillation, the resonator mass 52 (i) contracts in the first and second directions 62a, 62b and (ii) expands in the third and fourth directions 64a, 64b, resulting in a first state for resonator mass 52. For comparison, dotted lines 60a'-60d' show the shape and position, of surfaces 60a-60d, respectively, in the at rest state. The contraction in first and second directions 62a, 62b causes an increase in the size of the second and fourth gaps 140b, 140d. The expansion in the third and fourth directions 64a, 64b causes a decrease in the size of the first and third gaps 140a, 140c.

The contraction in first and second directions 62a, 62b and the expansion in third and fourth directions 64a, 64b each more uniform than if all regions of the resonator mass 52 had the same stiffness. Thus, for example, ends of outer surfaces 60a-60d exhibit more movement in third, second, fourth and first directions, respectively, than the amount of movement that would be exhibited if all regions of the resonator mass 52 had the same stiffness. Thus, the movement exhibited at ends of outer surfaces 60a-60d matches the movement at midpoints of outer surfaces 60a-60 more closely than if all regions of the resonator mass 52 had the same stiffness. In some embodiments, the amount of movement exhibited at ends of outer surfaces 60a-60d is at least one half (½) the amount of movement exhibited at the midpoint of the outer surfaces 60a-60d, respectively.

In some embodiments, one or more of the outer surfaces 60a-60d (or at least a major portion thereof) are straight (or at least substantially straight) and/or parallel (or at least substantially parallel) to one or more of the outer surfaces 60a-60d in the at rest state. In the illustrated embodiment, for example, each of the outer surfaces 60a-60d includes a major portion 144a-144d, respectively, that is straight or at least substantially straight and parallel or at least substantially parallel to at least a portion of the respective outer surface in the at rest state. In addition, each outer surface 60a-60d is at least substantially straight overall and overall at least substantially parallel to the configuration of the respective outer surface in the at rest state.

Figure 3E:
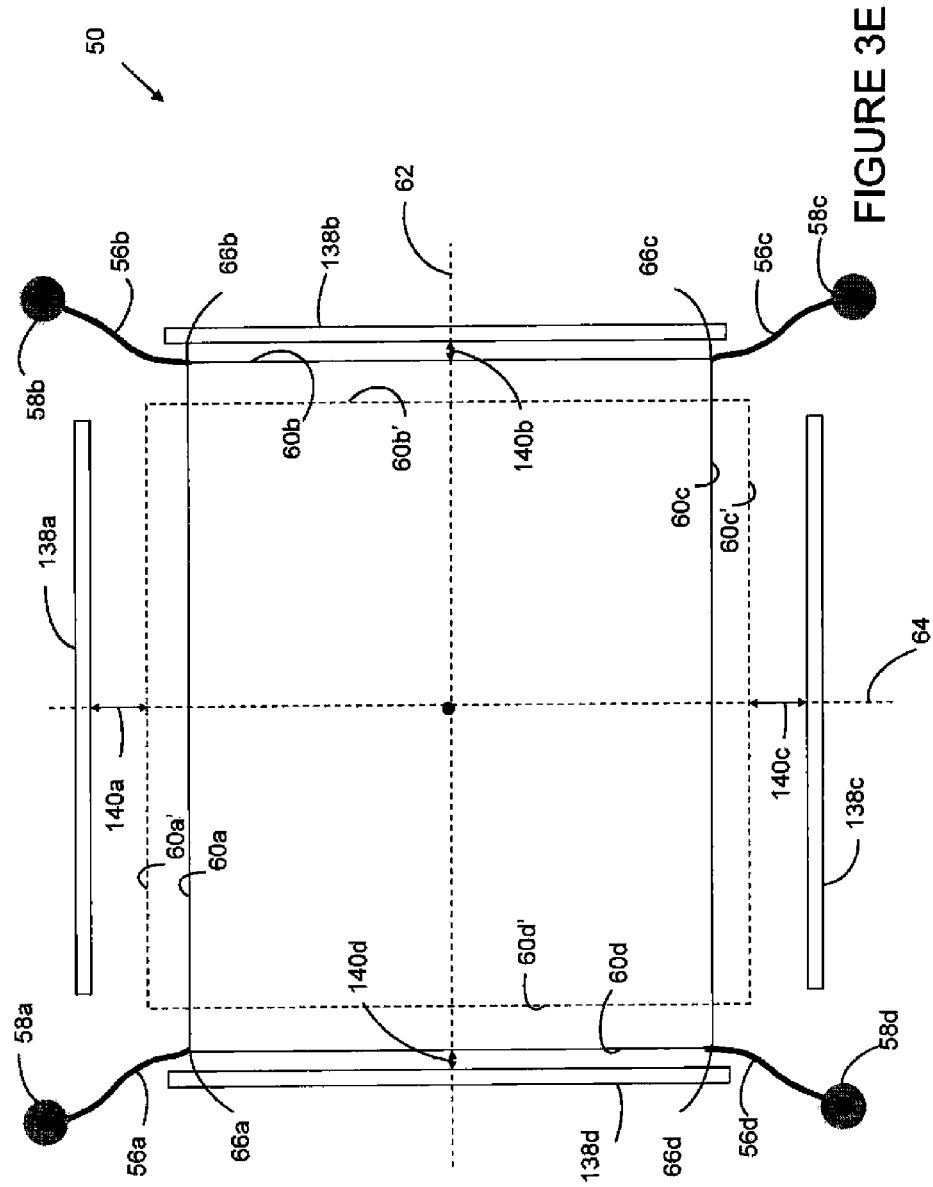
FIG. 3E is a schematic top view representation illustrating the outline of the resonator mass and anchors of the resonator of FIG. 3A, with the resonator in the second state of oscillation, and a schematic top view representation illustrating the outline of the resonator mass in the stationary state.

With reference to FIG. 3E, in a second phase of oscillation, the resonator mass 52 (i) expands in the first and second directions 62a, 62b and (ii) contracts in third and fourth directions 64a, 64b, resulting in a second state for resonator mass 52. For comparison, dotted lines 60a'-60d' show the shape and position, of surfaces 60a-60d, respectively, in the at rest state. The expansion in first and second directions 62a, 62b causes a decrease in the size of second and fourth gaps 140b, 140d. The contraction in third and fourth directions 64a, 64b causes an increase in the size of the first and third gaps 140a, 140c.

The expansion in first and second directions 62a, 62b and the contraction in third and fourth directions 64a, 64b each more uniform than if all regions of the resonator mass 52 had the same stiffness. For example, ends of outer surfaces 60a-60d exhibit more movement in fourth, first, third and second directions, respectively, than the amount of movement that would be exhibited if all regions of the resonator mass 52 had the same stiffness. Thus, the movement exhibited at ends of outer surfaces 60a-60d matches the movement at midpoints of outer surfaces 60a-60 more closely than if all regions of the resonator mass 52 had the same stiffness. In some embodiments, the amount of movement exhibited at ends of outer surfaces 60a-60d is at least one half (½) the amount of movement exhibited at the midpoint of the outer surfaces 60a-60d, respectively.

In some embodiments, one or more of the outer surfaces 60a-60d (or at least a major portion thereof) are straight (or at least substantially straight) and/or parallel (or at least substantially parallel) to one or more of the outer surfaces 60a-60d in the at rest state. In the illustrated embodiment, for example, each of the outer surfaces 60a-60d includes a major portion 146a-146d, respectively, that is straight or at least substantially straight and parallel or at least substantially parallel to at least a portion of the respective outer surface in the at rest state. In addition, each outer surface 60a-60d is at least substantially straight overall and overall at least substantially parallel to the configuration of the respective outer surface in the at rest state.

The oscillation results in a differential signal S+, S− indicative thereof, at sense electrodes, e.g., third and fourth electrodes 138c, 138d, and at signal lines 142c, 142d coupled thereto. The differential signal S+, S− may be, for example, in the form of a differential voltage and/or a differential current. For example, in the first phase of oscillation, the increase in the size of the fourth gap 140d causes a decrease in the magnitude of the fourth capacitance (i.e., defined by the fourth electrode 138d and resonator 52), which in turn causes an electrical current into or out of the fourth electrode 138d and a change in the voltage of the fourth electrode 138d in accordance therewith. The decrease in the size of the third gap 140c causes an increase in the magnitude of the third capacitance (i.e., defined by the third electrode 138c and resonator 52), which in turn causes an electrical current into or out of the third electrode 138c and a change in the voltage of the third electrode 138c in accordance therewith.

Similarly, in the second phase of oscillation, the decrease in the size of the fourth gap 140d causes an increase in the magnitude of the fourth capacitance (i.e., defined by the fourth electrode 138d and resonator 52), which in turn causes an electrical current into or out of the fourth electrode 138d and a change in the voltage of the fourth electrode in accordance therewith. The increase in the size of the third gap 140c causes a decrease in the magnitude of the third capacitance (i.e., defined by the third electrode 138c and resonator 52), which in turn causes an electrical current into or out of the third electrode 138c and a change in the voltage of the third electrode in accordance therewith.

The magnitude of the differential signal S+, S− depends at least in part, on the magnitude of the change in the third capacitance and the magnitude of the change in the fourth capacitance, i.e., the magnitude of capacitive transduction between the resonator 52 and the sense electrodes, e.g., third and fourth electrodes 138c, 138d, in each phase of oscillation.

As stated above, the movement exhibited at ends of outer surfaces 60a-60d matches the movement at midpoints of outer surfaces 60a-60 more closely than if all regions of the resonator mass 52 had the same stiffness. As a result, the magnitude of the change in the third capacitance and the magnitude of the change in the fourth capacitance are greater than would be exhibited if all regions of the resonator mass 52 had the same stiffness. As a result, the magnitude of the change in the third capacitance and the magnitude of the change in the fourth capacitance are greater than would be exhibited if all regions of the resonator mass 52 had the same stiffness. The increase in capacitive transduction causes an increase in the signal strength, the stability and/or the "Q" factor of the resonator 50.

Notably, the amount of expansion exhibited by the resonator mass in one state may or may not be equal to the amount of contraction exhibited by the resonator mass in such state and/or the amount of expansion or contraction exhibited by the resonator mass in another state.

A region may have any configuration (e.g., size, shape) and may or may not have the same configuration (e.g., size, shape) as any other region. Thus, the size and/or shape of one region may or may not be the same as the size and/or shape of any other regions. In some embodiments, for example, one, some or all regions have the same shape or at least substantially the same shape as one another. In some other embodiments, the shape of one, some or all regions is different from the shape of one or more other regions. The configuration of a region may be symmetrical, non symmetrical, or any combination thereof. Each region may or may not have a uniform density and/or stiffness throughout the entire region. Regions may be disposed in any type of arrangement including for example, a symmetrical arrangement, a non-symmetrical arrangement or any combination thereof.

The first plurality of regions may or may not have the same density as one another. In some embodiments, for example, each of the first plurality of regions has the same density as one another. In some other embodiments, one or more of the first plurality of regions has a density different than the density of one or more other regions of the first plurality of regions. Likewise, the second plurality of regions may or may not have the same density as one another. In some embodiments, for example, each of the second plurality of regions has the same density as one another. In some other embodiments, one or more of the second plurality of regions has a density different that the density of one or more other regions of the second plurality of regions.

Each of the second plurality of regions has a density that is less than the density of each region of the first plurality of regions by an amount greater than would result due to manufacturing tolerances associated with fabrication of such region of the first plurality of regions. In some embodiments, each of the second plurality of regions has a density that is less than the density of each region of the first plurality of regions by an amount greater than $\frac{1}{4}$ of the density of such region of the first plurality of regions, more preferably less than the density of each region of the first plurality of regions by an amount greater than $\frac{1}{2}$ of the density of such region of the first plurality of regions.

If one or more opening are employed, such opening(s) may have any configuration (e.g., shape, size). The shape of an opening may be symmetrical, non symmetrical, or any combination thereof. Moreover, the shape of one opening may or may not be the same as the shape of any other openings. In some embodiments, for example, all of openings have the same shape or at least substantially the same shape as one another. In some other embodiments, the shape of one opening is different from the shape of one or more other openings. Thus, in some embodiments, openings 94 may be cylindrical, for example, as shown, and/or rectangular, and/or may be similar to one another, for example, as shown, but are not limited to such. An opening 94 may extend partially or entirely through the height/thickness of resonator mass 52. Moreover, one or more openings may extend partially through resonator mass 52 and one or more other openings may extend entirely through resonator mass 52.

Openings may be disposed in any type of arrangement including for example, a symmetrical arrangement, a non-symmetrical arrangement or any combination thereof. Thus, the openings may or may not be arranged in a pattern.

A section, e.g., sections 80a-80d, of resonator mass 52 may also have any configuration (e.g., size, shape) and may or may not have the same configuration (e.g., size, shape) as any other section. The configuration of a section may be symmetrical, non symmetrical, or any combination thereof. Each section may or may not have a uniform density and/or stiffness throughout the entire section.

Sections may be disposed in any type of arrangement including for example, a symmetrical arrangement, a non-symmetrical arrangement or any combination thereof.

Resonator mass 52 may or may not have a symmetrical configuration. Indeed, the resonator mass 52 may have any configuration (e.g., size, shape, structure) to provide the resonator mass 52 with desired oscillation mode or modes.

Although the contour of outer surfaces 60a-60d of resonator mass 52 are shown straight, any contour or contours may be employed. For example, outer surface(s) of resonator mass 52 may be straight, curved, piecewise linear, piecewise curved, irregular and/or any combination thereof. In some embodiments, one or more outer surfaces of resonator mass 52 have a contour that corresponds with the contour of one or more electrodes associated therewith. In some embodiments, resonator mass 52 does not include corners 66a-66d. In some such embodiments, outer surfaces 60a-60d may be connected to one another via one or more curved sections.

Moreover, although the resonator mass 52 is illustrated as having a substantially rectangular shape, other shapes may be employed. Notably, the resonator mass 52 may include fewer than four outer surfaces or sides or more than four outer surfaces or sides. Indeed, the resonator mass 52 may take any geometric shape, whether now know or later developed, for example, but not limited to, rectangular, circular and/or elliptical.

The configuration (e.g., size, shape, structure) of the resonator mass 52 may determine one or more resonant frequencies of MEMS resonator 50.

In some embodiments, MEMS resonator mass 52 has a relatively stable or fixed center of gravity during oscillation. For example, the center of resonator mass 52 may undergo little or no movement as the resonator mass 52 oscillates between the first and second states. In this way, the resonator mass 52 may help reduce and/or minimize energy loss within resonator 50 and thereby help provide the resonator 50 with a higher Q-factor.

Electrodes, e.g., electrodes 138a-138d, may be employed in a differential drive and sense configuration (e.g., as described above), a single ended drive and sense configuration and/or any other configuration.

Figure 4A:
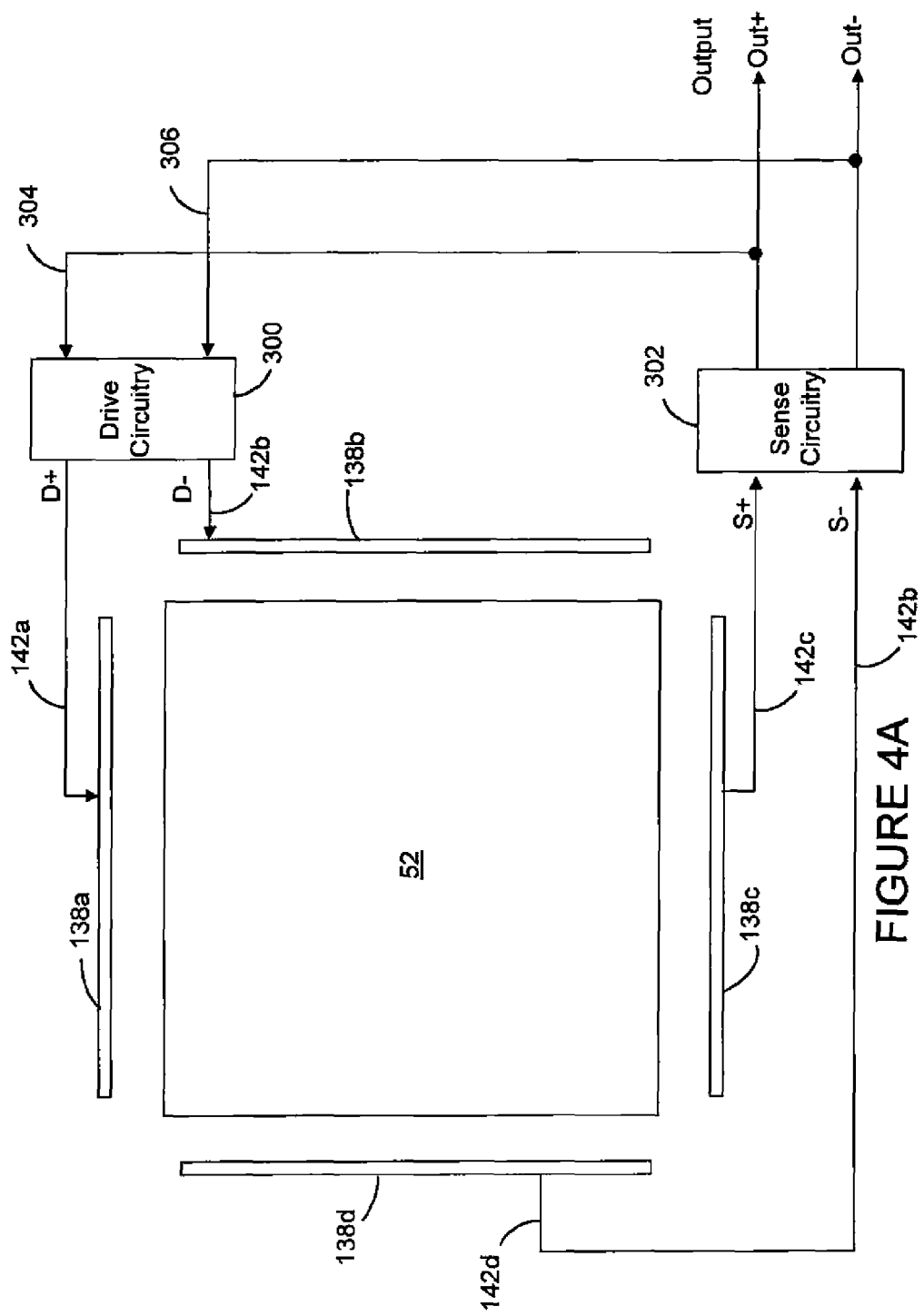
FIG. 4A is a schematic top view representation of one embodiment of a resonator mass and electrodes of a resonator according to certain aspects of the present invention, in conjunction with a schematic block diagram of one embodiment of drive circuitry and sense circuitry that may be employed therewith, according to certain aspects of the present invention.

With reference to FIG. 4A, in one embodiment that employs a differential drive and sense configuration, drive electrodes, e.g., electrodes 138a, 138b, are electrically connected to differential drive circuitry 300 and receive a differential drive signal D+, D− therefrom. For example, electrode 138a may receive drive signal D+ from the differential drive circuitry via signal line 142a. Electrode 138b may receive drive signal D− from the differential drive circuitry via signal line 142b.

Sense electrodes, e.g., electrodes 138c, 138d, are electrically connected to differential sense circuitry 302 and provide a differential sense signal S+, S− that is supplied thereto. For example, sense electrode 138c provides a sensed signal S+, which is supplied to differential sense circuitry 302 via signal line 142c. Sense electrode 138d may provide sensed signal S−, which is supplied to differential sense circuitry 302 via signal line 142d.

In operation, differential drive circuitry 300 generates a differential drive signal D+, D−, which is supplied to drive electrodes, e.g., electrodes 138a, 138b, for example as described above, to induce a time varying electrostatic force that causes the resonator mass 52 to oscillate (e.g., in plane) at one or more resonant frequencies.

As stated above, in this embodiment, the resonator oscillates in a bulk or substantially bulk mode, rather than in a bending mode. The oscillation may be linear or substantially linear, e.g., described by linear, stationary differential equations of motion. Each resonator 122 may have a high "Q" (quality factor), and as a result, the shape of resonator 122 during oscillation may depend primarily on the characteristics of the resonator 122. In some other embodiments, other types of oscillation may be employed.

Sense electrodes, e.g., electrodes 138c, 138d, provide a differential sensed signal S+, S−, representative of the oscillation exhibited by the resonator mass 52. Any suitable structure and/or technique may be employed in providing the differential sensed signal S+, S−. As described above, some embodiments employ capacitive transduction (e.g., changes in capacitance between resonator mass 52 and sense electrodes 138c, 138d during oscillation) to provide the differential sensed signal S+, S−.

The differential sensed signal S+, S− is supplied to differential sense circuitry 302, which senses, samples and/or detects the sensed signal S+, S− and generates a differential output signal Out+, Out− in response thereto. The differential output signal Out+, Out−, may be, for example, a clock signal having a frequency equal to the frequency of one or more of the resonant frequencies of the oscillation exhibited by the resonator mass 52.

The differential output signal Out+, Out− may be supplied via signal lines 304, 306 to the differential drive circuitry 302, which may generate the differential drive signals D+, D− in response thereto, thereby closing the electronic oscillator loop. In this regard, it is desirable for the differential drive signal D+, D− to be suitable to stimulate/drive the desired mode of oscillation.

In some embodiments, differential drive circuitry 300 is configured to provide a differential drive signal D+, D−, wherein signal D+ and signal D− are 180 degrees out of phase or substantially 180 degrees out of phase, and drive electrodes, e.g., electrodes 138a, 138b, are configured and positioned such that the differential drive signal D+, D− supplied thereto results in one or more electrostatic forces that causes the resonator mass 52 to oscillate in the plane of the resonator mass 52.

In some embodiments, sense electrodes, e.g., electrodes 138c, 138d, are configured and positioned to provide, in response to the oscillation of resonator mass 52, a differential sense signal S+, S−, wherein signal S+ and signal S− are 180 degrees out of phase or substantially 180 degrees out of phase, and differential sense circuitry 302 is configured to receive the differential sense signal S+, S− and provide, in response thereto, a differential output signal Out+, Out−, wherein signal Out+ and signal Out− are 180 degrees out of phase or substantially 180 degrees out of phase.

Implementing a differential signal configuration may facilitate canceling, limiting, reducing and/or minimizing the effect of capacitive coupling from the drive electrodes, e.g., electrodes 138a, 138b, to the sense electrodes, e.g., electrodes 138c, 138d. In addition, a fully differential signaling configuration may also significantly decrease any sensitivity to electrical and/or mechanical noise coupled from the substrate 54. Further, implementing resonator 50 with a differential signaling configuration may also eliminate, minimize and/or reduce charge flow through the anchor(s), e.g., anchors 58a-58d, to and from the resonator 50. As such, a voltage drop between the anchor(s), e.g., anchors 58a-58d, and drive and sense electrodes, e.g., electrodes 138a-138d, may be avoided. Notably, this voltage drop could degrade or adversely impact the electric transfer function of the resonator 50 especially at higher frequencies (for example, frequencies greater than 100 MHz).

Figure 4B:
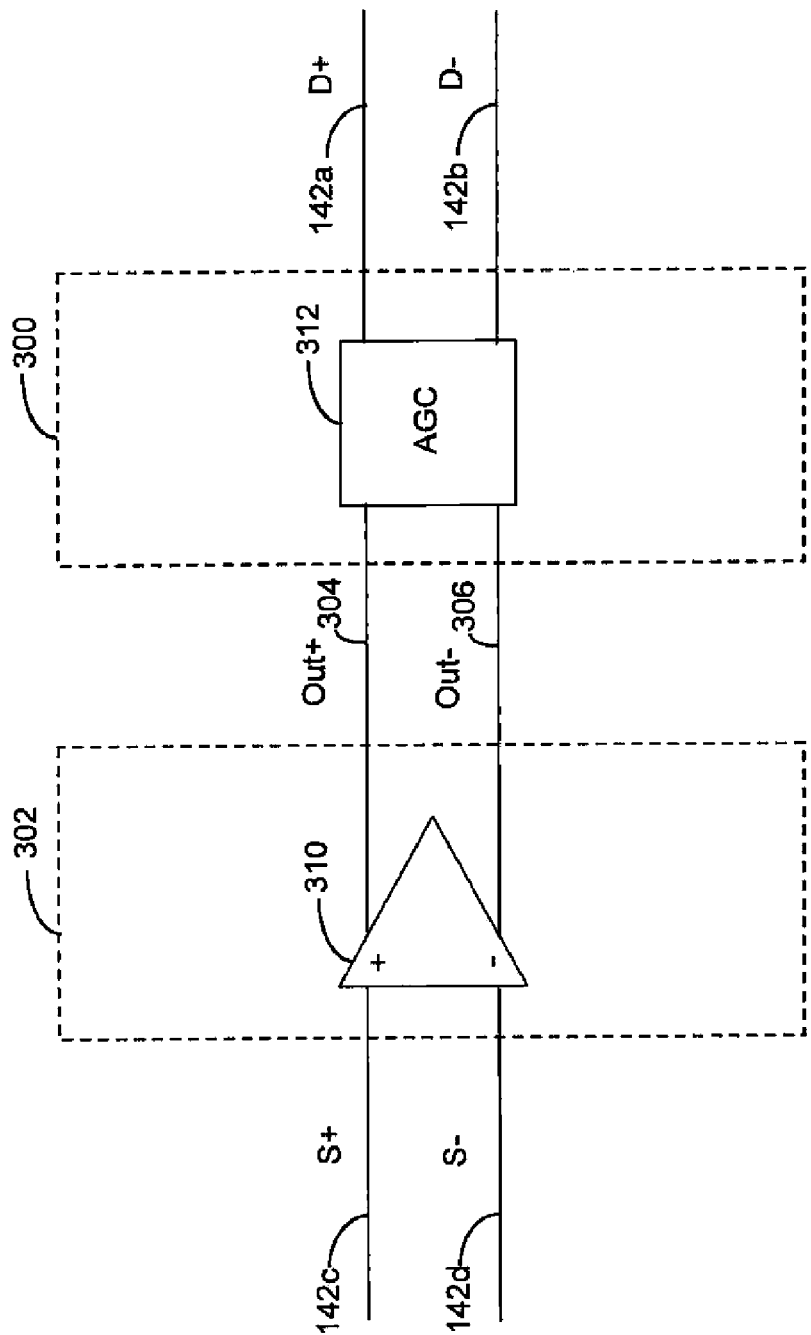
FIG. 4B is schematic block diagram of one embodiment of the sense circuitry and drive circuitry of FIG. 4A, according to certain embodiments of the present inventions.

FIG. 4B illustrates one embodiment of the sense circuitry 302 and the drive circuitry 300. In this embodiment, sense circuitry 302 includes a differential amplifier 310. Drive circuitry 300 includes automatic gain control circuitry 312. The differential amplifier 310 of the sense circuitry 302 receives the differential sense signal S+, S− and provides a differential output signal Out+, Out− in response thereto. The differential output signal Out+, Out− of the differential amplifier 310 is supplied via the signal lines 304, 306 to the automatic gain control circuitry 312 of the drive circuitry 300, which provides the differential drive signal D+, D− in response thereto.

It should be noted that there are many other configurations and/or architectures of the sense and drive electrodes and/or sense and drive circuitry that cause or induce resonator 50 to resonate and thereby generate and/or produce output signals. All such configurations and/or architectures are intended to fall within the scope of the present invention.

The MEMS resonator 50 of the present inventions may employ any sense and drive structure, technique, configurations and/or architectures whether now known or later developed. In some embodiments, drive circuitry 300 and sense circuitry 302 are conventional well-known drive and sense circuitry and/or conventional drive and sense electrodes, respectively. However, drive circuitry 300 and/or sense circuitry 302 may be any type of circuitry (whether or not disposed on and/or integrated on the same substrate in which resonator 50 resides (or is fabricated in)), and all such circuitry, whether now known or later developed, are intended to fall within the scope of the present invention.

The drive circuitry 300 and/or sense circuitry 302 may be disposed on or and/or integrated on the same substrate in which the MEMS resonator structure resides (or is fabricated in). In addition thereto, or in lieu thereof, drive circuitry 300 and/or sense circuitry 302 may be disposed on and/or integrated on a substrate that is physically separate from (and electrically interconnected with) the substrate in which the MEMS resonator structure resides.

The drive and sense electrodes, e.g., electrodes 138a-138d, may be of a conventional, well known type or may be any type and/or shaped electrode whether now known or later developed. For example, there are many other configurations and or architectures of the sense and drive electrodes that cause resonator 50 to generate and/or produce output signals that are (or are substantially) 180 degrees out of phase, and in which the driving electrodes induce or cause motion in the plane of MEMS resonator 50 and the sensing electrodes sense/measure that motion.

Further, the physical electrode mechanisms may include, for example, capacitive, piezoresistive, piezoelectric, inductive, magnetorestrictive and thermal. Indeed, all physical electrode mechanisms whether now known or later developed are intended to fall within the scope of the present invention.

As stated above, drive electrodes and sense electrodes, e.g., electrodes 138a-138d, may be of any number and design (e.g., size, shape, type), whether now known or later developed. In some embodiments, the number and length of drive electrodes and/or sense electrodes may be selected in order to optimize, enhance and/or improve the operation of the MEMS resonator. For example, in one embodiment, the number of sense electrodes, and the cross-sectional sense electrode-resonator mass interface, is increased in order to increase the signal provided to sense circuitry (for example, the single ended or differential sense circuitry).

In some embodiments, drive electrodes, e.g., electrodes 138a, 138b, and sense electrodes, e.g., electrodes 138c, 138d, are fabricated without an additional or extra mask(s). For example, in some embodiments, a rectangular and/or square shaped resonator mass 52, drive electrodes, e.g., electrodes 138a, 138b, and sense electrodes, e.g., electrodes 138c, 138d, are fabricated contemporaneously.

In some embodiments, drive electrodes, e.g., electrodes 138a, 138b, sense electrodes, e.g., electrodes 138c, 138d, and the resonator mass 52 are symmetrically configured and employed in conjunction with a MEMS resonator 50 having a symmetrical resonator mass 52. Such embodiment may help manage, minimize and/or reduce stress on one or more portions of the resonator mass 52, anchors, e.g., anchors 58a-58d, and/or the substrate 54. In such embodiment, the center 72 of resonator mass 52 may be a low stress point. In such embodiments, if resonator mass 52 is anchored at center 72 (e.g., rather than through corners 66a-66d), energy loss of MEMS resonator 50 may be further minimized, reduced and/or eliminated.

In some embodiments, MEMS resonator 50 is configured in a single ended configuration that provides a single ended drive signal, a single ended sense signal and/or a single ended output signal.

Figure 4C:
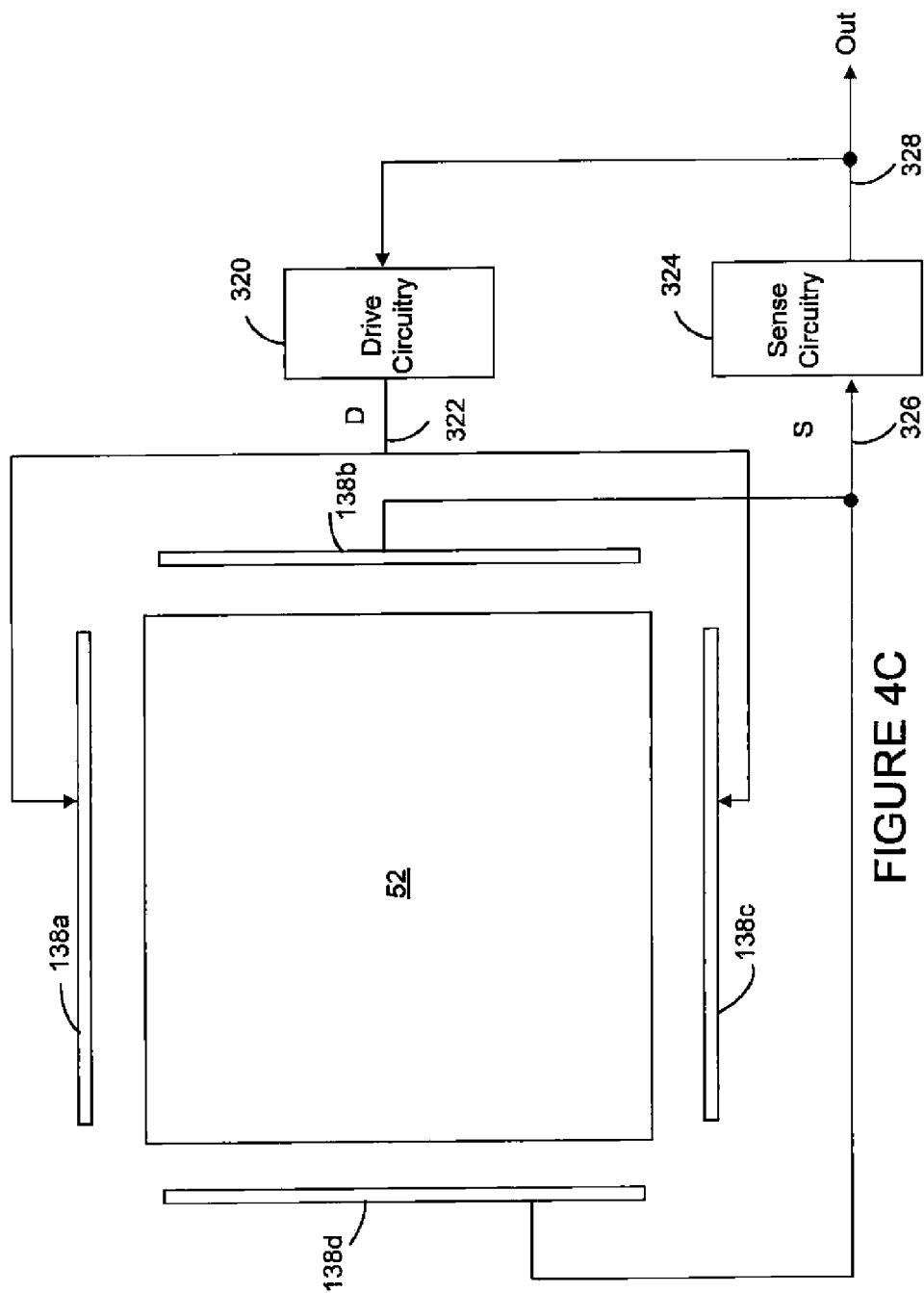
FIG. 4C is a schematic top view representation of one embodiment of a resonator mass and electrodes of a resonator according to certain aspects of the present invention, in conjunction with a schematic block diagram of another embodiment of drive circuitry and sense circuitry that may be employed therewith, according to certain aspects of the present invention.

With reference to FIG. 4C, in one embodiment that employs a single ended drive and sense configuration, two electrodes, e.g., electrodes 138a, 138c, are employed as drive electrodes and two electrodes, e.g., electrodes 138b, 138d, are employed as sense electrodes. Drive electrodes, e.g., electrodes 138a, 138c, are electrically connected to single ended drive circuitry 320 and receive a drive signal D therefrom. For example, drive electrodes, e.g., electrodes 138a, 138c, may receive the drive signal D from the drive circuitry via signal line 322. Sense electrodes, e.g., electrodes 138b, 138d, are electrically connected to single ended sense circuitry 324 and provide a sense signal S thereto. For example, sense electrodes, e.g., electrodes 138b, 138d, may provide sensed signal S, which may be supplied to sense circuitry 324 via a signal line 326.

In operation, drive circuitry 320 generates the single ended drive signal D, which is supplied to drive electrodes, e.g., electrodes 138a, 138c, to induce a time varying electrostatic force that causes the resonator mass 52 to oscillate (e.g., in plane) at one or more resonant frequencies. Sense electrodes, e.g., electrodes 138b, 138d, provide single ended sensed signal S, representative of the oscillation exhibited by the resonator mass 52. Any suitable structure and/or technique may be employed in providing the sensed signal S. Some embodiments employ capacitive transduction (e.g., changes in capacitance between resonator mass 52 and one or more sense electrodes, e.g., sense electrodes 138b, 138d, during oscillation of resonator mass 52) to provide the sensed signal S.

The sensed signal S is supplied to sense circuitry 324, which senses, samples and/or detects the sensed signal S and generates an output signal Out in response thereto.

The output signal Out may be, for example, a clock signal having a frequency equal to one or more of the one or more resonant frequencies of the oscillation exhibited by the resonator mass 52.

The output signal Out may be supplied via signal line 328 to the drive circuitry 320, which may generate the drive signal D in response thereto, thereby closing the electronic oscillator loop. In this regard, it is desirable for the drive signal D- to be suitable to stimulate/drive the desired mode of oscillation.

Figure 4D:
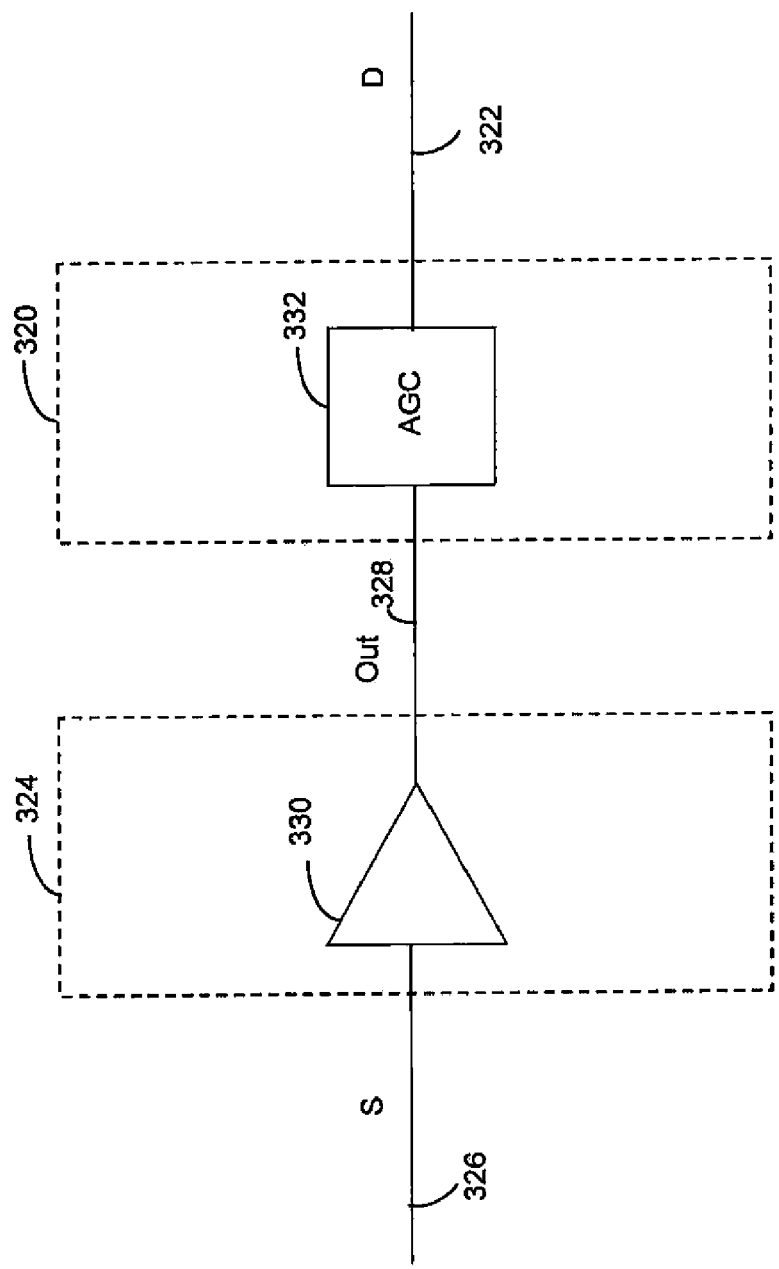
FIG. 4D is schematic block diagram of an embodiment of the sense circuitry and drive circuitry of FIG. 4C, according to certain embodiments of the present inventions.
Figure 5A:
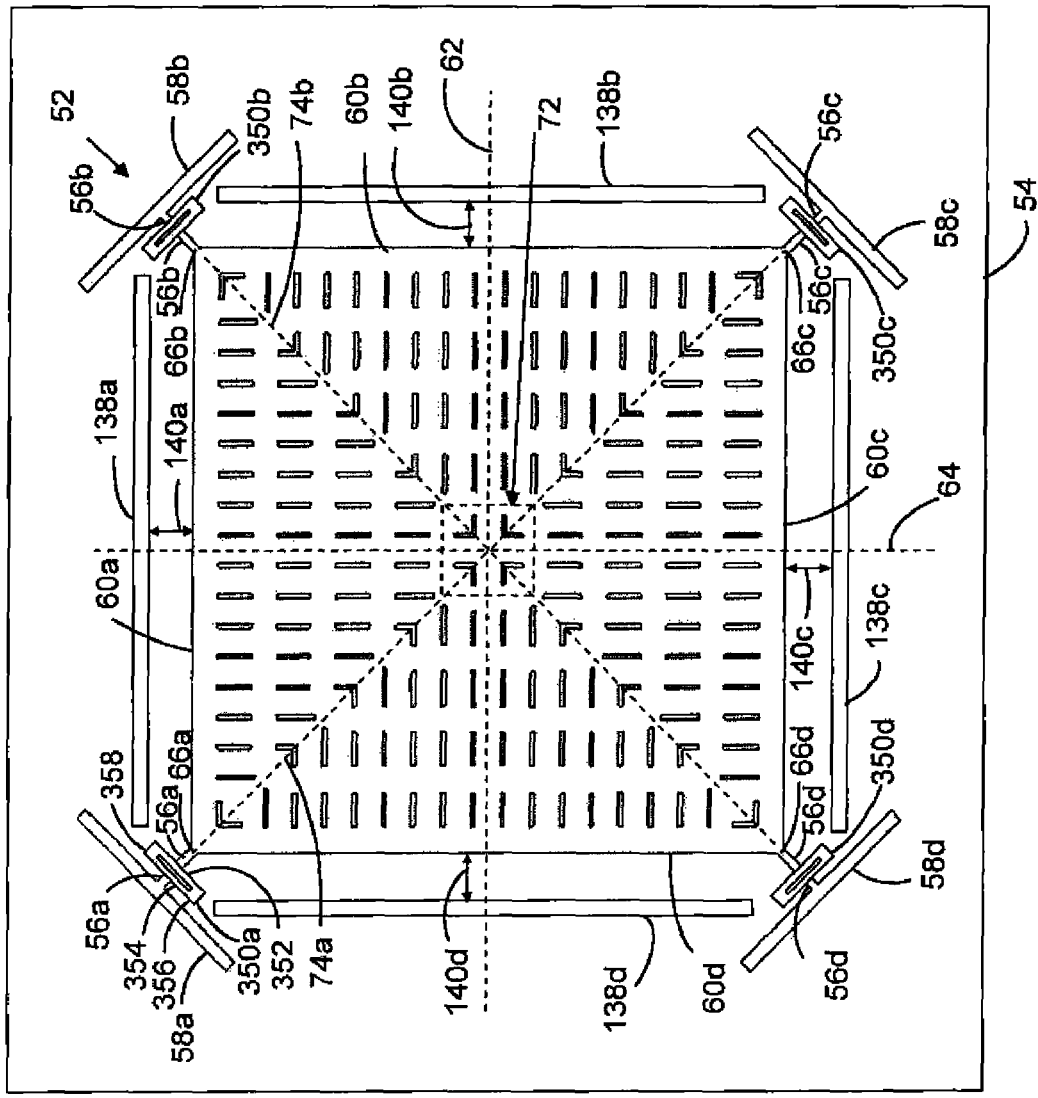
FIG. 5A is a schematic top view representation of a resonator in a stationary state, in accordance with another embodiment of the present invention.
Figure 5B:
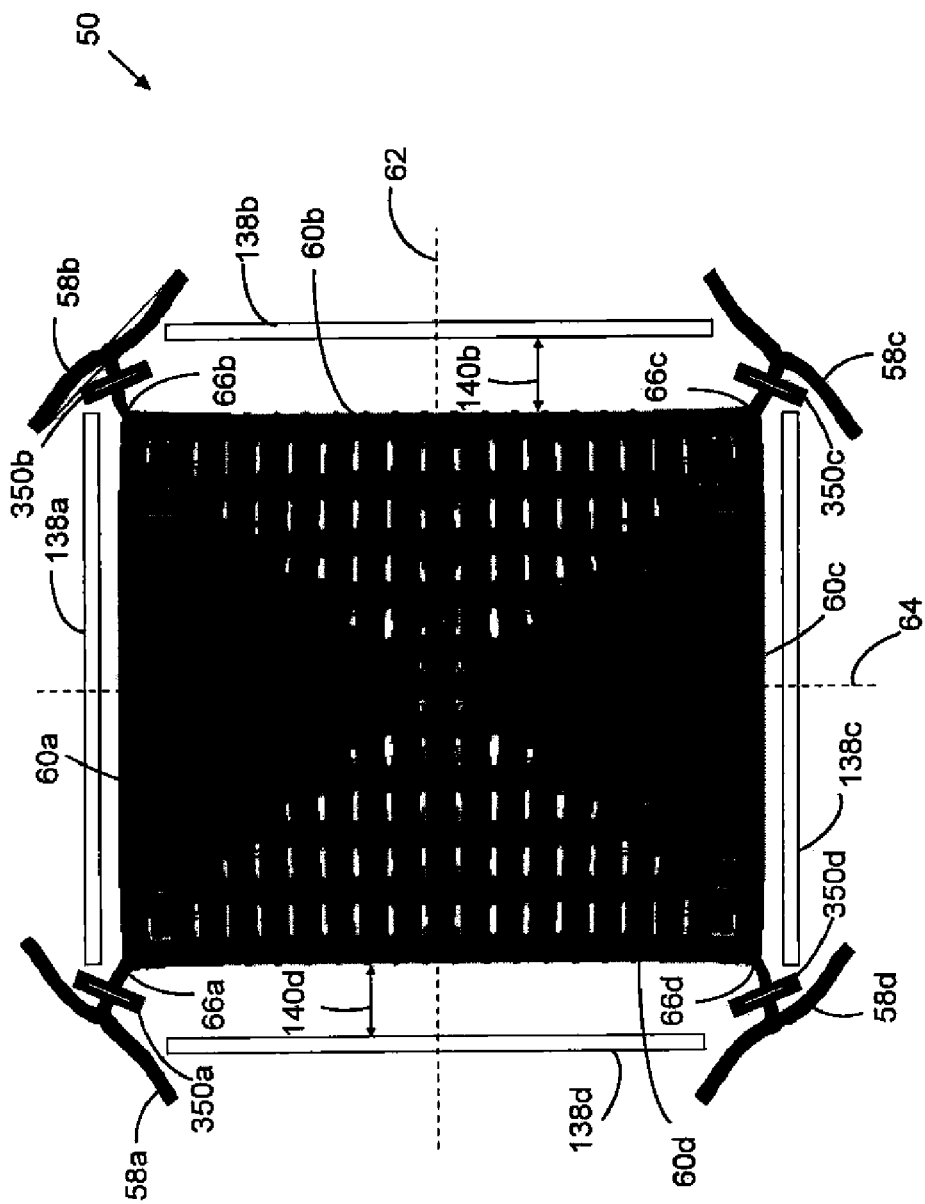
FIG. 5B is a schematic top view representation of the resonator of FIG. 5A in a first state of oscillation.
Figure 5C:
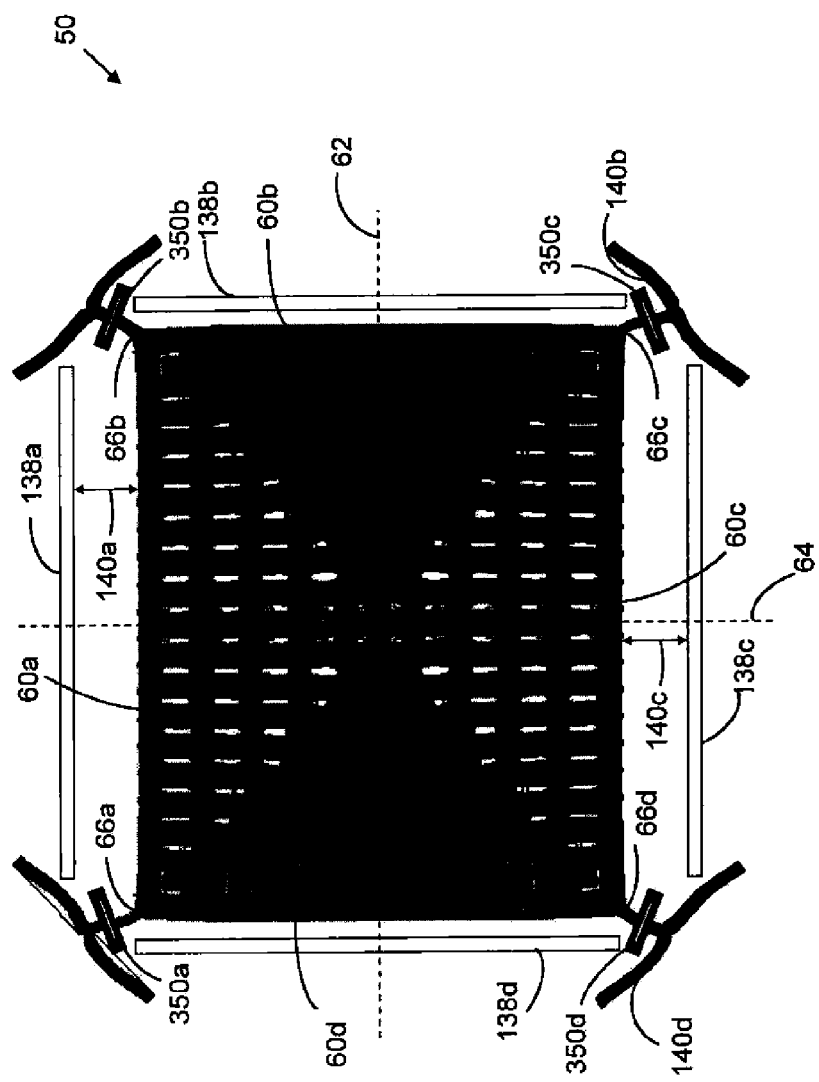
FIG. 5C is a schematic top view representation of the resonator of FIG. 5A in a second state of oscillation.
Figure 6A:
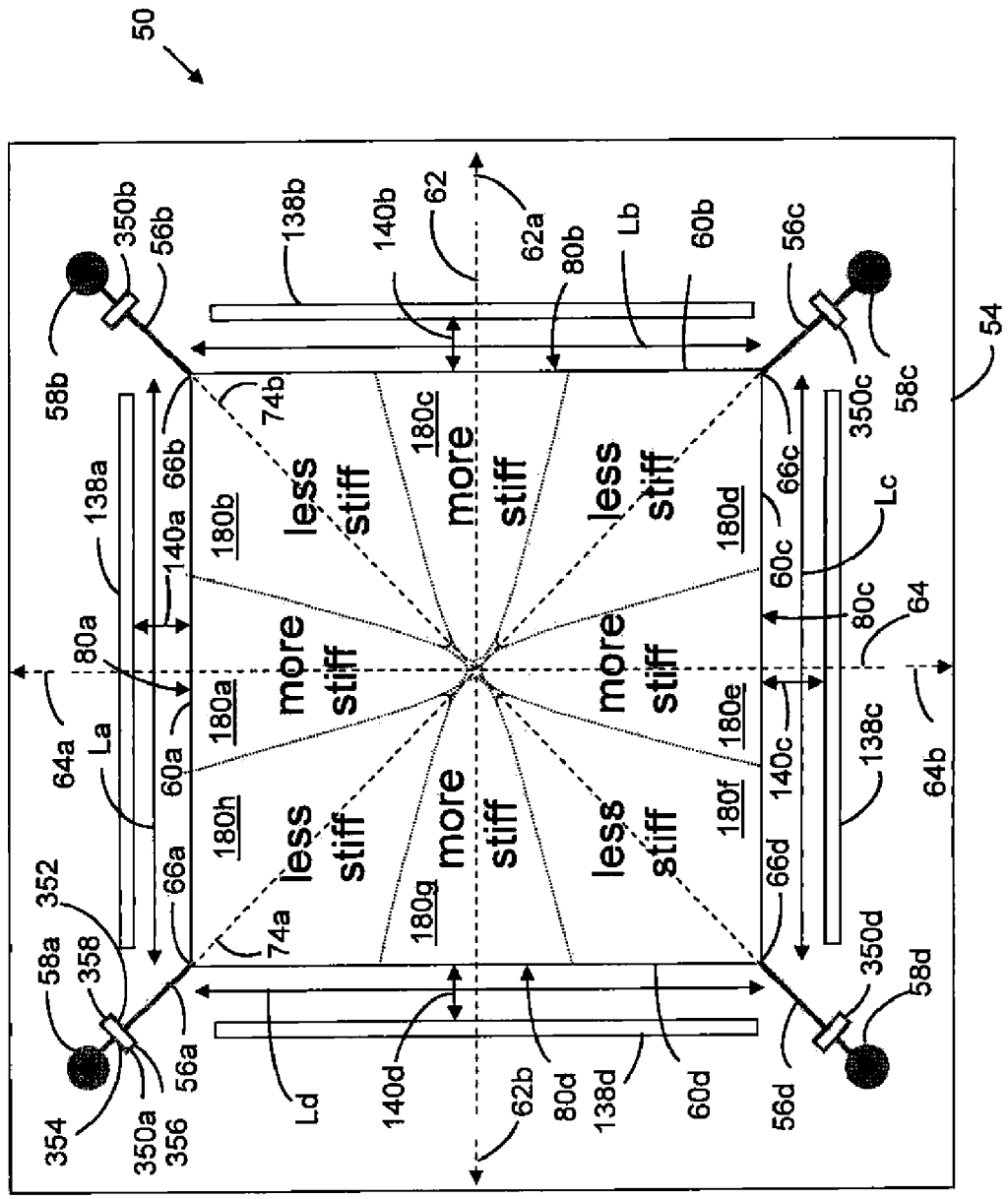
FIG. 6A is a schematic top view representation of a resonator in a stationary state, in accordance with another embodiment of the present invention.
Figure 6B:
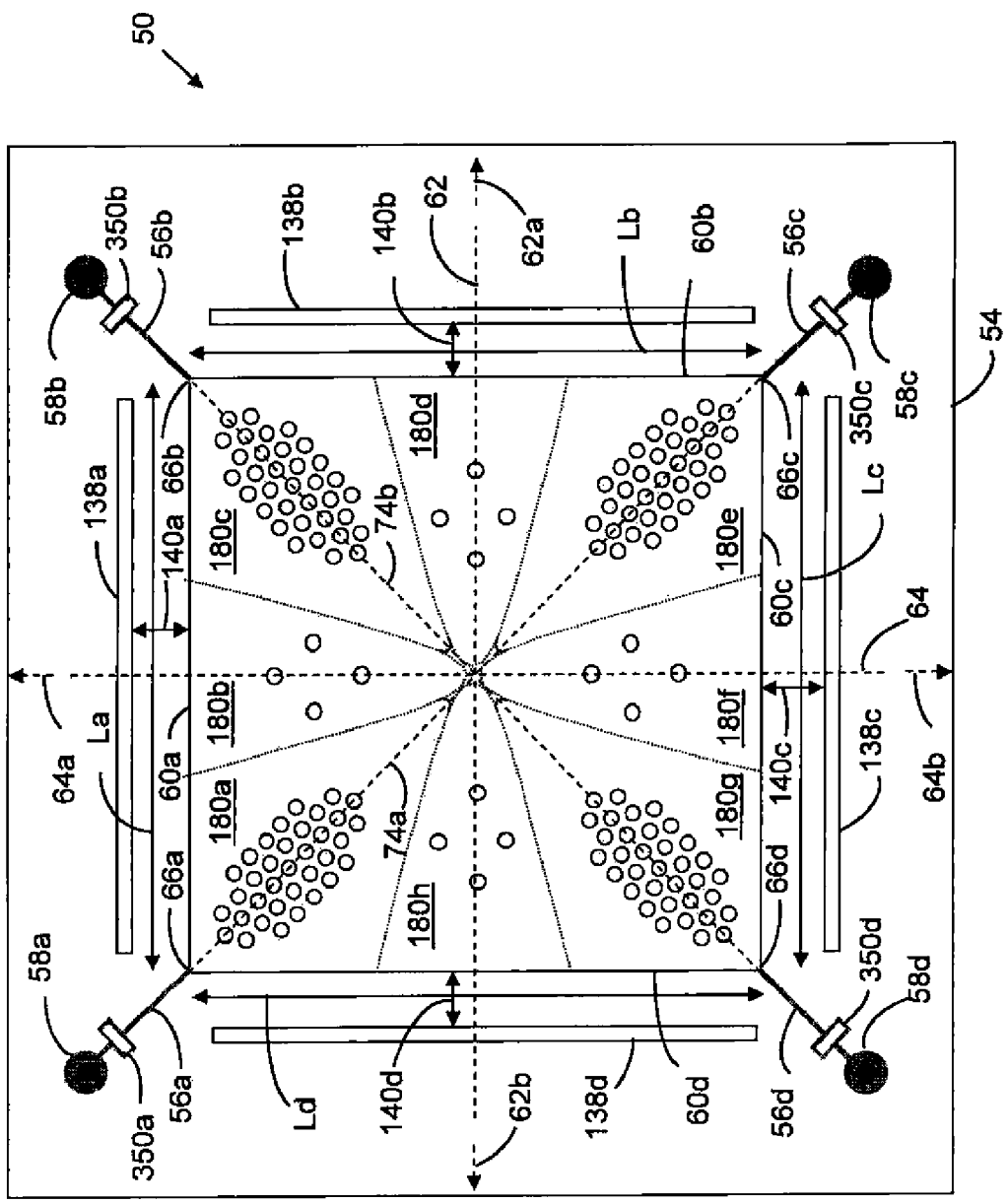
FIG. 6B is a schematic top view representation of one embodiment of the MEMS resonator of FIG. 6A; in a stationary state.
Figure 6C:
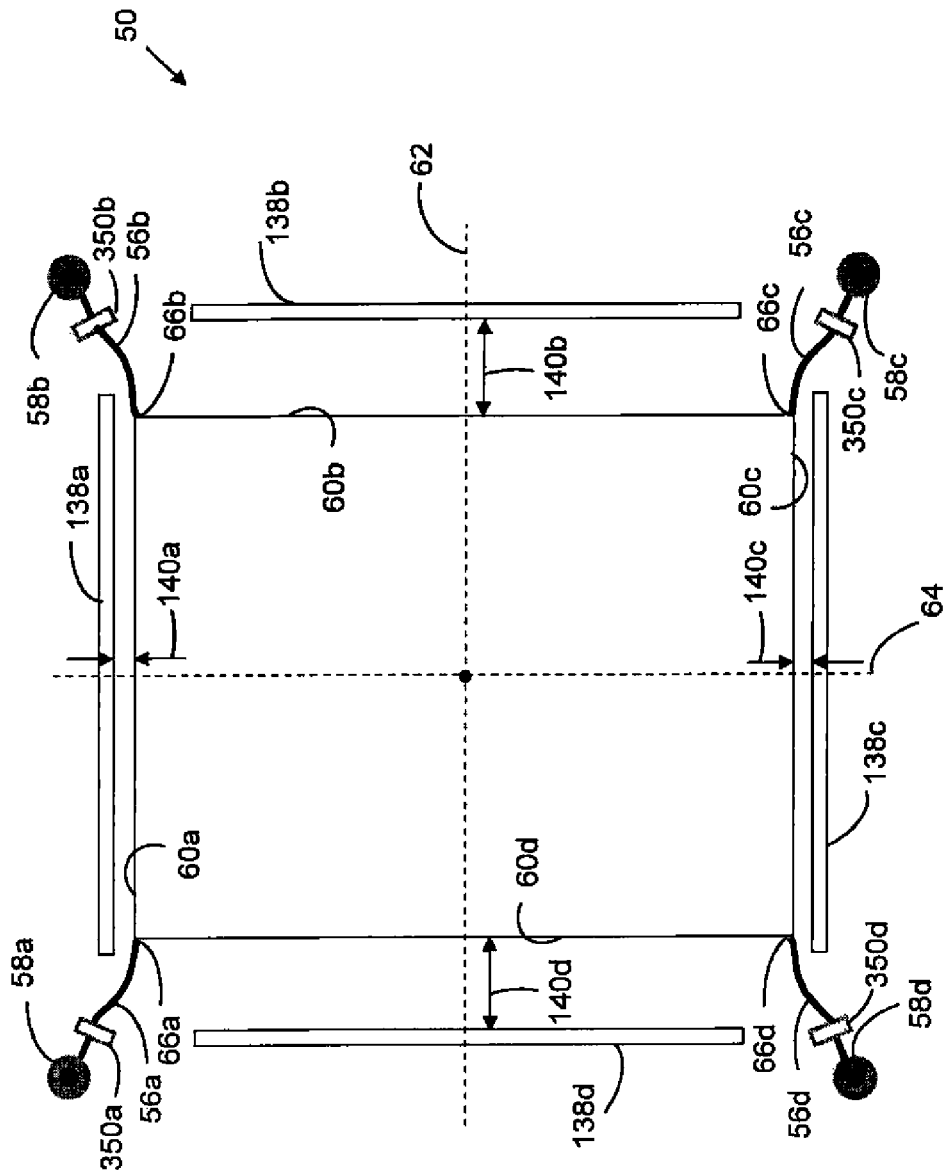
FIG. 6C is a schematic top view representation of the resonator of FIG. 6A, with the resonator in the first state of oscillation.
Figure 6D:
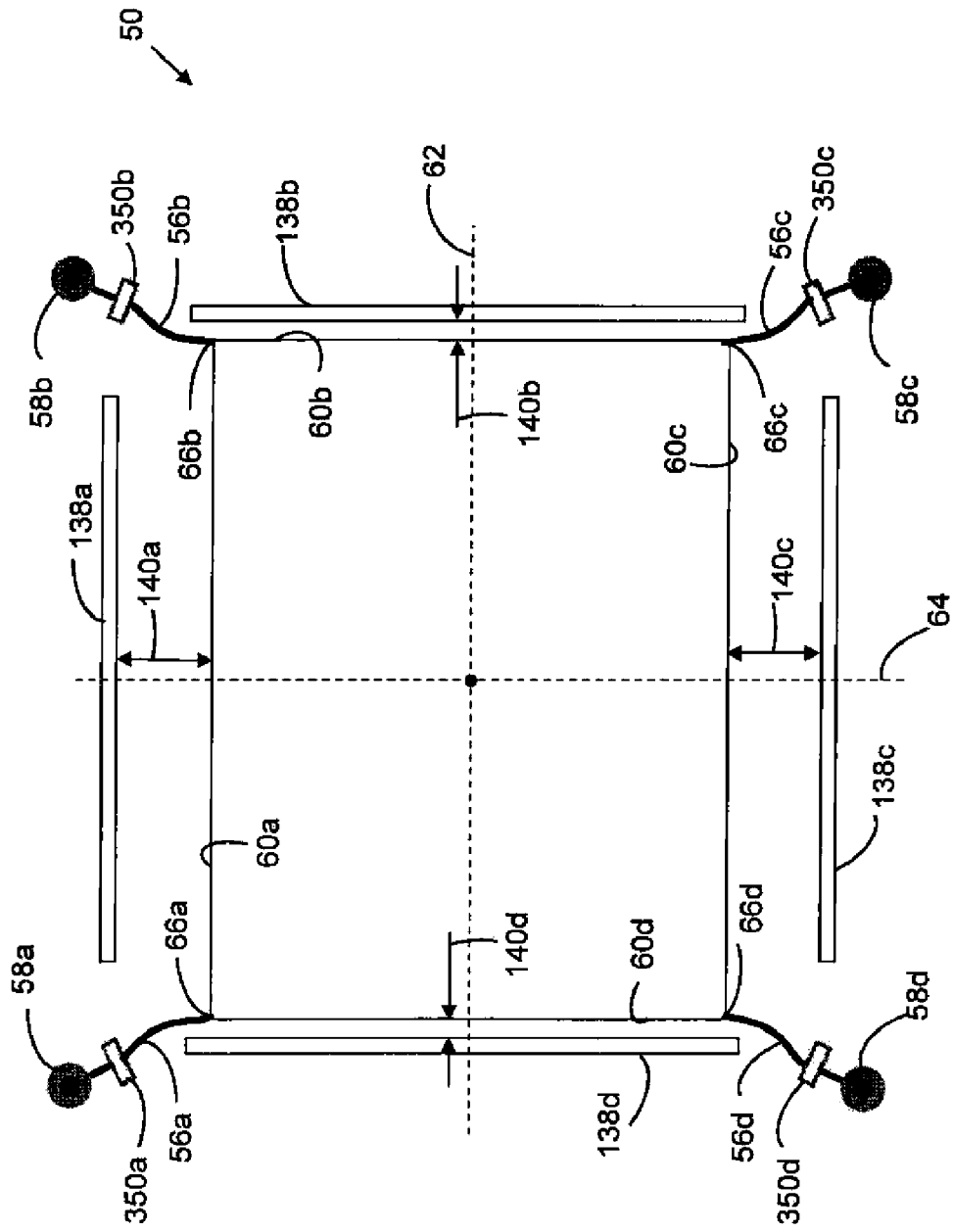
FIG. 6D is a schematic top view representation of the resonator of FIG. 6A, with the resonator in the second state of oscillation.

FIG. 4D illustrates one embodiment of the sense circuitry 320 and the drive circuitry 324. In this embodiment, sense circuitry 302 includes an amplifier 330. Drive circuitry 300 includes automatic gain control circuitry 332. The amplifier 330 of the sense circuitry 324 receives the sense signal S and provides an output signal Out in response thereto. The output signal Out of the amplifier 330 is supplied via the signal line 328 to the automatic gain control circuitry 332 of the drive circuitry 320, which provides the drive signal D in response thereto.

It should be noted that there are many other configurations and/or architectures of the sense and drive electrodes and/or sense and drive circuitry that cause or induce resonator 50 to resonate and thereby generate and/or produce output signals. All such configurations and/or architectures are intended to fall within the scope of the present invention.

The MEMS resonator 50 of the present inventions may employ any sense and drive structure, technique, configurations and/or architectures whether now known or later developed. In some embodiments, drive circuitry 320 and sense circuitry 324 are conventional well-known drive and sense circuitry and/or conventional drive and sense electrodes, respectively. However, drive circuitry 320 and/or sense circuitry 324 may be any type of circuitry (whether or not disposed on and/or integrated on the same substrate in which resonator 50 resides (or is fabricated in)), and all such circuitry, whether now known or later developed, are intended to fall within the scope of the present invention.

The drive circuitry 320 and/or sense circuitry 324 may be disposed on or and/or integrated on the same substrate in which the MEMS resonator structure resides (or is fabricated in). In addition thereto, or in lieu thereof, drive circuitry 320 and/or sense circuitry 324 may be disposed on and/or integrated on a substrate that is physically separate from (and electrically interconnected with) the substrate in which the MEMS resonator structure resides.

The drive and sense electrodes, e.g., electrodes 138a-138d, may be of a conventional, well known type or may be any type and/or shaped electrode whether now known or later developed. For example, there are many other configurations and or architectures of the sense and drive electrodes, e.g., electrodes 138a-138d, that cause resonator 50 to generate and/or produce output signals that are (or are substantially) 180 degrees out of phase, and in which the driving electrodes induce or cause motion in the plane of MEMS resonator 50 and the sensing electrodes sense/measure that motion.

Further, the physical electrode mechanisms may include, for example, capacitive, piezoresistive, piezoelectric, inductive, magnetorestrictive and thermal. Indeed, all physical electrode mechanisms whether now known or later developed are intended to fall within the scope of the present invention.

As stated above, drive electrodes and sense electrodes may be of any number and design (e.g., size, shape, type), whether now known or later developed. In some embodiments, the number and length of drive electrodes and/or sense electrodes may be selected in order to optimize, enhance and/or improve the operation of the MEMS resonator. For example, in one embodiment, the number of sense electrodes, and the cross-sectional sense electrode-resonator mass interface, is increased in order to increase the signal provided to sense circuitry (for example, the single ended or differential sense circuitry).

In some embodiments, drive electrodes, e.g., electrodes 138a, 138c, and sense electrodes, e.g., electrodes 138b, 138d, are fabricated without an additional or extra mask(s). For example, in some embodiments, a rectangular and/or square shaped resonator mass 52, drive electrodes, e.g., electrodes 138a, 138c, and sense electrodes, e.g., electrodes 138b, 138d, are fabricated contemporaneously.

In some embodiments, drive electrodes, e.g., electrodes 138a, 138c, sense electrodes, e.g., electrodes 138b, 138d, and the resonator mass 52 are symmetrically configured and employed in conjunction with a MEMS resonator 50 having a symmetrical resonator mass 52. Such embodiment may help manage, minimize and/or reduce stress on one or more portions of the resonator mass 52, anchors, e.g., anchors 58a-58d, and/or the substrate 54. In such embodiment, the center 72 of resonator mass 52 may be a low stress point. In such embodiments, if resonator mass 52 is anchored at center 72 (e.g., rather than through corners 66a-66d), energy loss of MEMS resonator 50 may be further minimized, reduced and/or eliminated.

Notably, the differential and single-ended output signal configurations may also be implemented in a MEMS resonator 50 that employs a resonator mass 52 having less than four sides, a resonator mass 52 having greater than four sides and/or a non-symmetrical resonator mass 52. Indeed, all of the features, embodiments and alternatives discussed herein with respect to MEMS resonator 50 in the context of sensing and driving are applicable to a resonator mass 52 having any size and/or configuration. For the sake of brevity, those discussions will not be repeated.

As stated above, the resonator mass 52 may oscillate in an inherently or substantially linear mode. As such, some of the considerations and/or requirements of the drive and sense circuitry, discussed herein, to provide a linear resonator/oscillator may be less stringent and/or complex because there may be no need to very precisely or very accurately control the resonant amplitude of the resonator mass 52.

Notably, as mentioned above and discussed below, MEMS resonator 50 may be anchored to a substrate using other anchoring configurations. Indeed, the MEMS resonator 50 of the present invention may employ any anchor structure and technique whether now known or later developed. All structures and techniques are intended to fall within the scope of the present invention. For example, the present invention may employ the anchoring structures and techniques described and illustrated in non-provisional patent application entitled "Anchors for Microelectromechanical Systems Having an SOI Substrate, and Method for Fabricating Same", which was filed on Jul. 25, 2003 and assigned Ser. No. 10/627,237 (U.S. Pat. No. 6,952,041) (hereinafter "Anchors for Microelectromechanical Systems Patent Application"). It is expressly noted that the entire contents of the Anchors for Microelectromechanical Systems Patent Application, including, for example, the features, attributes, alternatives, materials, techniques and advantages of all of the embodiments and/or inventions, are incorporated by reference herein, although, unless stated otherwise, the aspects and/or embodiments of the present invention are not limited to such features, attributes, alternatives, materials, techniques and/or advantages. In one embodiment, in addition to or in lieu of "corner" anchor MEMS resonator 50 may include a "center" anchor.

As stated above, in some embodiments, the MEMS resonator 50 includes one or more nodal points (areas and/or portions of the resonator mass 52 that do not move, experience little movement, and/or are substantially stationary when the resonator mass 52 oscillates). In some embodiments, the nodal points may be located in or near an inner area, portion or region of resonator mass, e.g., a center. In lieu and/or in addition to nodal points located on or near an inner area, portion or region of resonator mass, resonator mass may include nodal points located on or near an outer area portion or region of resonator mass.

It may be advantageous to anchor the resonator mass 52 to the substrate through or at one or more of the nodal points. By anchoring through, at or near one or more nodal points the vertical and/or horizontal energy losses of MEMS resonator 50 are minimized, limited and/or reduced, which may result or provide a relatively high Q MEMS structure. In one embodiment, MEMS resonator 50 includes a nodal point at the center of resonator mass 52 and a "center" anchor at the center of resonator mass 52, in addition to or in lieu of "corner" anchors. Notably, however, MEMS resonator 50 need not be anchored at nodal points, if any exist.

A finite element analysis and simulation engine may be employed to design, determine and/or define the location(s) of one or more nodal points at which resonator mass 52 of MEMS resonator 50 may be anchored to the substrate with predetermined, minimal and/or reduced energy loss (among other things). In this regard, resonator mass 52 of MEMS resonator 50, when induced during operation, moves in an expanding and contracting manner. As such, the length and/or width of resonator mass 52 may determine the location of nodal points on or in the resonator structure whereby there is little, no or reduced rotation movement due to the expanding-contracting mode. The finite analysis engine may be employed to design, determine and assess the location of such nodal points. In this way, areas or portions in or on resonator mass 52 that exhibit acceptable, predetermined, and/or little or no movement (radial, lateral and/or otherwise) for anchoring resonator mass 52 may be rapidly determined and/or identified.

In some embodiments, the design (for example, the shape and width) of anchor coupling sections, e.g., anchor coupling sections 56a-56d, may impact the resonant frequency of MEMS resonator 50. The design of anchor coupling sections, e.g., anchor coupling sections 56a-56d, may also affect the durability and/or stability of MEMS resonator 50. In this regard, by adjusting the shape and width of the anchor coupling sections 56a-56d, the stress on resonator mass 52 may be managed, controlled, reduced and/or minimized. For example, the width of anchor coupling sections, e.g., anchor coupling sections 56a-56d, may be increased or decreased to manage, control, reduce and/or minimize the stress concentration in or at nodal points. In this way, the durability and/or stability of MEMS resonator 50 may be increased, enhanced and/or optimized.

Other designs and/or configurations of anchor coupling sections 56 may be employed to, for example, affect the durability and/or stability of MEMS resonator 50 as well as impact the location of nodal points (if any) and/or the resonant frequency of MEMS resonator 50.

As stated above, the MEMS resonator 50 of the present invention may employ any anchor structure and technique whether now known or later developed. All structures and techniques, including all combinations and permutations of the various anchoring techniques, are intended to fall within the scope of the present invention In some embodiments, the anchoring technique illustrated in FIGS. 2A-2G, and/or the anchoring technique illustrated in FIGS. 3A-3E is implemented without an additional or extra mask to define anchors 58a-58d. That is, in some embodiments, the resonator mass 52 and the anchoring structure are fabricated contemporaneously.

In some embodiments, MEMS resonator 50 employs stress/strain relief mechanisms (for example, springs or spring-like components) to manage, control, reduce, eliminate and/or minimize any stress or strain on the substrate.

With reference to FIGS. 5A-5B and FIGS. 6A-6D, in some embodiments, one or more of the couplings, e.g., couplings 56a-56d, includes one or more stress/strain relief mechanisms (for example, springs or spring-like components) to manage, control, reduce, eliminate and/or minimize any stress or strain on the substrate at the location of one or more anchor(s), e.g., anchors 58a-58d, caused by the motion of one, some or all of points at which resonator mass 52 is anchored through or at the substrate 54. In the illustrated embodiments, coupling 56a, which mechanically couples outer surfaces 60a, 60d (and/or corner 66a) to anchor 58a, includes a stress/strain relief mechanism 350a. Coupling 56b, which mechanically couples outer surfaces 60a, 60b (and/or corner 66b) to anchor 58b, includes a stress/strain relief mechanism 350b. Coupling 56c, which is disposed between and mechanically couples outer surfaces 60b, 60c (and/or corner 66c) and anchor 58c, includes a stress/strain relief mechanism 350c. Coupling 56c, which mechanically couples outer surfaces 60c, 60d (and/or corner 66d) to anchor 58d, includes a stress/strain relief mechanism 350d.

In this embodiment, each of the stress/strain relief mechanism 350a-350d comprises a spring or spring like component having first and second elongated portions 352, 354 (see for example, first and second elongated portions 352, 354 of stress/strain relief mechanism 350a) spaced apart from one another and joined together by first and second end portions 356, 358 (see for example, first and second end portions 356, 358 of stress/strain relief mechanism 350a). The first and second elongated portions 352, 354 may be straight and may have uniform thicknesses. However, other stress/strain relief mechanisms with other configurations may be employed in addition thereto and/or in lieu thereof.

With reference to FIGS. 5B-5C and FIGS. 6C-6D, in operation, stress/strain relief mechanisms, e.g., stress/strain relief mechanisms 350a-350d, expand and contract in conjunction with the motion of resonator mass 52 in order to reduce, eliminate and/or minimize any stress or strain on the substrate and/or to compensate for small remaining movements of the anchoring point due to small asymmetries from manufacturing, material properties may change thereby resulting in a non-100% optimized design (even where Finite Element Modeling (also known as Finite Element Analysis, "FEA" or "F E Analysis") is employed). In this way, the anchoring architecture of MEMS resonator 50 may be relatively stress-free and/or strain-free which may significantly decrease, reduce, minimize and/or eliminate any anchor energy loss and thereby increase, enhance, maximize the Q (and output signal) of MEMS resonator 50 and anchor stress will have little to no effect on the resonating frequency of MEMS resonators 50. Notably, couplings, e.g., couplings 56a-56d having stress/strain relief mechanisms 350a-350d, in addition to decreasing, reducing, minimizing and/or eliminating anchor energy losses, suspend resonator mass 52 of MEMS resonator 50 above the substrate.

The stress/strain relief mechanisms 350 may be well known springs or spring-like components, or may be any mechanism that reduces, eliminates and/or minimizes: (i) stress and/or strain on the substrate at the location of the anchor which is caused by the motion of one, some or all of points at which resonator mass 52 is anchored through or at the substrate, and/or (ii) communication of energy between resonator mass 52 and the substrate.

It may be advantageous to implement stress/strain relief mechanisms 350 in those situations where the point at which MEMS resonator 50 is anchored through or at the substrate is not motionless or where additional de-coupling from the substrate is desired. For example, it may also be advantageous to employ stress/strain relief mechanisms 350 to reduce, eliminate and/or minimize communication of energy between resonator mass 52 and the substrate (for example, in those situations where there is an impedance mismatch or where "noise" originates in the substrate and is communicated to the resonator mass 52).

In some embodiments, substrate anchor(s) and/or stress/strain management techniques/structures may be placed at one, some or all of nodal points, if any, and/or one or more anchors of the MEMS resonator 50. Other substrate anchoring-stress/strain management techniques may also be suitable. Indeed, resonator mass 52 may be coupled to a substrate anchor (and stress/strain mechanism) at one or more non-nodal points in a symmetrical or non-symmetrical manner).

Notably, the anchoring-stress/strain management techniques may be implemented in conjunction with any of the anchoring techniques and/or architectures described and/or illustrated herein.

The MEMS resonator 50 of the present invention may be fabricated and/or packaged using a variety of techniques, for example, thin film techniques, substrate bonding techniques (for example, bonding semiconductor or glass-like substrates) and prefabricated package (for example, a TO-8 "can").

Indeed, any fabrication and/or packaging techniques may be employed, whether now known or later developed. As such, all such fabrication and/or packaging techniques are intended to fall within the scope of the present invention. For example, the systems, devices and/or techniques described and illustrated in the following non-provisional patent applications may be implemented:

(1) "Electromechanical System having a Controlled Atmosphere, and Method of Fabricating Same", which was filed on Mar. 20, 2003 and assigned Ser. No. 10/392,528 (U.S. Patent Application Publication No. 2004/0183214);

(2) "Microelectromechanical Systems, and Method of Encapsulating and Fabricating Same", which was filed on Jun. 4, 2003 and assigned Ser. No. 10/454,867 (U.S. Patent Application Publication No. 2004/0248344); and (3) "Microelectromechanical Systems Having Trench Isolated Contacts, and Methods of Fabricating Same", which was filed on Jun. 4, 2003 and assigned Ser. No. 10/455,555 (U.S. Pat. No. 6,936,491);

The inventions described and illustrated in the aforementioned patent applications may be employed to fabricate MEMS resonator 50 (including resonator masses 52) of the present inventions. For the sake of brevity, those discussions will not be repeated. It is expressly noted, however, that the entire contents of the aforementioned patent applications, including, for example, the features, attributes, alternatives, materials, techniques and/or advantages of all of the inventions/embodiments, are incorporated by reference herein, although, unless stated otherwise, the aspects and/or embodiments of the present invention are not limited to such features, attributes, alternatives, materials, techniques and/or advantages.

Notably, the dimensions of the MEMS resonators set forth in Table 1 are merely exemplary. The dimensions, characteristics and/or parameters of a MEMS resonator according to the present invention may be determined using a variety of techniques including modeling and simulation techniques (for example, a finite element modeling and/or simulation process implemented via a computer driven analysis engine, such as FEMLab (from Consol), ANSYS (ANSYS INC.), IDEAS and/or ABAKUS) and/or empirical data/measurements. For example, a finite element analysis engine, using or based on a set of boundary conditions (for example, the size of the resonator structure), may be employed to design, determine and assess the dimensions, characteristics and/or parameters of the non-homogeneous structure of the resonator mass for example but not limited to (i) elongated inner and outer regions, (ii) connector region, (iii) openings, and/or (iv) other elements or properties of the resonator structure that are discussed below. Notably, an empirical approach may also be employed (in addition to or in lieu of a finite element analysis (or the like) approach) to design, determine and assess the dimensions, characteristics and/or parameters of non-homogeneous structure of the resonator mass for example but not limited to (i) elongated inner and outer regions, (ii) connector region, (iii) openings, and/or (iv) other elements or properties of the resonator structure.

Notably, in some embodiments, one or more corners, e.g., corners 66a-66d, of resonator mass 52 are replaced by one or more curved sections. Various considerations relating to curved sections are discussed in detail in "Microelectromechanical Resonator Structure, and Method of Designing, Operating and Using Same", filed May 19, 2005, and assigned U.S. patent application Ser. No. 11/132,941 (Inventors: Lutz and Partridge). The inventions described and illustrated in the aforementioned patent application may be employed to design, implement, and/or fabricate one or more MEMS resonators of the present invention. For the sake of brevity, those discussions will not be repeated. It is expressly noted, however, that the entire contents of the patent application, including, for example, the features, attributes, alternatives, materials, techniques and/or advantages of all of the inventions/embodiments, are incorporated by reference herein, although, unless stated otherwise, the aspects and/or embodiments of the present invention are not limited to such features, attributes, alternatives, materials, techniques and/or advantages.

In some embodiment of the present invention, MEMS resonator 50 employs temperature management techniques in order to manage and/or control the Q factor of the resonator 50. In this regard, when resonator mass 52 oscillates, one portion of resonator mass expands thereby causing a slight cooling in the area of the expanding, and the other side contracts, thereby causing a slight heating in the area of the contraction. The heat gradient causes diffusion from the "hotter" side to the "cooler" side. The diffusion of heat ("heat flow") results in a loss of energy, which may impact (for example, reduce) the Q factor of MEMS resonator 50. This effect is often referred to as Thermoelastic Dissipation ("TED"), which may be a dominate limit of the Q factor of a resonant structure. As such, is may be advantageous to implement temperature management techniques in order to manage, control, limit, minimize and/or reduce TED.

Figure 7A:
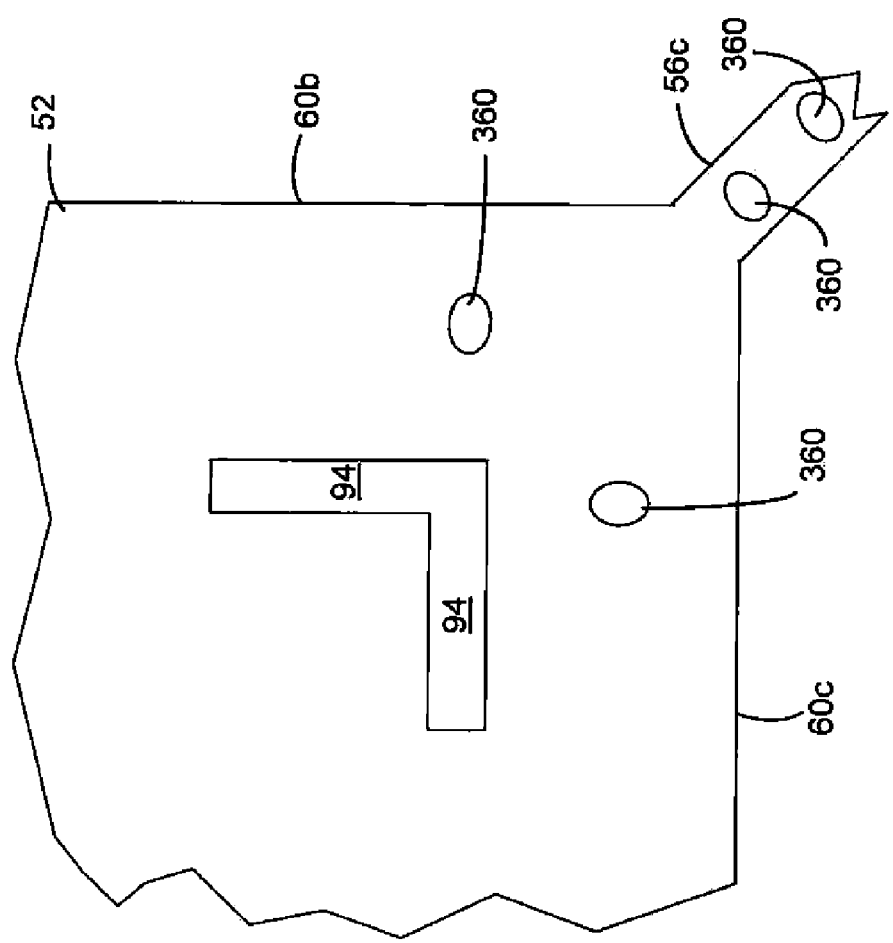
FIG. 7A is an enlarged schematic top view representation of a portion of a resonator in a stationary state, in accordance with another embodiment of the present invention.
Figure 7B:
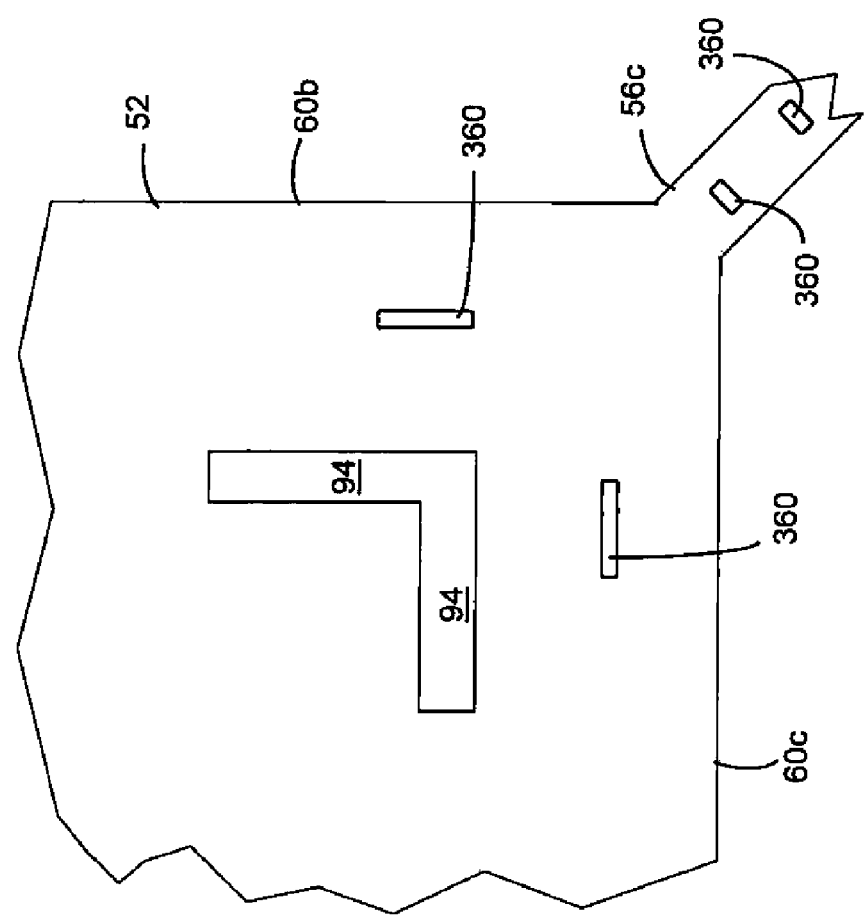
FIG. 7B is an enlarged schematic top view representation of a portion of a resonator in a stationary state, in accordance with another embodiment of the present invention.

With reference to FIGS. 7A-7B, in one temperature management embodiment, resonator mass 52 includes one or more slots 360 to suppress/reduce heat flow between the different portions of the resonator mass 52 as portions of the resonator mass expand and contract during operation. The suppression/reduction of heat transfer within the resonator mass 52 may lead to a higher Q factor for MEMS resonator 50. This method of temperature management may affect the oscillation characteristics of the resonator mass 52, and thus it may be desirable to take such temperature management techniques into consideration during design of the resonator 50 (for example, FEA).

In addition thereto, or in lieu thereof, the temperature management techniques may be implemented in one or more coupling sections, e.g., one or more of coupling sections 56a-56d. The slots 360 may be any shape including, for example, square, rectangle, circular, elliptical and/or oval. Indeed, slots 360 of any shape, whether geometric or otherwise, may be incorporated into resonator mass 52 and/or coupling sections, e.g., coupling sections 56a-56d.

Slots 360 may an effect on the stiffness of the resonator mass 52 and/or the one or more couplings, e.g., couplings 56a-56d. Slots may also change the amount of movement exhibited by one or more regions of resonator mass 52, including for example, the amount of movement exhibited at anchoring point(s).

Further, a thermo-mechanical finite element analysis engine may be employed to enhance any temperature considerations of resonator 50 during operation. In this regard, thermo-mechanical finite element analysis engine may model the operation of MEMS resonator 50 and thereby determine the size, location, dimensions, and number of slots to implement in one or more portions of resonator mass 52 and/or coupling sections 56a-56d. In this way, the characteristics of MEMS resonator 50 and/or MEMS resonators 50, having temperature management techniques implemented therein, may be enhanced and/or optimized and the TED loss minimized and/or reduced.

As mentioned above, a finite element analysis and simulation engine, using or based on a set of boundary conditions (for example, the size of the resonator structure), may be employed to design, determine and/or assess the dimensions, characteristics and/or parameters of (i) one or more portions of resonator mass 52 e.g., elongated outer regions 82, elongated inner regions 84, connector regions 86(ii) nodal point(s) (if any), (iii) couplings 56a-56d (iv) stress/strain mechanisms 350 and/or (v) temperature management mechanisms 360. Thus, as mentioned above, many of the properties of the structures of the present inventions may be optimized with Finite Element Modeling (FEM), which is also known as "FEA" or "FE Analysis".

However, an empirical approach may also be employed (in addition to or in lieu of a finite element analysis (or the like) approach) to design, determine, define and/or assess the dimensions, characteristics and/or parameters of (i) one or more portions of resonator mass 52 e.g., elongated outer regions 82, elongated inner regions 84, connector regions 86 (ii) nodal point(s) (if any), (iii) couplings 56a-56d (iv) stress/strain mechanisms 350 and/or (v) temperature management mechanisms 360.

If MEMS resonator 50 employs a rounded square shape resonator mass 52 that is symmetrically anchored, the center of gravity of the resonator mass 52 may remain relatively constant or fixed during operation. Notably, a rounded square shape resonator mass 52 may statistically average Gaussian process tolerances which may provide better parameter control.

The MEMS resonator of the present inventions may be fabricated from well-known materials using well-known techniques. For example, the MEMS resonator may be fabricated from well-known semiconductors such as silicon, germanium, silicon-germanium or gallium-arsenide. Indeed, the MEMS resonator may be comprised of, for example, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Moreover, the MEMS resonator according to the present inventions may be formed in or on semiconductor on insulator (SOI) substrate using well-known lithographic, etching, deposition and/or doping techniques. For the sake of brevity, such fabrication techniques are not discussed herein. However, all techniques for forming or fabricating the resonator structure of the present invention, whether now known or later developed, are intended to fall within the scope of the present invention (for example, well-known formation, lithographic, etching and/or deposition techniques using a standard or over-sized ("thick") wafer (not illustrated) and/or bonding techniques (i.e., bonding two standard wafers together where the lower/bottom wafer includes a sacrificial layer (for example, silicon oxide) disposed thereon and the upper/top wafer is thereafter thinned (ground down or back) and polished to receive the mechanical structures in or on).

Notably, the SOI substrate may include a first substrate layer (for example, a semiconductor (such as silicon), glass or sapphire), a first sacrificial/insulation layer (for example, silicon dioxide or silicon nitride) and a first semiconductor layer (for example, silicon, gallium arsenide or germanium) disposed on or above the sacrificial/insulation layer. The mechanical structure may be formed using well-known lithographic, etching, deposition and/or doping techniques in or on the first semiconductor layer (for example, semiconductors such as silicon, germanium, silicon-germanium or gallium-arsenide).

In one embodiment, the SOI substrate may be a SIMOX wafer which is fabricated using well-known techniques. In another embodiment, the SOI substrate may be a conventional SOI wafer having a first semiconductor layer. In this regard, SOI substrate, having a relatively thin first semiconductor layer, may be fabricated using a bulk silicon wafer which is implanted and oxidized by oxygen to thereby form a relatively thin $SiO_2$ beneath or underneath the single or mono crystalline wafer surface. In this embodiment, the first semiconductor layer (i.e., monocrystalline silicon) is disposed on the first sacrificial/insulation layer (i.e. silicon dioxide) which is disposed on a first substrate layer (i.e., monocrystalline silicon in this example).

In those instances where the MEMS resonator is fabricated in or on polycrystalline silicon or monocrystalline silicon, certain geometric shaped MEMS resonator structures according to the present inventions, for example, the rounded square shaped MEMS resonator, may maintain structural and material symmetry with polycrystalline silicon or monocrystalline silicon. In particular, a resonator mass 52 that has a rounded square shape may be inherently more compatible with the cubic structure of monocrystalline silicon. In each lateral orthogonal direction on a standard wafer (e.g. 100, 010, or 110), the properties of the monocrystalline silicon may be matched to a geometric shaped resonator. In this regard, the crystalline properties of monocrystalline silicon may have the same or suitable symmetry as the geometric shaped resonator.

The impact and/or response of different non-homogeneous structures on or at the anchor(s), e.g., anchors 58a-58d, and/or substrates, e.g., substrate 54, may also be observed and/or determined using such a finite element modeling, simulation and analysis engine.

In some aspects of the present invention, one or more of the structures and/or techniques described and/or illustrated herein are employed in conjunction with one or more of the structures and/or techniques described and/or illustrated in non-provisional patent application entitled "MEMS Resonator Array Structure and Method of Operating and Using Same", filed on even date herewith (hereinafter the "MEMS Resonator Array Structure and Method Patent Application") in the name of Lutz et al. For example, in some embodiments, one or more resonator mass 52 of one or more resonators 50 described and/or illustrated herein are mechanically coupled in a MEMS resonator array.

For the sake of brevity, the structures and methods described and/or illustrated in the MEMS Resonator Array Structure and Method Patent Application will not be repeated. It is expressly noted, however, that the entire contents of the MEMS Resonator Array Structure and Method Patent Application, including, for example, the features, attributes, alternatives, materials, techniques and/or advantages of all of the inventions/embodiments, are incorporated by reference herein although, unless stated otherwise, the aspects and/or embodiments of the present invention are not limited to such features, attributes alternatives, materials, techniques and/or advantages.

Notably, although a significant portion of the description of the present inventions was set forth in the context of a MEMS resonator including a resonator mass having a rectangular shape, a MEMS resonator according to the present invention may include MEMS resonators of any geometric shaped resonator architecture or structure. All of the features, embodiments and alternatives discussed herein with respect to a MEMS resonator having rectangular shape are applicable to MEMS resonators, according to the present invention, which have other shapes. For the sake of brevity, those discussions will not be repeated.

It should be further noted that while aspects and/or embodiments of the present inventions have been described in the context of microelectromechanical systems including micromechanical structures or elements, the present inventions are not limited in this regard. Rather, the inventions described herein are applicable to other electromechanical systems including, for example, nanoelectromechanical systems. In that regard, unless specified otherwise, the term "micromechanical structure", as used hereinafter and in the claims, includes, micromechanical structures, nanomechanical structures and combinations thereof.

As used herein, the term "portion" includes, but is not limited to, a part of an integral structure and/or a separate part or parts that together with one or more other parts forms a whole element or assembly. For example, some structures may be of single piece construction or may be formed of two or more separate pieces. If the structure is of a single piece construction, the single piece may have one or more portions (i.e., any number of portions). Moreover, if a single piece has more than one portion, there may or may not be any type of demarcation between the portions. If the structure is of separate piece construction, each piece may be referred to as a portion. In addition, each of such separate pieces may itself have one or more portions. A group of separate pieces that collectively represent part of a structure may also be referred to collectively as a portion. If the structure is of separate piece construction, each piece may or may not physically contact one or more of the other pieces.

Further, in the claims, the term "slots" means openings, voids and/or slots (whether extending partially or entirely through the entire height/thickness of the elongated beam section or curved section), of any shape and/or size. Moreover, in the claims, the term "voids" means openings, voids and/or slots (whether extending partially or entirely through the entire height/thickness of the resonator coupling section), of any shape and/or size.

Further, unless otherwise stated, terms such as, for example, "in response to" and "based on" mean "in response at least to" and "based at least on", respectively, so as not to preclude being responsive to and/or based on, more than one thing.

In addition, unless stated otherwise, the phrase "differential signal", for example, as used in phrases, differential drive signal, differential sense signal and differential output signal, means a signal that includes a first signal and a second signal.

In addition, unless stated otherwise, terms such as, for example, "comprises", "has", "includes", and all forms thereof, are considered open-ended, so as not to preclude additional elements and/or features.

In addition, unless stated otherwise, terms such as, for example, "a", "one", "first", are each considered open-ended.

Notably, any of the aspects and/or embodiments disclosed herein, or portion(s) thereof, may be employed alone, in combination with any other aspect and/or embodiment disclosed herein, or portion(s) thereof, and/or in combination with any other structure(s) and/or method(s), or portion(s) thereof, now known or later developed.

A MEMS resonator in accordance with one or more aspects of the present inventions may be implemented in a wide variety of applications including, for example, timing or clock devices or clock alignment circuitry wherein a resonator or oscillator is employed. Indeed, a MEMS resonator in accordance with one or more aspects of the present inventions may be implemented, for example, in any system or device where a clock signal or reference clock is employed, for example, in data, satellite and/or wireless communication systems/networks, mobile phone systems/networks, Bluetooth systems/networks, zig bee systems/networks, watches, real time clocks, set top boxes and systems/networks therefor, computer systems (for example, laptops, PCs and/or handheld devices), televisions and systems/networks therefore, consumer electronics (such as DVD player/recorder, MP3, MP2, DIVX or similar audio/video systems).

While various embodiments have been described, such description should not be interpreted in a limiting sense. Thus, for example, the various embodiments described herein are not intended to be exhaustive or to limit the inventions to the precise forms, techniques, materials and/or configurations disclosed. Other embodiments, which may be different from and/or similar to, the embodiments described herein, will be apparent from the description, illustrations and/or claims set forth below. It is to be understood that other embodiments may be utilized and operational changes may be made without departing from the scope of the present invention. Many modifications and variations are possible in light of the above teaching. Thus, it is intended that the scope of the present inventions not be limited solely to this detailed description.

What is claimed is:

1. A microelectromechanical resonator comprising:
a resonator mass that oscillates in a bulk mode, the oscillation including a first state in which the resonator mass is contracted, at least in part, in at least one of a first direction and a second direction, and wherein in the first state, the resonator mass is expanded, at least in part, in at least one of a third direction and a fourth direction, the second direction being opposite the first direction, the fourth direction being opposite the third direction, wherein the resonator mass includes:
a first plurality of regions each having a density; and
a second plurality of regions each having a density, wherein the density of each of the second plurality of regions is different than the density of each of the first plurality of regions;
wherein:
the second plurality of regions are disposed in a non uniform arrangement;
the second plurality of regions includes a first region and a second region;
the resonator mass has a first major outer surface and the first region of the second plurality of regions has a first cross section parallel to the first major outer surface;
the first and second regions of the second plurality of regions are spaced apart by a first distance and the first cross section has a first dimension that is at least one half the first distance; and
the first dimension is greater than the first distance.

2. The microelectromechanical resonator of claim 1 wherein the resonator mass is coupled to a substrate anchor.

3. The microelectromechanical resonator of claim 2 further including a coupling section disposed between the resonator mass and the substrate anchor.

4. The microelectromechanical resonator of claim 1 further including at least one sense electrode to provide a sense signal indicative of oscillation of the resonator mass.

5. The microelectromechanical resonator of claim 4 wherein the sense signal comprises a differential sense signal.

6. The microelectromechanical resonator of claim 4 further including sense circuitry to receive the sense signal and to provide an output signal in response thereto.

7. The microelectromechanical resonator of claim 6 wherein the output signal comprises a differential output signal.

8. The microelectromechanical resonator of claim 7 further including at least one drive electrode to receive a drive signal to induce the resonator mass to oscillate.

9. The microelectromechanical resonator of claim 8 further including drive circuitry to receive the output signal and to provide the drive signal in response thereto.

10. The microelectromechanical resonator of claim 9 wherein the drive signal comprises a differential drive signal.

11. The microelectromechanical resonator of claim 1 wherein each of the second plurality of regions has the same configuration as one another.

12. The microelectromechanical resonator of claim 1 wherein the first dimension is a diameter of the first cross section.

13. The microelectromechanical resonator of claim 1 wherein at least one of the second plurality of regions has a configuration that is different than at least one other of the second plurality of regions.

14. The microelectromechanical resonator of claim 1 wherein the first cross section has a second dimension.

15. The microelectromechanical resonator of claim 1 wherein the second plurality of regions comprise a plurality of openings.

16. The microelectromechanical resonator of claim 15 wherein the plurality of openings includes a first opening and a second opening.

17. A microelectromechanical resonator comprising:
a resonator mass that oscillates in a bulk mode, the oscillation including a first state in which the resonator mass is contracted, at least in part, in at least one of a first direction and a second direction, and wherein in the first state, the resonator mass is expanded, at least in part, in at least one of a third direction and a fourth direction, the second direction being opposite the first direction, the fourth direction being opposite the third direction, wherein the resonator mass includes:
a first plurality of regions each having a density; and
a second plurality of regions each having a density, wherein the density of each of the second plurality of regions is different than the density of each of the first plurality of regions;
wherein:
the second plurality of regions are disposed in a non uniform arrangement;
the second plurality of regions includes a first region and a second region;
the resonator mass has a first major outer surface and the first region of the second plurality of regions has a first cross section parallel to the first major outer surface;
the first and second regions of the second plurality of regions are spaced apart by a first distance and the first cross section has a first dimension that is at least one half the first distance; and
the first dimension is a length of the first cross section.

18. A microelectromechanical resonator comprising:
a resonator mass that oscillates in a bulk mode, the oscillation including a first state in which the resonator mass is contracted, at least in part, in at least one of a first direction and a second direction, and wherein in the first state, the resonator mass is expanded, at least in part, in at least one of a third direction and a fourth direction, the second direction being opposite the first direction, the fourth direction being opposite the third direction, wherein the resonator mass includes:
a first plurality of regions each having a density; and
a second plurality of regions each having a density, wherein the density of each of the second plurality of regions is different than the density of each of the first plurality of regions;
wherein:
the second plurality of regions are disposed in a non uniform arrangement;
the second plurality of regions includes a first region and a second region;
the resonator mass has a first major outer surface and the first region of the second plurality of regions has a first cross section parallel to the first major outer surface;
the first and second regions of the second plurality of regions are spaced apart by a first distance and the first cross section has a first dimension that is at least one half the first distance;
the first cross section has a second dimension; and
the second dimension is a width of the first cross section.

19. The microelectromechanical resonator of claim 18 wherein the second dimension is less than one half the first distance.

20. A microelectromechanical resonator comprising:
a resonator mass that oscillates in a bulk mode, the oscillation including a first state in which the resonator mass is contracted, at least in part, in at least one of a first direction and a second direction, and wherein in the first state, the resonator mass is expanded, at least in part, in at least one of a third direction and a fourth direction, the second direction being opposite the first direction, the fourth direction being opposite the third direction, wherein the resonator mass includes:
a first plurality of regions each having a density; and
a second plurality of regions each having a density, wherein the density of each of the second plurality of regions is different than the density of each of the first plurality of regions;
wherein:
the second plurality of regions are disposed in a non uniform arrangement
the second plurality of regions comprise a plurality of openings;
the plurality of openings includes a first opening and a second opening;
the resonator mass has a first major outer surface and the first opening has a first cross section parallel to the first major outer surface;
the first and second openings are spaced apart by a first distance and the first cross section has a first dimension that is at least one half the first distance; and
the first dimension is greater than the first distance.

21. The microelectromechanical resonator of claim 20 wherein the second plurality of regions includes a first region and a second region.

22. The microelectromechanical resonator of claim 20 wherein the first dimension is a diameter of the first cross section.

23. The microelectromechanical resonator of claim 20 wherein each of the plurality of openings has the same configuration as one another.

24. The microelectromechanical resonator of claim 20 wherein at least one of the plurality of openings has a configuration that is different than at least one other of the plurality of openings.

25. A microelectromechanical resonator comprising:
a resonator mass that oscillates in a bulk mode, the oscillation including a first state in which the resonator mass is contracted, at least in part, in at least one of a first direction and a second direction, and wherein in the first state, the resonator mass is expanded, at least in part, in at least one of a third direction and a fourth direction, the second direction being opposite the first direction, the fourth direction being opposite the third direction, wherein the resonator mass includes:
a first plurality of regions each having a density; and
a second plurality of regions each having a density, wherein the density of each of the second plurality of regions is different than the density of each of the first plurality of regions;
wherein:
the second plurality of regions are disposed in a non uniform arrangement
the second plurality of regions comprise a plurality of openings;
the plurality of openings includes a first opening and a second opening;
the resonator mass has a first major outer surface and the first opening has a first cross section parallel to the first major outer surface;
the first and second openings are spaced apart by a first distance and the first cross section has a first dimension that is at least one half the first distance; and
wherein the first dimension is a length of the first cross section.

26. The microelectromechanical resonator of claim 25 wherein the third direction and the fourth direction are perpendicular to the first direction and the second direction.

27. A microelectromechanical resonator comprising:
a resonator mass that oscillates in a bulk mode, the oscillation including a first state in which the resonator mass is contracted, at least in part, in at least one of a first direction and a second direction, and wherein in the first state, the resonator mass is expanded, at least in part, in at least one of a third direction and a fourth direction, the second direction being opposite the first direction, the fourth direction being opposite the third direction, wherein the resonator mass includes:
a first plurality of regions each having a density; and
a second plurality of regions each having a density, wherein the density of each of the second plurality of regions is different than the density of each of the first plurality of regions;
wherein:
the second plurality of regions are disposed in a non uniform arrangement; and
the resonator mass defines a first outer surface, the first outer surface having a midpoint and an end in a stationary state, the first outer surface having a midpoint and an end in the first state of oscillation, the end in the stationary state and the end in the first state of oscillation being separated by a first amount, the midpoint in the stationary state and the midpoint in the first state of oscillation being separated by a second amount, the first amount being at least one half the second amount.

28. The microelectromechanical resonator of claim 27 wherein the resonator mass has a first major outer surface and a first region of the second plurality of regions has a first cross section parallel to the first major outer surface.

29. The microelectromechanical resonator of claim 28 wherein the first region and a second region of the second plurality of regions are spaced apart by a first distance and the first cross section has a first dimension that is at least one half the first distance.

30. The microelectromechanical resonator of claim 27 wherein the oscillation further includes a second state in which the resonator mass is expanded, at least in part, in at least one of the first and second direction, and contracted, at least in part, in at least one of a third and a fourth direction, the fourth direction being opposite the third direction.

31. The microelectromechanical resonator of claim 27 wherein the resonator mass defines a first outer surface and wherein in the first state of oscillation, the first outer surface has a major portion that is substantially straight.

32. The microelectromechanical resonator of claim 31 wherein in the first state of oscillation, the first outer surface has a major portion that is straight.

33. The microelectromechanical resonator of claim 27 wherein the resonator mass defines a first outer surface having a first configuration in a stationary state, and wherein in the first state of oscillation, the first outer surface has a major portion that is substantially parallel to the first configuration of the first outer surface.

34. The microelectromechanical resonator of claim 33 wherein in the first state of oscillation, the first outer surface has a major portion that is parallel to the first configuration of the first outer surface.

35. A microelectromechanical resonator comprising:
a resonator mass that oscillates in a bulk mode, the oscillation including a first state in which the resonator mass is contracted, at least in part, in at least one of a first direction and a second direction, and wherein in the first state, the resonator mass is expanded, at least in part, in at least one of a third direction and a fourth direction, the second direction being opposite the first direction, the fourth direction being opposite the third direction, wherein the resonator mass includes:
a first plurality of regions each having a density; and
a second plurality of regions each having a density, wherein the density of each of the second plurality of regions is different than the density of each of the first plurality of regions;
wherein:
the second plurality of regions are disposed in a non uniform arrangement; and
the first plurality of regions includes:
a first elongated outer region having a first side and a second side, the first side being opposite the second side and defining a first outer surface of the resonator mass;
a first plurality of elongated inner regions including a first elongated inner region and a second elongated inner region, the first elongated inner region and the second elongated inner region each having a first end and a second end, the first end of the first elongated inner region and the first end of the second elongated inner region each being connected to the second side of the first elongated outer region; and
a first plurality of connector regions including a first connector region and a second connector region, the first connector region and the second connector region each having a first end and a second end, the first end of the first connector region and the first end of the second connector region each being connected to a first side of the first elongated inner region, the second end of the first connector region and the second end of the second connector region each being connected to a first side of the second elongated inner region.

36. The microelectromechanical resonator of claim 35 wherein:
the second plurality of regions comprise a plurality of openings;
the plurality of openings includes a first opening and a second opening; and
the resonator mass has a first major outer surface and the first opening has a first cross section parallel to the first major outer surface.

37. The microelectromechanical resonator of claim 36 wherein the first and second openings are spaced apart by a first distance and the first cross section has a first dimension that is at least one half the first distance.

38. The microelectromechanical resonator of claim 35 wherein the second plurality of regions includes a plurality of openings including a first opening and a second opening, the first opening and the second opening being spaced apart from one another by the first connector region, the first connector region and the second connector region being spaced apart from one another by the second opening.

39. The microelectromechanical resonator of claim 35 wherein the resonator mass is a non-homogeneous structure.

40. The microelectromechanical resonator of claim 35 wherein the resonator mass has a first major outer surface and a first region of the second plurality of regions has a first cross section parallel to the first major outer surface.

41. The microelectromechanical resonator of claim 40 wherein the first region and a second region of the second plurality of regions are spaced apart by a first distance and the first cross section has a first dimension that is at least one half the first distance.

* * * * *